(12) United States Patent
Goda et al.

(10) Patent No.: US 6,611,010 B2
(45) Date of Patent: Aug. 26, 2003

(54) SEMICONDUCTOR DEVICE

(75) Inventors: Akira Goda, Yokohama (JP); Kazuhiro Shimizu, Yokohama (JP); Yuji Takeuchi, Kawasaki (JP); Riichiro Shirota, Fujisawa (JP); Seiichi Aritome, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 170 days.

(21) Appl. No.: 09/726,582

(22) Filed: Dec. 1, 2000

(65) Prior Publication Data
US 2001/0002713 A1 Jun. 7, 2001

(30) Foreign Application Priority Data

Dec. 3, 1999 (JP) ............................................ 11-345298
Jan. 14, 2000 (JP) ........................................ 2000-006706

(51) Int. Cl.[7] .............................................. H01L 27/10
(52) U.S. Cl. ....................................... 257/210; 257/211
(58) Field of Search ................................ 257/202, 210, 257/211, 622, 296

(56) References Cited

U.S. PATENT DOCUMENTS

| 5,998,849 | A | | 12/1999 | Ishimaru et al. |
| 6,078,072 | A | * | 6/2000 | Okudaira et al. |
| 6,150,689 | A | * | 11/2000 | Narui et al. |
| 6,160,297 | A | * | 12/2000 | Shimizu et al. |
| 6,369,446 | B1 | * | 4/2002 | Tanaka et al. |
| 6,372,554 | B1 | * | 4/2002 | Kawakita et al. |

FOREIGN PATENT DOCUMENTS

| JP | 2000-58638 | 2/2000 |
| JP | 2000-82738 | 3/2000 |
| JP | 2000-91427 | 3/2000 |
| JP | 2000-164822 | 6/2000 |
| JP | 2000-174117 | 6/2000 |
| JP | 2000-208617 | 7/2000 |

* cited by examiner

*Primary Examiner*—Sheila V. Clark
(74) *Attorney, Agent, or Firm*—Oblon, Spivak, McClelland, Maier & Neustadt, P.C.

(57) ABSTRACT

In a bit line contact section, a contact hole is formed through a silicon oxide film, and a contact plug made of a polysilicon film doped with impurities is buried in the contact hole. The silicon oxide film is formed with a wiring groove overlapping the contact hole. A bit line made of a metal film is buried in the wiring groove. The contact plug extends through the bit line, and has its upper surface substantially coplanar with an upper surface of the bit line. The contact plug is in contact with the bit line only on its side surfaces.

55 Claims, 80 Drawing Sheets

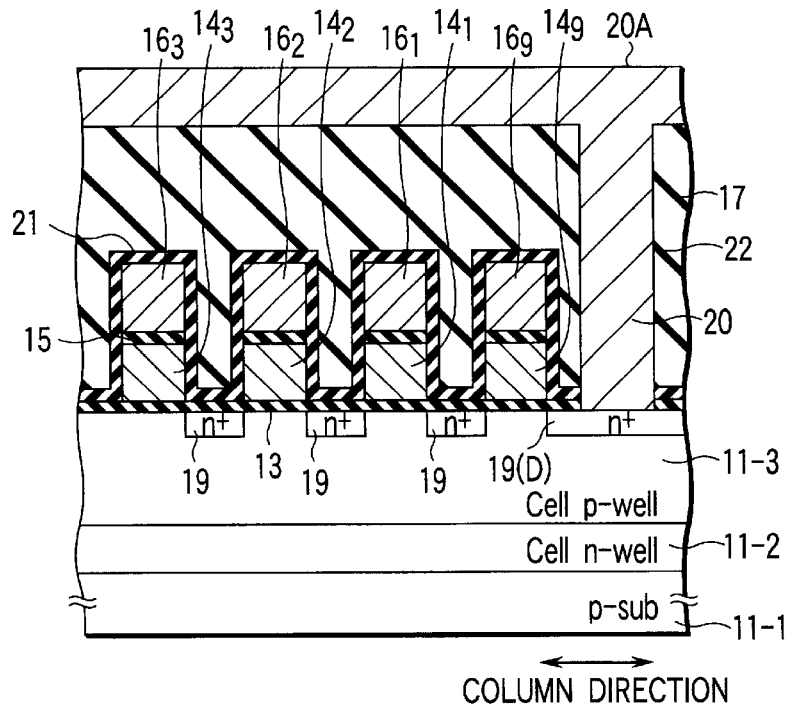
F I G. 30
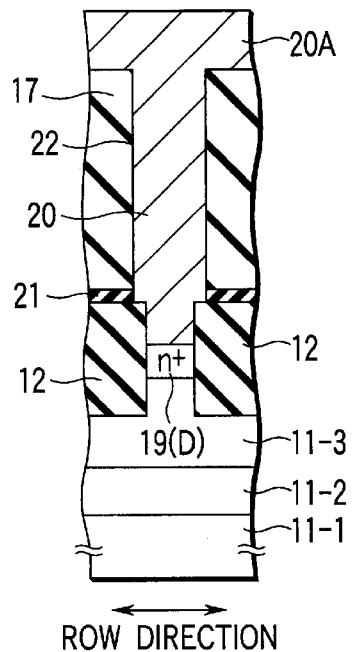
F I G. 31

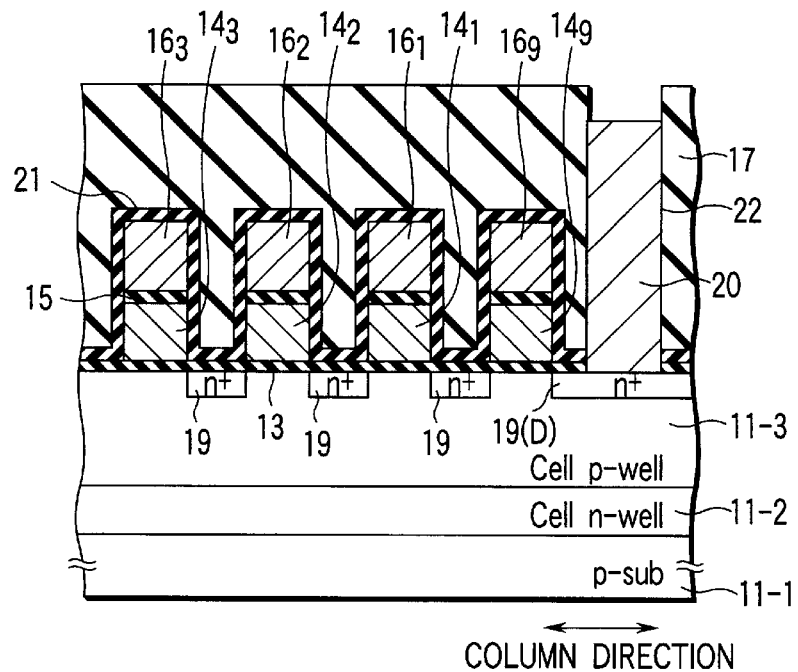
F I G. 33
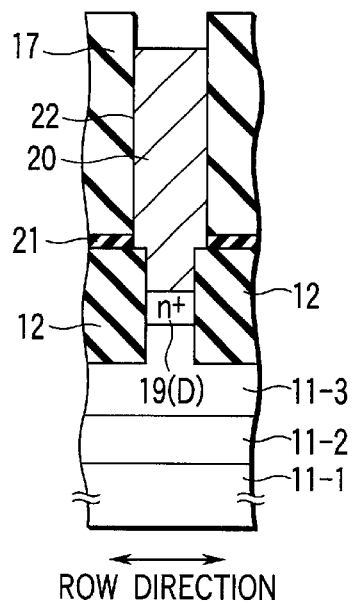
F I G. 34

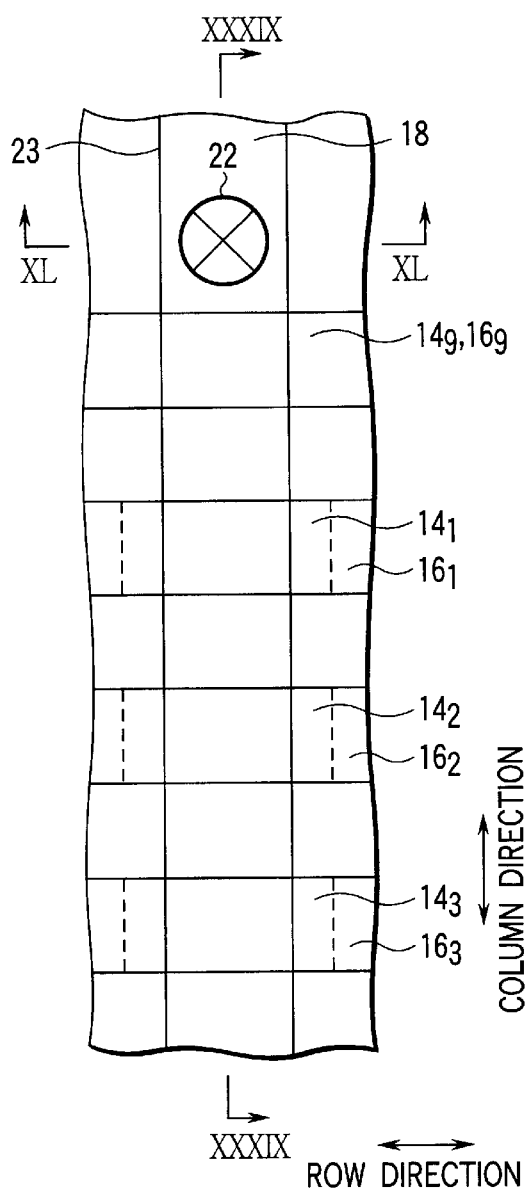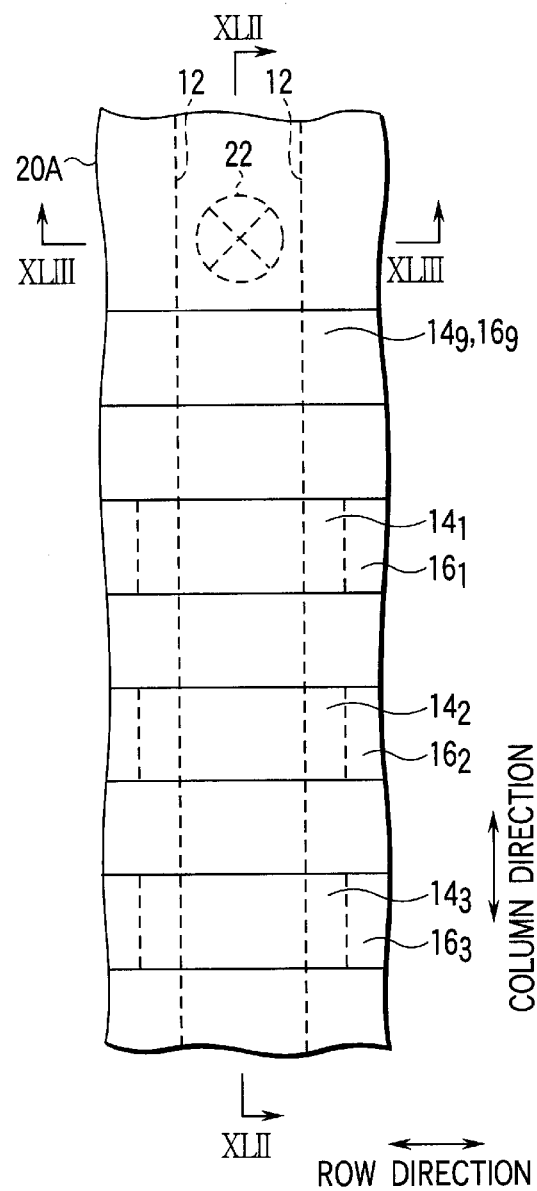
FIG. 38
FIG. 41

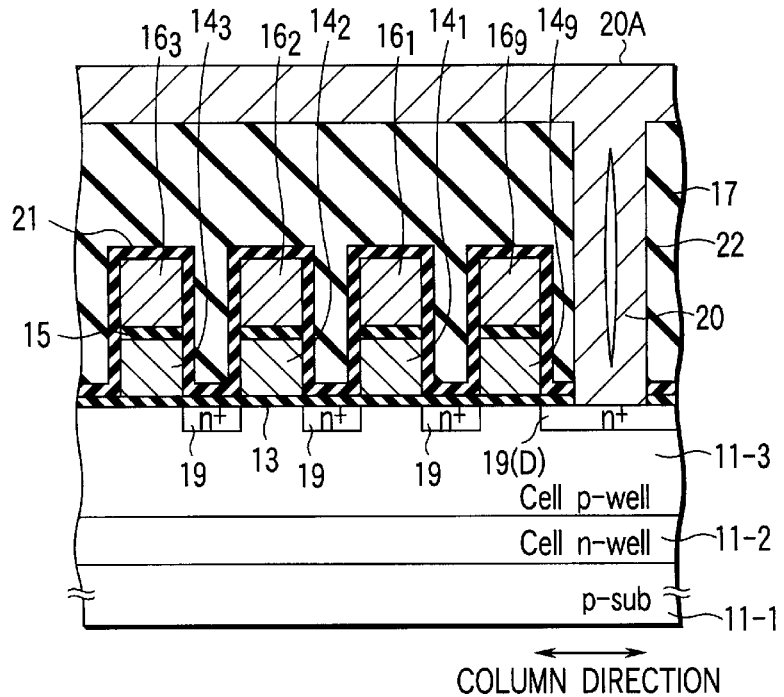
F I G. 42
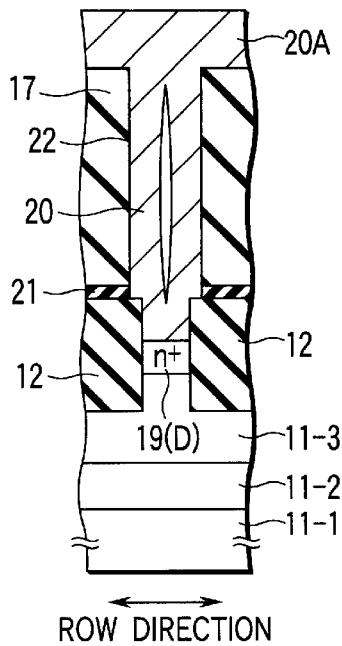
F I G. 43

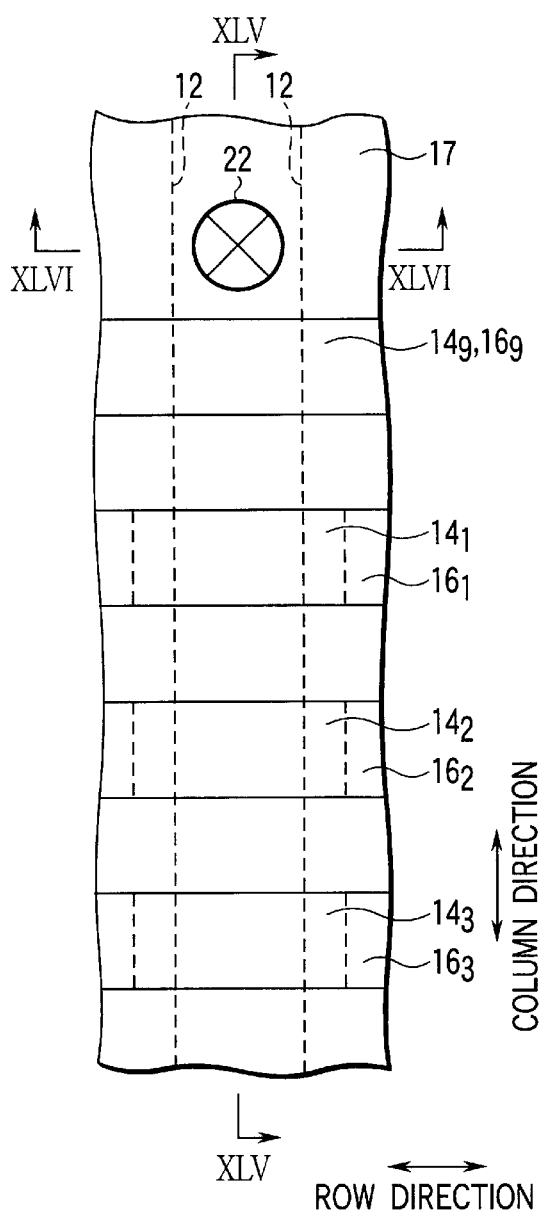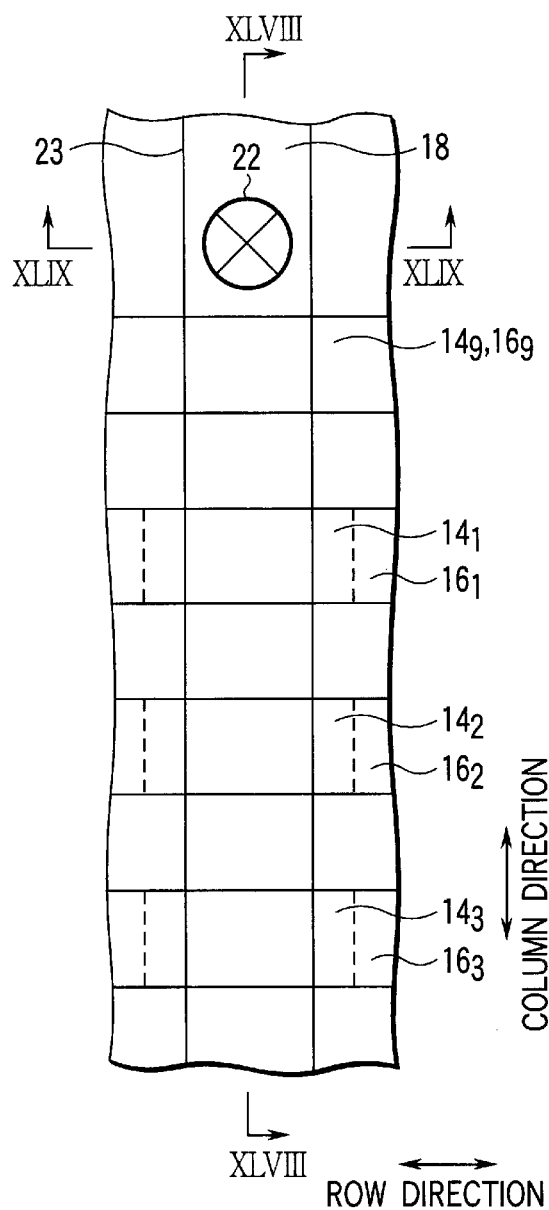
FIG. 44
FIG. 47

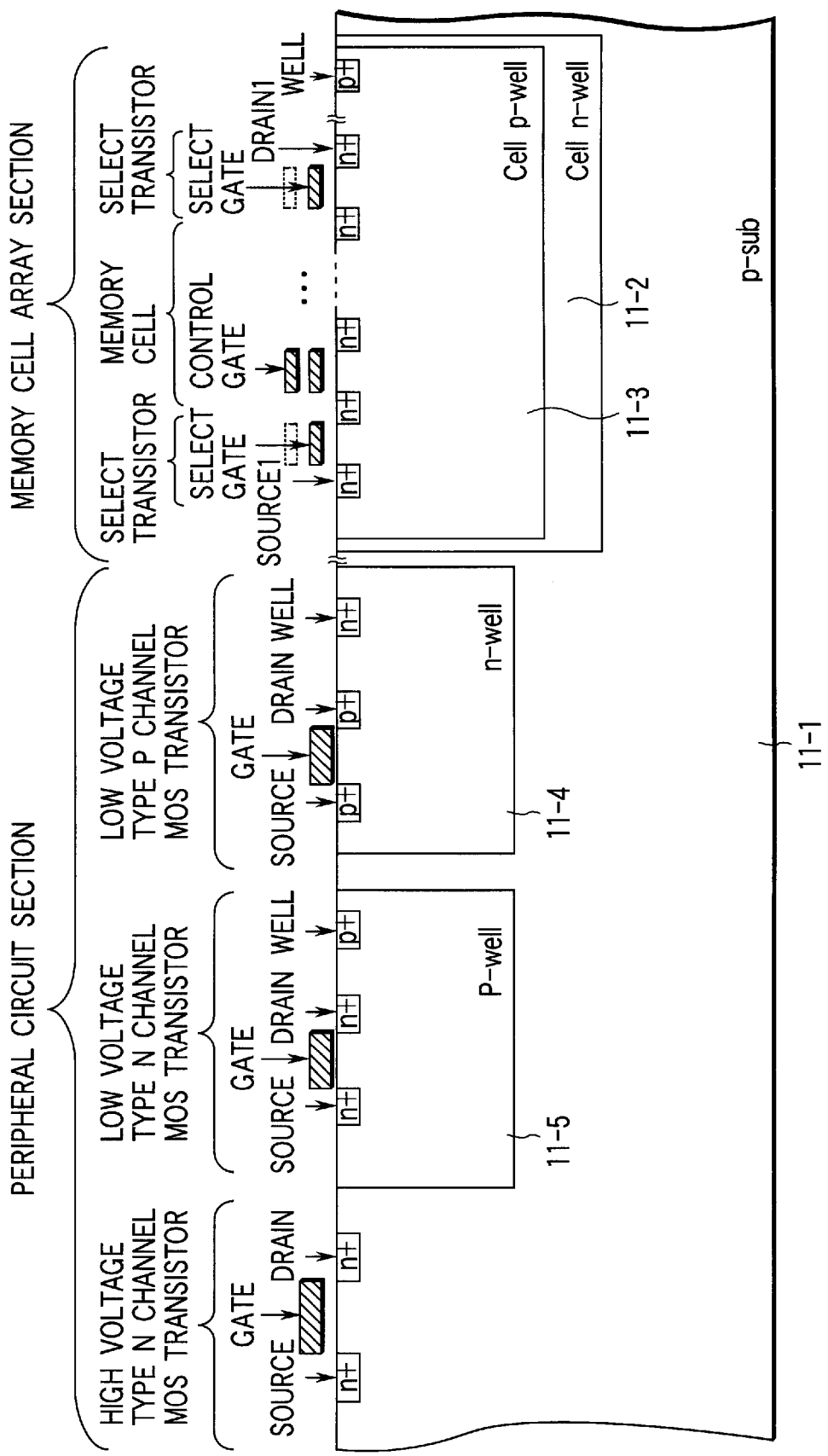
F I G. 68

(a) CONTACT SECTION OVERLAPPED ELEMENT ISOLATION AREA
(EX. BIT LINE CONTACT SECTION, SOURCE LINE CONTACT SECTION)

(b) CONTACT SECTION UNOVERLAPPED ELEMENT ISOLATION AREA
(EX. CONTACT SECTION FOR DIFFUSION LAYER OF TRANSISTOR, WELL CONTACT SECTION)

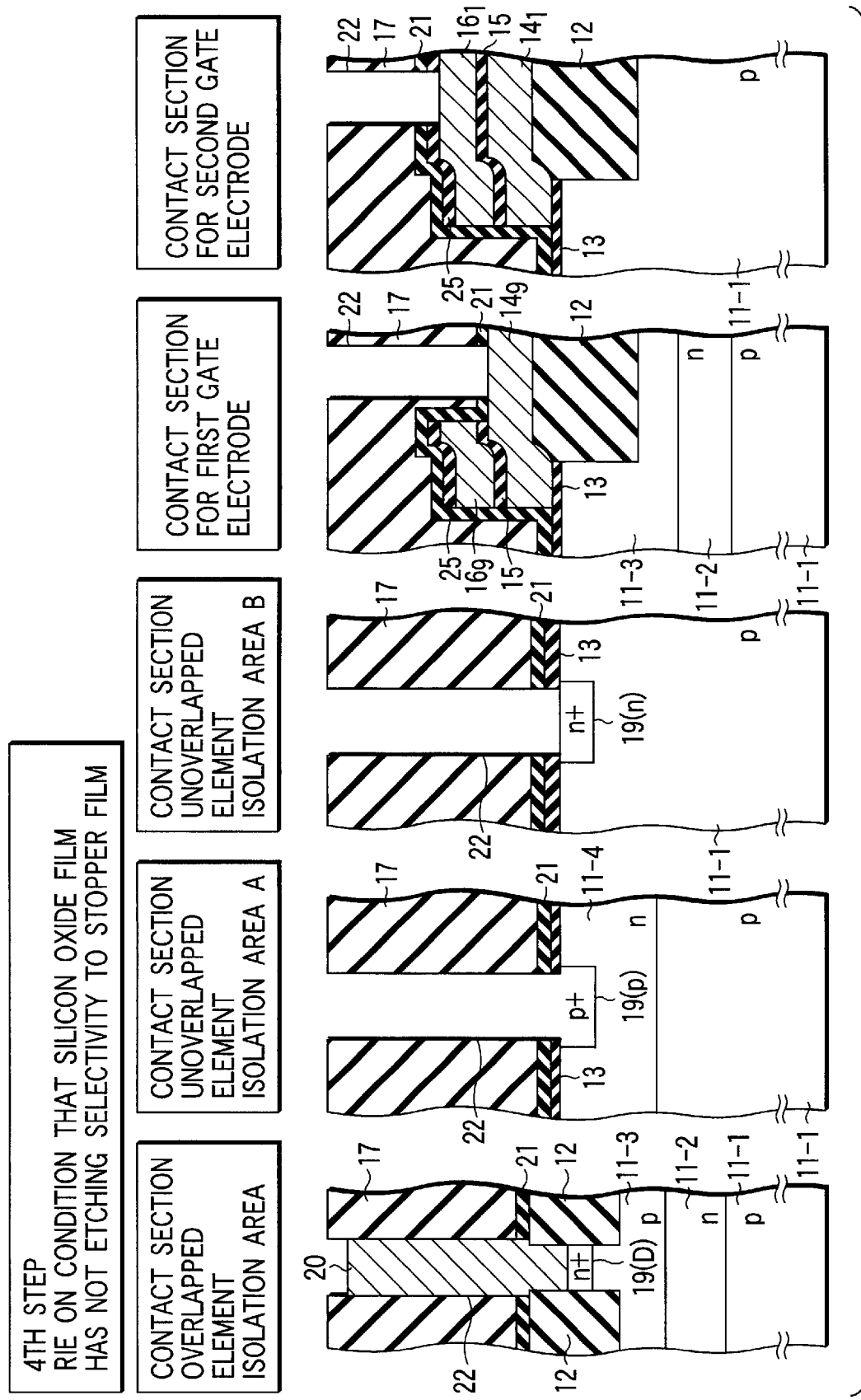
F I G. 78

(a) CONTACT SECTION OVERLAPPED ELEMENT ISOLATION AREA
(EX. BIT LINE CONTACT SECTION, SOURCE LINE CONTACT SECTION)

(b) CONTACT SECTION UNOVERLAPPED ELEMENT ISOLATION AREA
(EX. CONTACT SECTION FOR DIFFUSION LAYER OF TRANSISTOR, WELL CONTACT SECTION)

(c) CONTACT SECTION FOR SECOND GATE ELECTRODE
(EX. CONTACT SECTION FOR WORD LINE (CONTROL GATE LINE))

(d) CONTACT SECTION FOR FIRST GATE ELECTRODE
(EX. CONTACT SECTIONS FOR GATES OF SELECT TRANSISTOR
AND TRANSISTOR OF PERIPHERAL CIRCUIT SECTION)

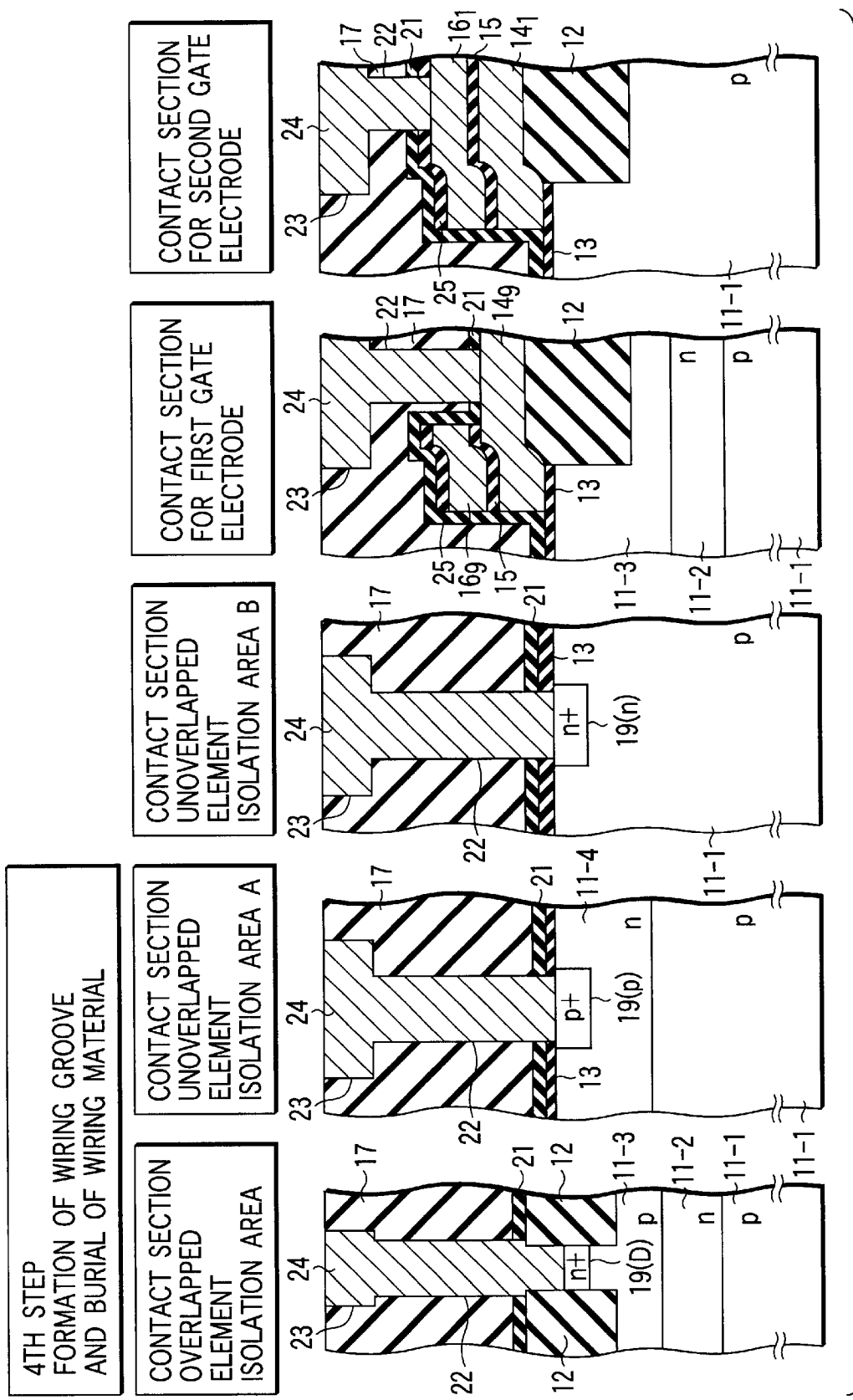
F I G. 89

(a) CONTACT SECTION OVERLAPPED ELEMENT
ISOLATION AREA
(EX. BIT LINE CONTACT SECTION, SOURCE LINE CONTACT SECTION)
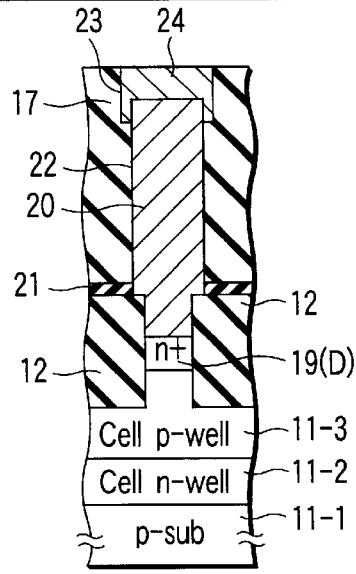
FIG. 90   ROW DIRECTION
(b) CONTACT SECTION UNOVERLAPPED ELEMENT ISOLATION AREA
(EX. CONTACT SECTION FOR DIFFUSION LAYER OF TRANSISTOR, WELL CONTACT SECTION)
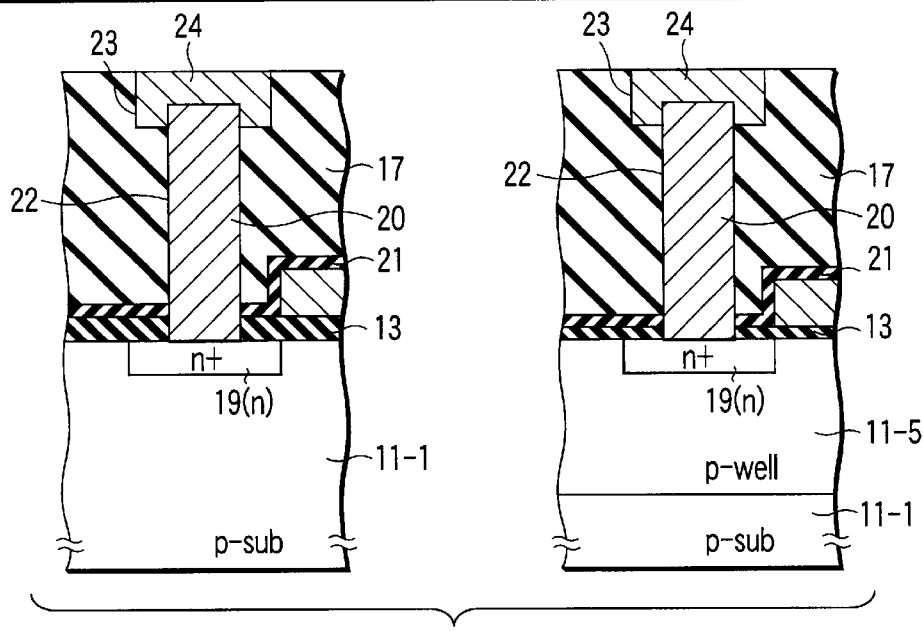
FIG. 91

(c) CONTACT SECTION FOR SECOND GATE ELECTRODE
(EX. CONTACT SECTION FOR WORD LINE (CONTROL GATE LINE))

(d) CONTACT SECTION FOR FIRST GATE ELECTRODE
(EX. CONTACT SECTIONS FOR GATES OF SELECT TRANSISTOR
AND TRANSISTOR OF PERIPHERAL CIRCUIT SECTION)

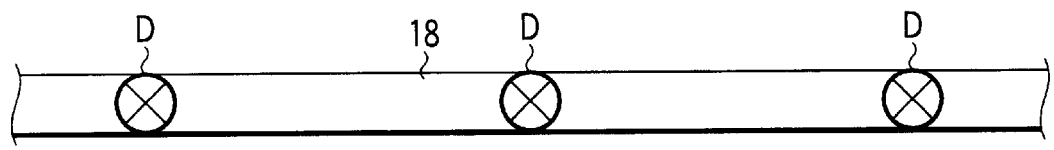
F I G. 96A
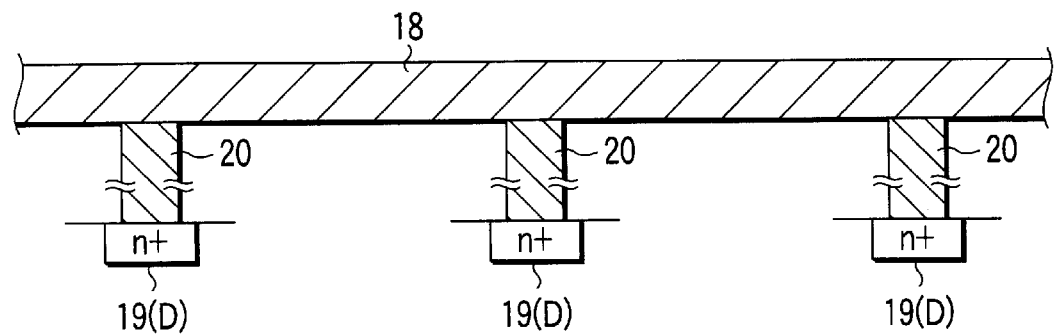
F I G. 96B
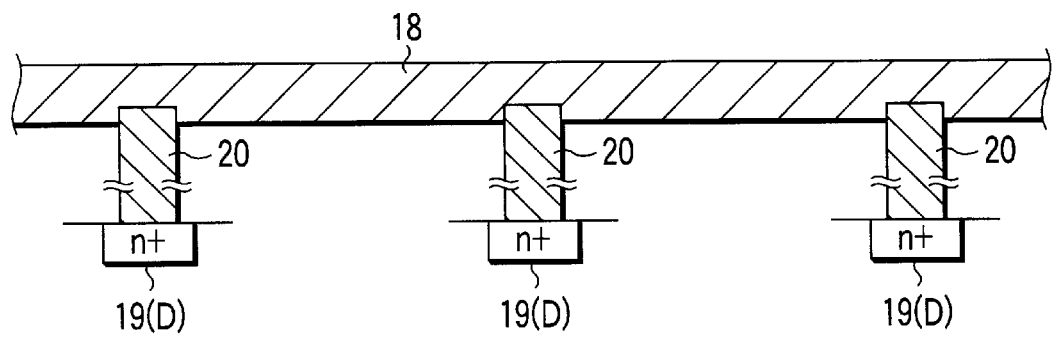
F I G. 96C
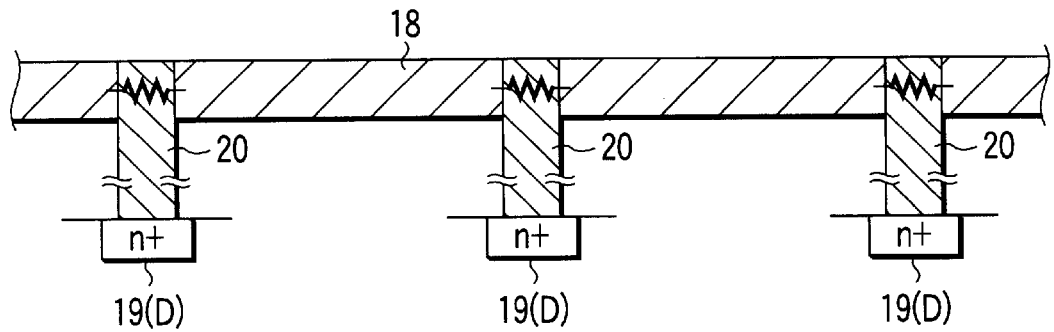
F I G. 96D

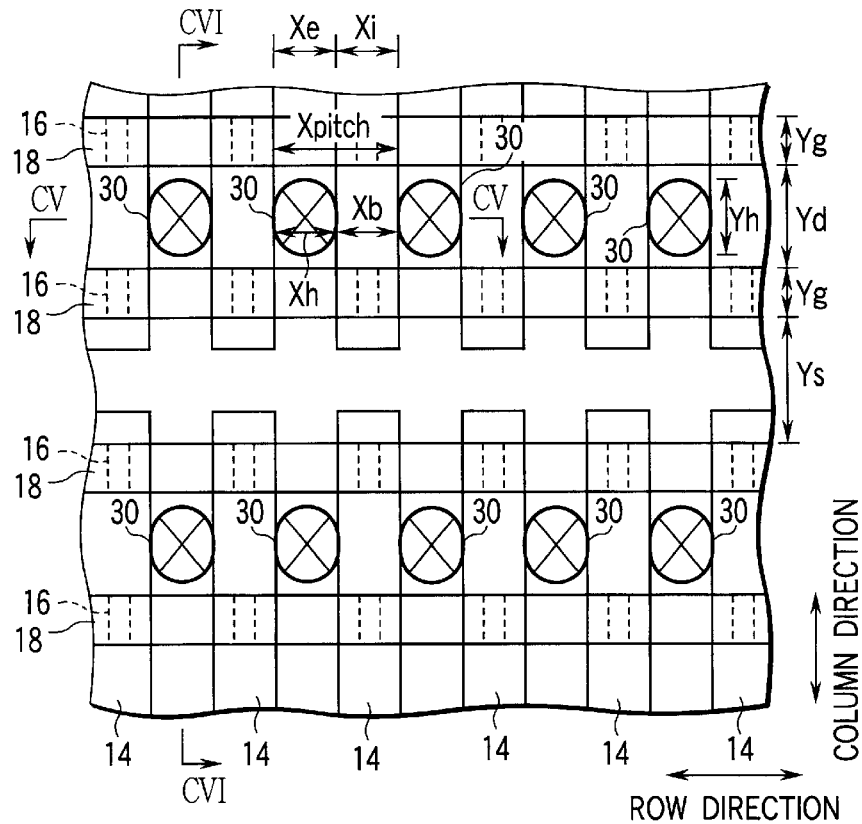
F I G. 107
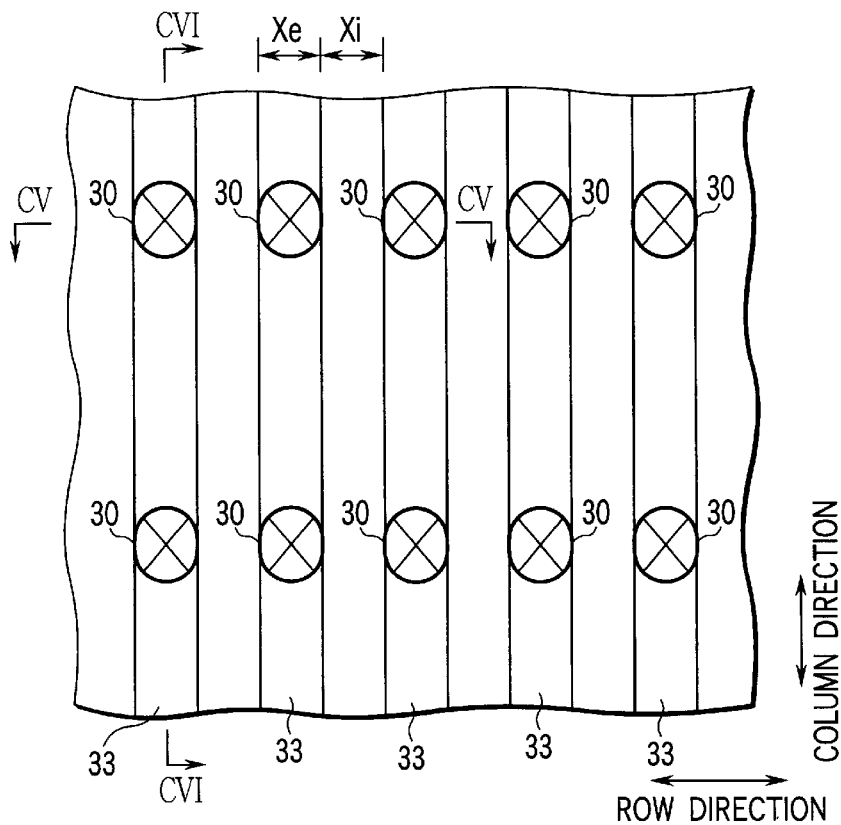
F I G. 108

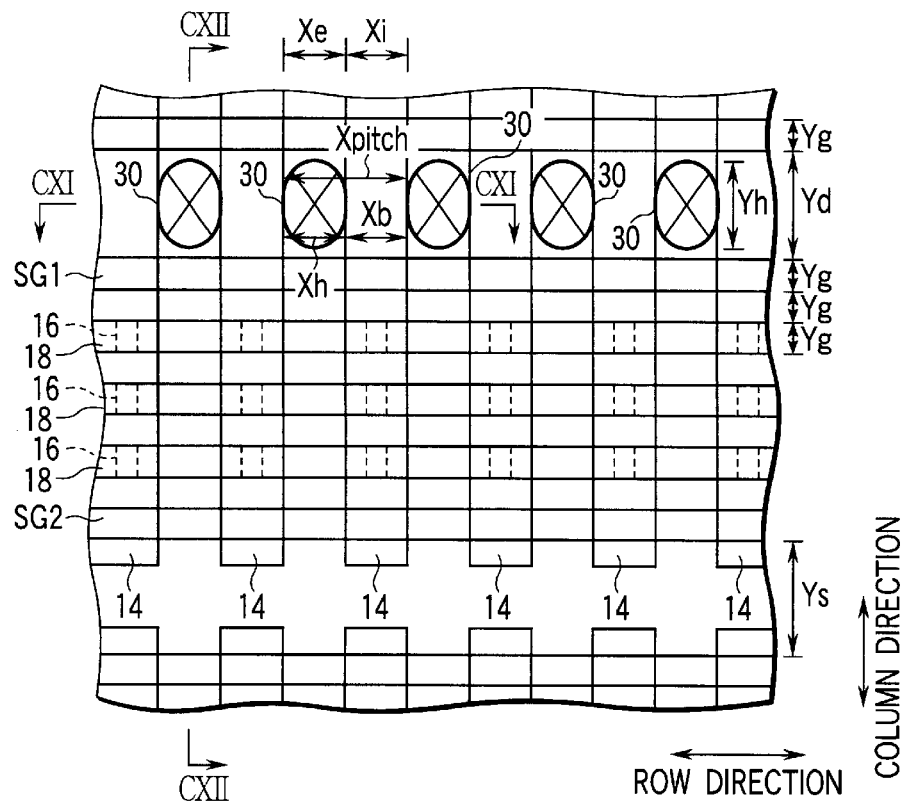
F I G. 113
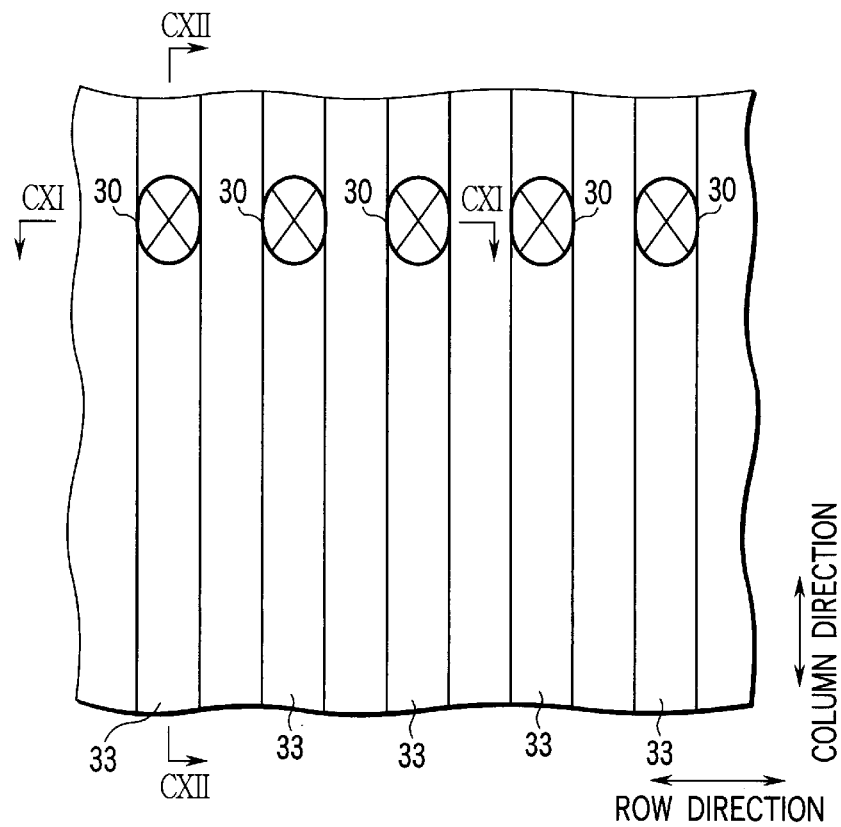
F I G. 114

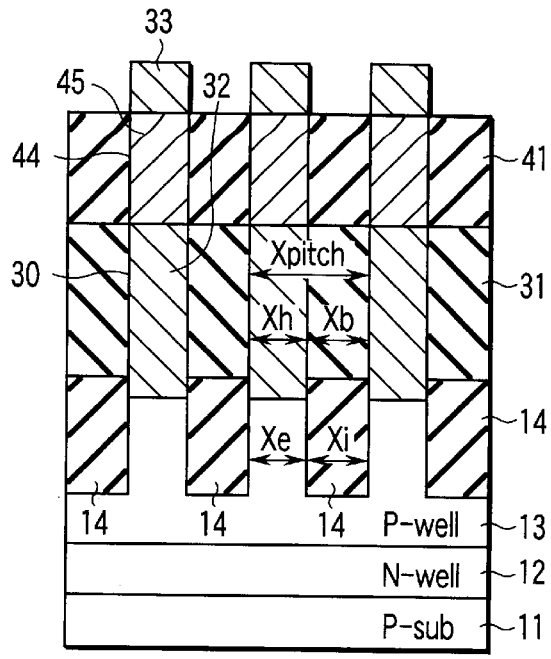
FIG. 117  ROW DIRECTION
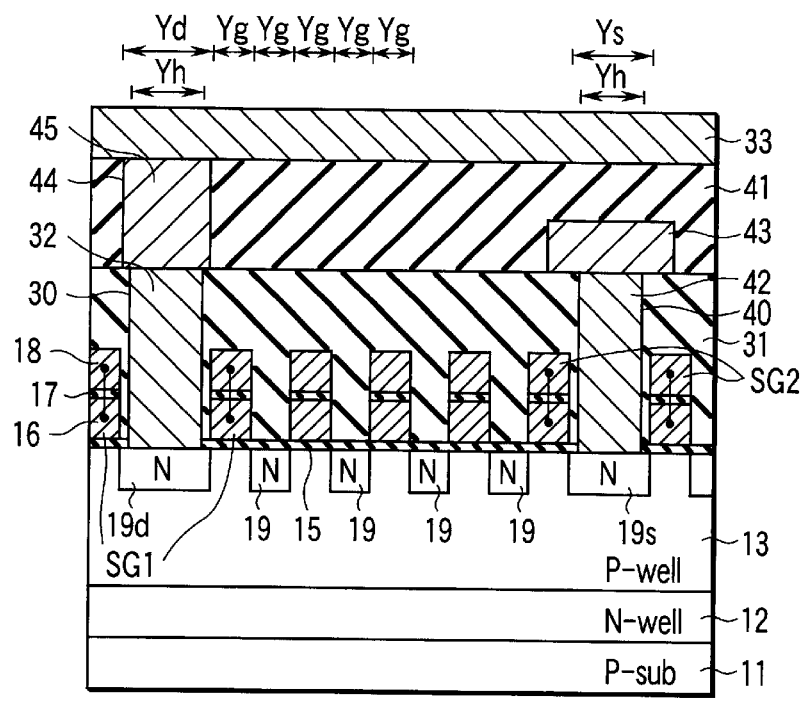
FIG. 118  COLUMN DIRECTION

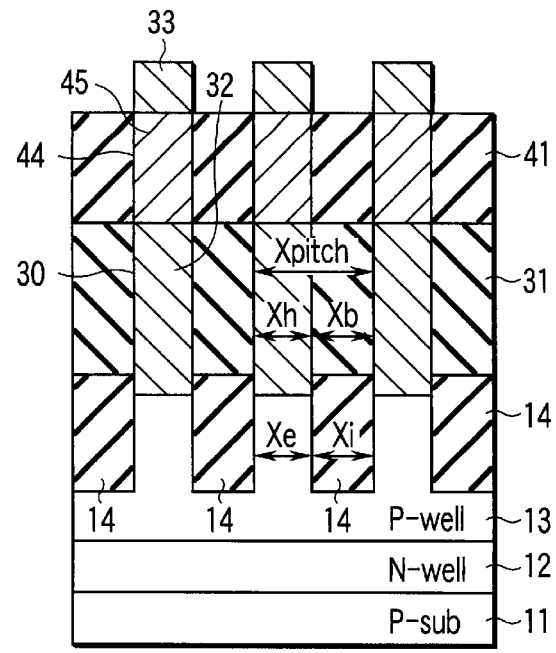
F I G. 123    ROW DIRECTION
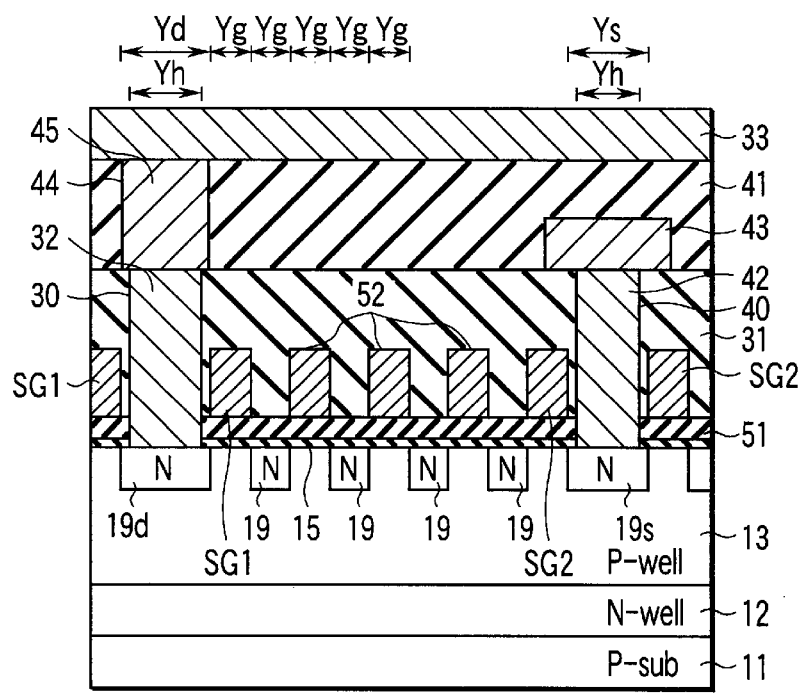
F I G. 124    COLUMN DIRECTION

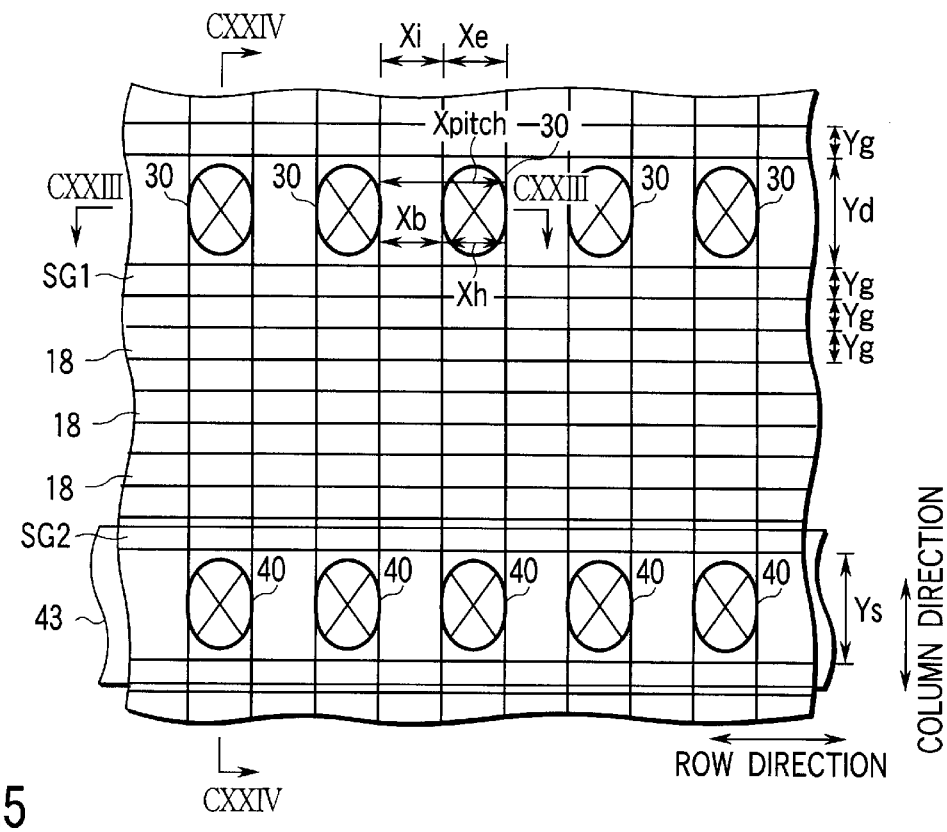
F I G. 125
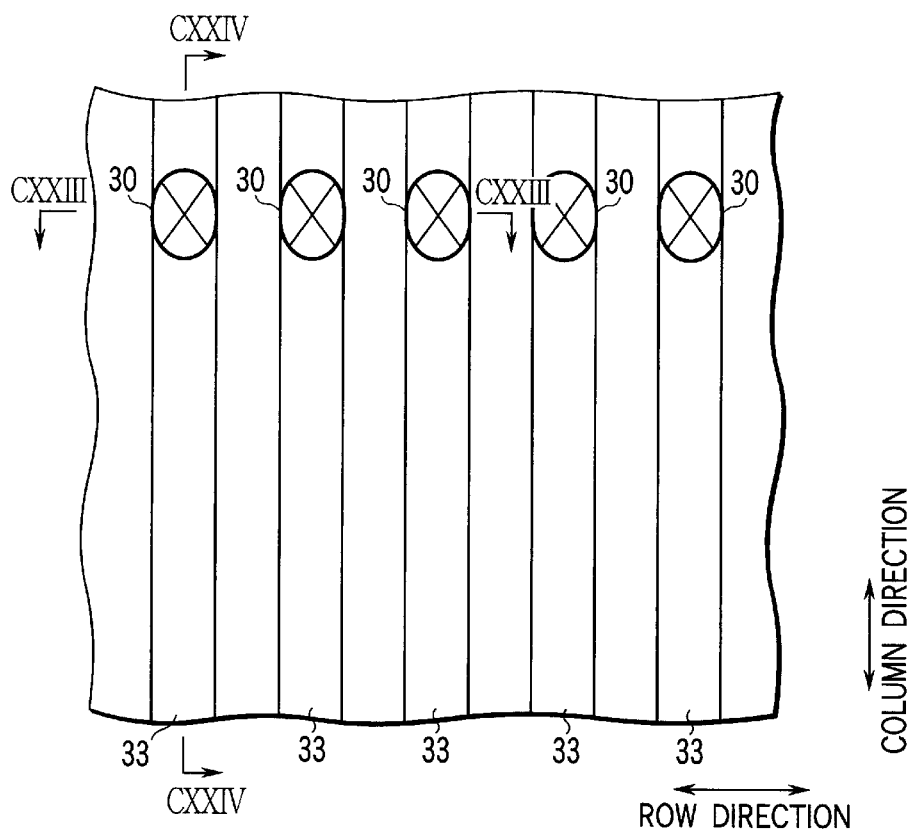
F I G. 126

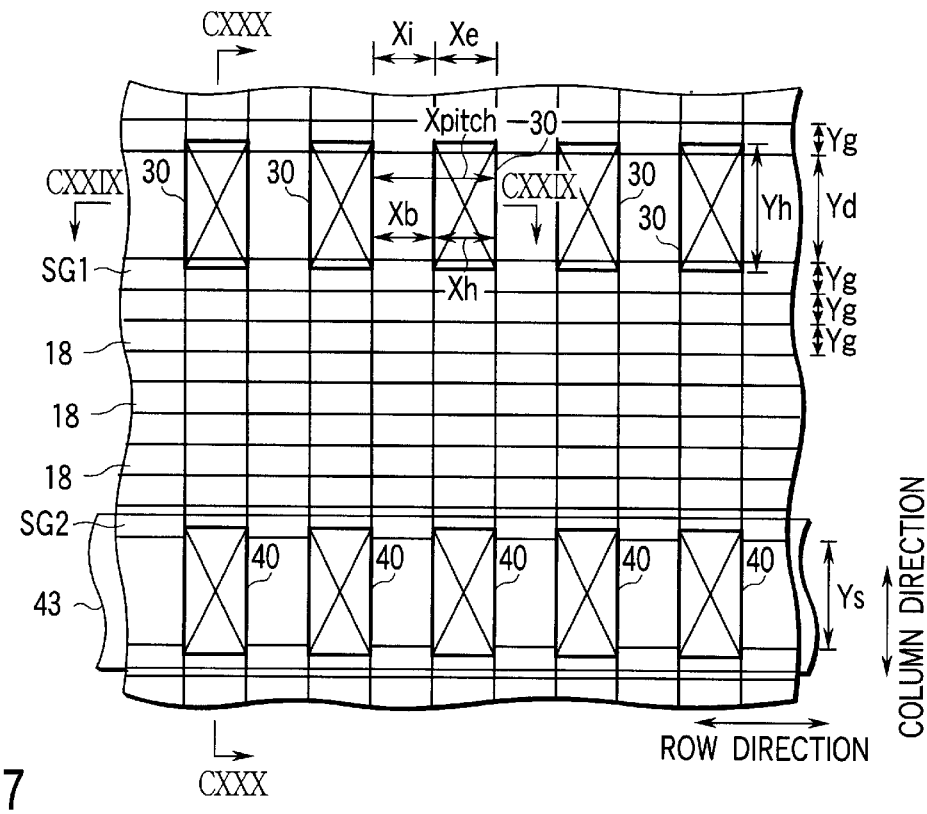
F I G. 127
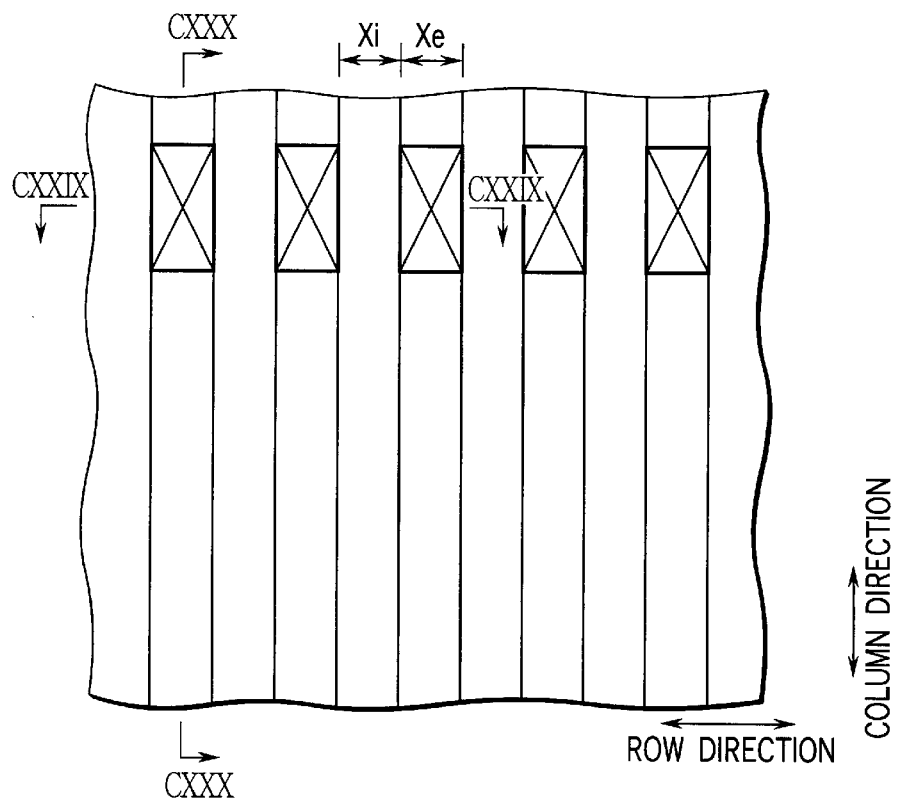
F I G. 128

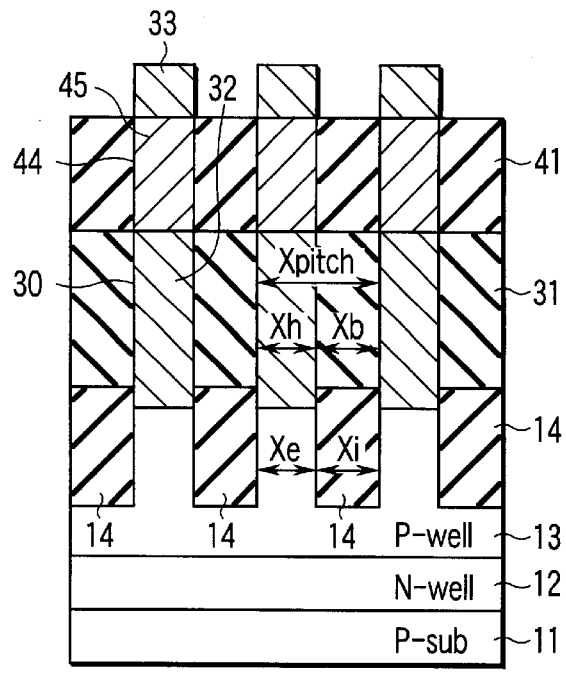
F I G. 129
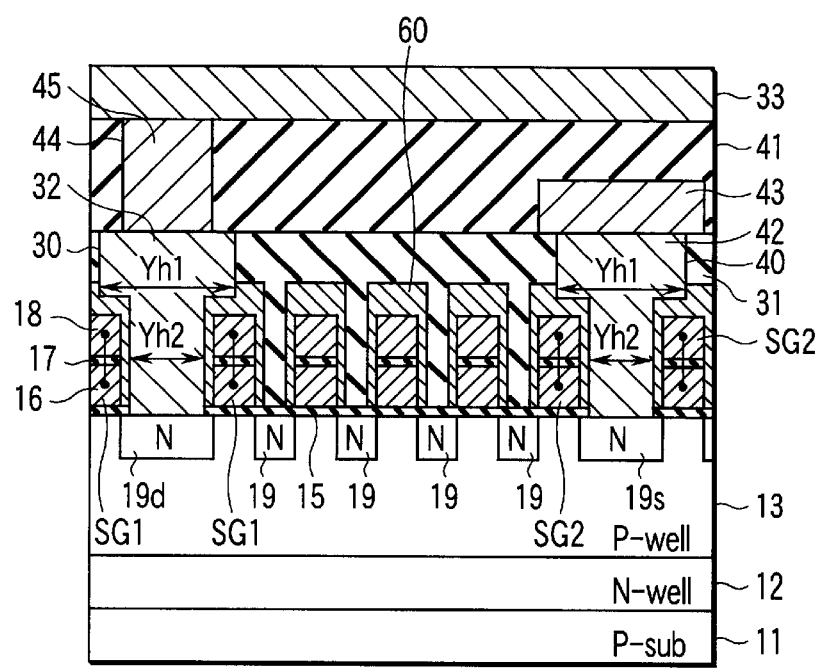
F I G. 130

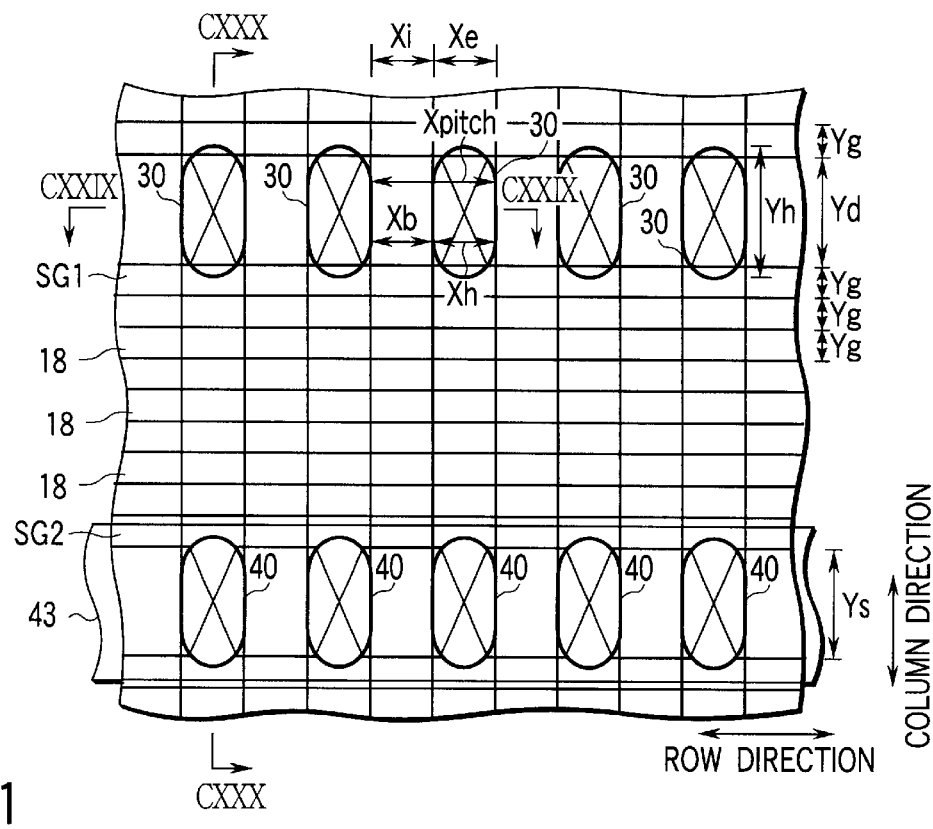
F I G. 131
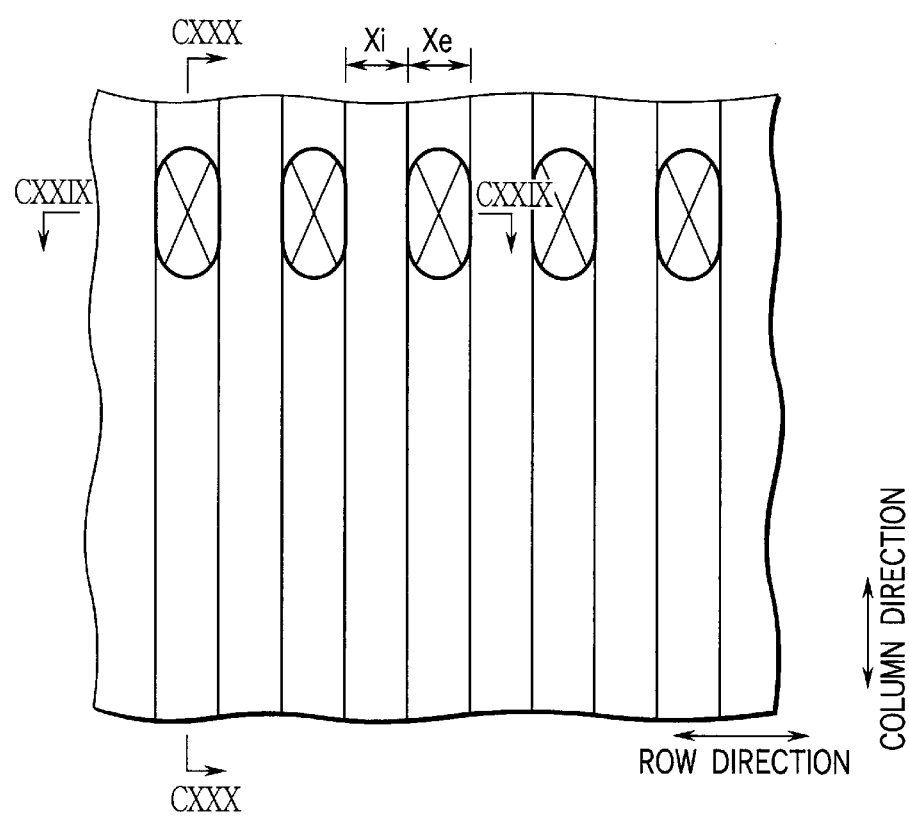
F I G. 132

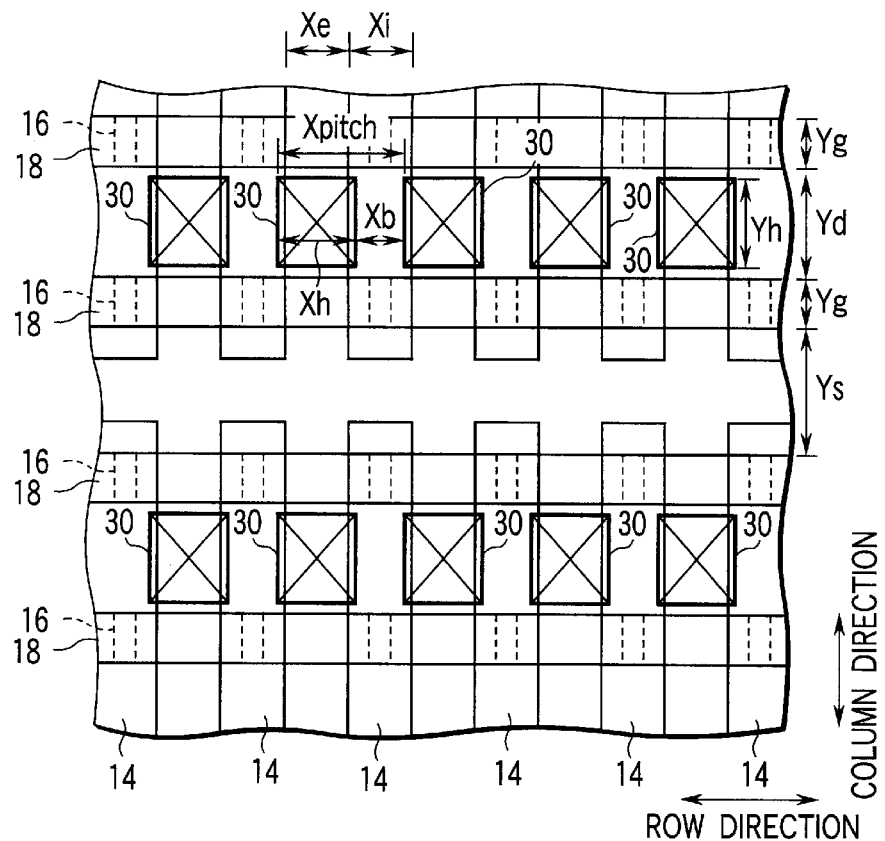
F I G. 133
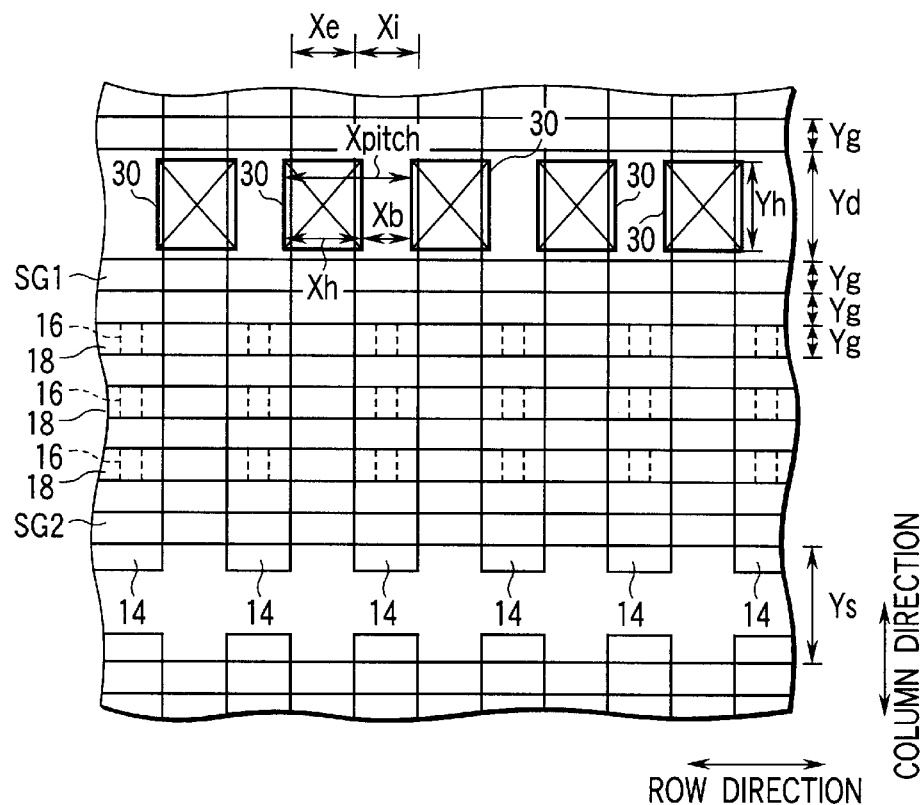
F I G. 134

SEMICONDUCTOR DEVICE

CROSS-REFERENCE TO RELATED APPLICATIONS

This application is based upon and claims the benefit of priority from the prior Japanese Patent Applications No. 11-345298, filed Dec. 3, 1999; and No. 2000-006706, filed Jan. 14, 2000, the entire contents of which are incorporated herein by reference.

BACKGROUND OF THE INVENTION (1) Background 1

The present invention relates to contact structures in semiconductor devices such as a semiconductor memory and the like, and more particularly to contact structures in a non-volatile semiconductor memory (for example, a bit line contact structure, a source line contact structure and the like).

As an example of conventional non-volatile semiconductor memories, a NAND cell type flash memory will be described below in terms of its device structure.

A NAND cell type flash memory has a memory cell array comprised of a plurality of NAND cell units. Each of the NAND cell units is comprised of a plurality of memory cells connected in series and a pair of select transistors, each connected to both ends of the NAND cell unit. The select transistors are connected between a bit line and a source line.

Each of the memory cells comprises an n-channel MOS transistor having a so-called stacked gate structure in which a control gate electrode is stacked on a floating gate electrode. Each of the select transistors comprises an n-channel MOS transistor having a structure similar to the memory cell, i.e., a structure in which an upper electrode is stacked on a lower electrode. However, it is, for example, the lower electrode which actually functions as a gate electrode of the select transistor.

In two adjacent transistors of the plurality of transistors within a NAND cell unit (memory cells, select transistors), one source region or one drain region is shared by these two transistors.

In the following, a specific structure of the NAND cell type flash memory will be described.

FIG. 1 is a circuit diagram illustrating a portion of a memory cell array in the NAND cell type flash memory.

A NAND cell unit is comprised of a plurality (four, eight, 16 or the like) of memory cells connected in series, and a pair of select transistors, each connected to one of both ends of the NAND cell unit. Also, the NAND cell units are connected between bit lines BL0, . . . , BL63 and source lines SL. The source lines SL are connected to reference potential lines (wirings for shunting) formed of a conductive material such as aluminum, polysilicon or the like, at predetermined locations.

The source lines SL extend in a row direction, while the bit lines BL0, . . . , BL63 and the reference potential lines extend in a column direction. Contact sections of the source lines SL with the reference potential lines are provided, for example, each time the source lines SL intersect 64 bit lines BL0, . . . , BL63. The reference potential lines are connected to a so-called peripheral circuit arranged around the memory cell array.

Word lines (control gate lines) WL1, . . . , WLn extend in the row direction, and select gate lines SG1, SG2 also extend in the row direction. A set of memory cells connected to a single word line (control gate line) WLi is called a page. Also, a set of memory cells connected to the word lines WL1, . . . , WLn sandwiched between the two select gate lines SG1, SG2 is called a NAND block or simply a block.

One page is comprised, for example, of 256 bytes (256×8) of memory cells. The memory cells within one page are written substantially at the same time. Also, when one page is comprised of 256 bytes of memory cells with one NAND cell unit comprised of eight memory cells, one block is comprised of 2,048 bytes (2048×8) of memory cells. The memory cells within one block are erased substantially at the same time.

FIG. 2 is a top plan view illustrating the device structure of one NAND cell unit within the memory cell array. FIG. 3 is a cross-sectional view taken along the line III—III in FIG. 2, and FIG. 4 is a cross-sectional view taken along the line IV—IV in FIG. 2. FIG. 5 in turn illustrates an equivalent circuit of the device of FIGS. 2 through 4.

A p-type substrate (p-sub) 11-1 is formed therein a so-called double well region which comprises an n-type well region (Cell n-well) 11-2 and a p-type well region (Cell p-well) 11-3. Memory cells and select transistors are formed in the p-type well region 11-3.

Memory cells and select transistors are arranged within an element area within the p-type well region 11-3. The element area is surrounded by an element isolation oxide film (element isolation area) 12 formed on the p-type well region 11-3.

In this example, as illustrated in FIG. 5, one NAND cell unit is comprised of eight memory cells M1–M8 connected in series, and a pair of select transistors S1, S2, each of which is connected to one of both ends of the NAND cell unit.

Each of the memory cells is comprised of a silicon oxide film (gate insulating film) 13 formed on the p-type well region (Cell p-well) 11-3; a floating gate electrode $14_1$, $14_2$, . . . , $14_8$ on the silicon oxide film 13; a silicon oxide film (interpoly insulating film) 15 on the floating gate electrodes $14_1$, $14_2$, . . . , $14_8$; a control gate electrode $16_1$, $16_2$, . . . , $16_8$ on the silicon oxide film 15; and source/drain regions 19 within the p-well region (Cell p-well) 11-3.

Each of the select transistors in turn is comprised of the silicon oxide film (gate insulating film) 13 formed on the p-type well region 11-3; gate electrodes $14_9$, $14_{10}$ or $16_9$, $16_{10}$ on the silicon oxide film 13; and source/drain regions 19, 19(S), 19(D) within the p-well region 11-3.

The structure of the select transistors is similar to the structure of the memory cells, as appreciated from the foregoing. This is because the memory cells and the select transistors are simultaneously formed in the same process to reduce the number of steps involved in the process and accordingly reduce the manufacturing cost.

The memory cell differs from the select transistors in structure in the following aspects.

As illustrated in FIG. 6, in regard to the memory cells, a floating gate electrode $14_1$, . . . , $14_8$ is provided for each of memory cells, the control gate electrodes $16_1$, . . . , $16_8$ extend on the memory cell array linearly in the row direction, and contact sections W for the control gate electrodes $16_1$, . . . , $16_8$ are provided at ends of the control gate electrodes $16_1$, . . . , $16_8$ in the row direction.

On the other hand, in regard to the select transistors, the gate electrodes $14_9$, $14_{10}$ as lower electrodes, for example, are provided in common to a plurality of select transistors in the row direction, and contact sections SS, SD for the gate electrodes 149, 1410 are provided at regular intervals on the memory cell array.

Turning back to description on FIGS. 2 through 5, one set of source/drain regions (n⁺-type diffusion layers) 19 is shared by two adjacent transistors of a plurality of transistors (memory cells, select transistors) within the NAND cell unit.

The memory cells and the select transistors are overlain by a silicon oxide film (CVD oxide film) 17 formed by a CVD (chemical vapor deposition) method. A bit line 18 is routed on the CVD oxide film 17. The bit line 18 is connected to one end of the NAND cell unit, i.e., the n⁺-type diffusion layer 19(D) through a contact plug 20.

In a non-volatile semiconductor memory including the NAND cell-type flash memory as descried above, researches and developments for miniaturization and higher integration of memory cells are under progress in order to increase the memory capacity (the number of bits) in one chip.

However, to achieve the miniaturization and higher integration of memory cells, problems associated therewith must be solved to achieve an improved reliability. The problems involved in the miniaturization and higher integration include an increase in wiring resistance and contact resistance, problems related to the manufacturing processes (for example, a problem resulting from a seam which occurs when a conductive material is buried in miniature holes), and the like.

(2) Background 2

The present invention relates to a non-volatile semiconductor memory device, and more particularly to improvements in a cell layout for a high density and high integration non-volatile semiconductor memory device.

Non-volatile semiconductor memory devices which can electrically rewrite data are widely used for high speed ROM and mass storage. Also, memory cells in a non-volatile semiconductor memory device are generally comprised of MOS transistors. Structures generally employed for the memory cell are a stacked gate structure which has a charge transfer layer and a control gate layer, and a single gate structure comprised only of a control gate layer.

FIGS. 7 through 9 illustrate an example of a memory cell which has the stacked gate structure. FIG. 7 is a top plan view of the memory cell; FIG. 8 is a cross-sectional view taken along the line VIII—VIII in FIG. 7; and FIG. 9 is a cross-sectional view taken along the line IX—IX in FIG. 7.

In this example, the memory cell comprises an N-channel MOS transistor. In this case, the memory cell is formed in a P-type silicon substrate or in a P-type well region. In this example, however, the memory cell is formed in the P-type well region.

Specifically, an N-well region 12 and a P-well region 13 are formed in the P-type silicon substrate 11. The silicon substrate 11 is also formed with trenches for element isolation, and an insulating material (for example, silicon oxide) 14 for element isolation is buried in the trenches.

An area sandwiched by the element isolation insulating materials 14 serves as an element area. A thin tunnel insulating film (for example, made of silicon oxide) 15 is formed on the silicon substrate 11 (P-well region 13) in the element area such that a micro-tunnel current can be applied therethrough during writing/erasing operations.

A charge transfer layer 16 is formed on the tunnel insulating film 15. The charge transfer layer 16 is made of an electrically floating conductive layer (for example, a polysilicon layer including impurities).

A control gate layer 18 is formed on the charge transfer layer 16 through an intergate insulating layer 17. Since the charge transfer layer 16 is capacitively coupled to the control gate layer 18, variations in potential on the control gate layer 18 cause like variations in potential on the charge transfer layer 16.

Since the charge transfer layer 16 and the control gate layer 18 are simultaneously processed in a self-alignment, their side edges are in alignment with each other in a direction (column direction) perpendicular to a direction (row direction) in which the control gate layer (word lines) 18 extends. Also, the side edge of the charge transfer layer 16 in the row direction exists on the element isolation insulating material 14.

In the element area, a surface area of the silicon substrate 11 beneath the charge transfer layer 16 serves as a channel region. N-type diffusion layers (a source region or a drain region) 19 are also formed on both sides of the channel region.

In the memory cell having the foregoing stacked gate structure, data for the memory cell is determined by the amount of charges in the charge transfer layer 16. Specifically, a threshold value for the memory cell becomes higher as negative charges (electrons) are increased in the charge transfer layer 16 and lower as positive charges (holes) are increased in the charge transfer layer 16.

A state in which the charge transfer layer 16 includes a large amount of negative charges is called a writing state, while a state in which the charge transfer layer 16 includes a large amount of positive charges is called an erasing state.

The amount of charges within the charge transfer layer 16 can be adjusted by applying a tunnel current to the tunnel insulating layer 15 during writing/erasing operations. Whether the tunneling current flows or not is determined by a voltage applied between the control gate layer (charge transfer layer) and the channel. Specifically, a high voltage applied to the tunnel insulating film 15 causes the tunnel current to flow.

For example, when the tunnel insulating film 15 is applied with a high voltage and the potential on the channel is higher than the potential on the charge transfer layer, the tunnel current flows from the channel to the charge transfer layer 16. On the other hand, when the tunnel insulating film 15 is applied with a high voltage and the potential on the charge transfer layer 16 is higher than the potential on the channel, the tunnel current flows from the charge transfer layer 16 to the channel.

FIGS. 10 through 12 illustrate an example of a memory cell having the single gate structure. FIG. 10 is a top plan view of the memory cell; FIG. 11 is a cross-sectional view taken along the line XI—XI in FIG. 10; and FIG. 12 is a cross-sectional view taken along the line XII—XII in FIG. 10.

In this example, the memory cell also comprises an N-channel MOS transistor. In this case, the memory cell is formed in a P-type silicon substrate or in a P-type well region. In this example, however, the memory cell is formed in the P-type well region.

Specifically, a P-type silicon substrate 21 is formed therein with an N-well region 22 and a P-well region 23. The silicon substrate 21 is also formed with trenches for element isolation, and an insulating material for element isolation (for example, silicon oxide) 24 is buried in the trenches.

An area sandwiched between the element isolation insulating materials 24 serves as an element area. A thin tunnel insulating film (for example, made of silicon oxide) 25 is formed on the silicon substrate 21 (P-well region 23) in the element area such that a micro-tunnel current can be applied therethrough during writing/erasing operations.

A charge holding insulating layer 26 is formed on the tunnel insulating film 25 for holding charges and preventing the charges from leaking. The charge holding insulating layer 26 is formed, for example, of a plurality of insulating materials arranged in stack.

A control gate layer 27 is formed on the charge holding insulating layer 26. Also, in the element area, a surface area of the silicon substrate 21 beneath the control gate layer 27 serves as a channel region. N-type diffusion layers (a source region or a drain region) 28 are also formed on both sides of the channel region.

In the memory cell having the foregoing single gate structure, data for the memory cell is determined by the amount of charges which are trapped at a charge trap level formed on an interface between the tunnel insulating film 25 and the charge holding insulating layer 26. Specifically, a threshold value of the memory cell becomes higher as the amount of negative charges (electrons) trapped at the charge trap level is increased, and lower as the amount of positive charges (holes) trapped at the charge trap level is increased.

A state in which a large amount of negative charges is trapped at the charge trap level is called a writing state, while a state in which a large amount of positive charges is trapped at the charge trap level is called an erasing state.

The amount of charges at the charge trap level formed on the interface between the tunnel insulating film 25 and the charge holding insulating film 26 can be adjusted by applying a tunnel current to the tunnel insulating film 25 during writing/erasing operations. Whether the tunnel current flows or not is determined by a voltage applied between the control gate layer and the channel. Specifically, when the tunnel insulating film 25 is applied with a high voltage, the tunnel current flows.

For example, when the tunnel insulating film 25 is applied with a high voltage, and the potential on the channel is higher than the potential on the control gate layer, the tunnel current flows from the channel to the charge holding insulating layer 26. On the other hand, when the tunnel insulating layer 25 is applied with a high voltage, and the potential on the control gate layer 27 is higher than the potential on the channel, the tunnel current flows from the charge holding insulating layer 26 to the channel.

It should be noted that for the memory cell in the single gate structure, a charge transfer insulating layer may be provided between the tunnel insulating film 25 and the charge holding insulating layer 26 to determine a state of the memory cell (data) based on the amount of charges trapped in the charge transfer insulating layer.

FIGS. 13 through 16 illustrate a memory cell array of a NOR cell type non-volatile semiconductor memory device. FIGS. 13 and 14 are top plan views of the memory cell array; FIG. 15 is a cross-sectional view taken along the line XV—XV in FIGS. 13 and 14; and FIG. 16 is a cross-sectional view taken along the line XVI—XVI in FIGS. 13 and 14.

It should be noted that for facilitating the understanding of the figures, FIG. 13 omits a wiring layer in which bit lines are formed, and FIG. 14 shows only the wiring layer in which the bit lines are formed. In other words, the bit lines shown in FIG. 14 are formed on the device of FIG. 13.

While description on this example is focused on a memory cell array comprised of memory cells in the stacked gate structure, a similar layout may be employed with memory cells in the single gate structure, as a matter of course.

Since the structure of the memory cell has been described in connection with FIGS. 7 through 9, repetitive description thereon is omitted.

A control gate layer (word lines) 18 of memory cells extend in a row direction. An interlayer insulating film (made, for example, of silicon oxide) 31 is formed on the memory cells for overlying the memory cells. The interlayer insulating layer 31 is formed with contact holes (bit line contacts) 30 which reach a drain diffusion layer 19d of the memory cells.

A contact plug 32 made of a conductive material is buried in each of the contact holes 30. Then, bit lines 33 are formed on the interlayer insulating film 31. The bit lines 33 are electrically connected to the drain diffusion layers 19d of the memory cells through respective contact plugs 32.

The bit lines 33 extend in a column direction. Specifically, the control gate layer 18 and the bit lines 33 are arranged such that they intersect perpendicular or generally perpendicular to each other. One memory cell is provided at each of intersections of the control gate layer 18 with the bit lines 33.

The drain diffusion layers 19d are shared by two memory cells in the column direction, and independent of each other for memory cells in the row direction. A source diffusion layer 19s extends in the row direction, and serves as a common source line. Therefore, the source diffusion layer 19s is shared not only by two memory cells in the column direction but also by a plurality of memory cells in the low direction adjacent to the source diffusion layer 19s.

In a region in which the source diffusion layer 19s is formed, no element isolation insulating material 14 is formed. In other words, the element isolation areas (element isolation insulating materials) 14, which are formed extending in the column direction, are interrupted by the source diffusion layer 19s. Also, the drain diffusion layers 19d of memory cells existing in one column are electrically connected to each other through the bit line 33.

FIGS. 17 and 18 show the shape of contact holes (bit line contacts) when the device illustrated in FIGS. 13 through 16 is actually manufactured.

Specifically, as memory cells are miniaturized and contact holes (bit line contacts) are also miniaturized, even if the contact holes are laid out in the shape of square, a resist film serving as a mask is circular in shape, resulting in formation of circular contact holes which are caused by etching with the circular resist film used as a mask.

It should be noted that this example is intended to explain that the contact holes may be formed not only in the shape of square but also in the shape of circle.

FIGS. 19 through 22 illustrate a memory cell array of a NAND cell type non-volatile semiconductor memory device. FIGS. 19 and 20 are top plan view of the memory cell array; FIG. 21 is a cross-sectional view taken along the line XXI—XXI in FIGS. 19 and 20; and FIG. 22 is a cross-sectional view taken along the line XXII—XXII in FIGS. 19 and 20.

It should be noted that for facilitating the understanding of the figures, FIG. 19 omits a wiring layer in which bit lines are formed, and FIG. 20 shows only the wiring layer in which the bit lines are formed. In other words, the bit lines shown in FIG. 20 are formed on the device of FIG. 19.

While description on this example is focused on a memory cell array comprised of memory cells in the stacked gate structure, a similar layout may be employed with memory cells in the single gate structure, as a matter of course.

The memory cell array of the NAND cell type has a structure in which a plurality of NAND strings (or NAND cell units) are connected to bit lines. One NAND string is comprised of a plurality of memory cells connected in series, and a pair of select transistors, each of which is connected to one of both ends of the NAND string.

Since the structure of the memory cell has been described in connection with FIGS. 7 through 9, repetitive description thereon is omitted. The stacked gate structure is employed for the select transistors in a manner similar to the memory cells. However, the select transistors do not have a charge transfer layer, and for example, have an upper gate and a lower gate connected to each other to function as a single gate electrode (select gate line) SG1 or SG2.

A control gate layer (word line) 18 and the select gate lines SG1, SG2 of memory cells extend in a row direction. An interlayer insulating film (made, for example, of silicon oxide) 31 is formed on the memory cells for overlying the memory cells. The interlayer insulating layer 31 is formed with contact holes (bit line contacts) 30 which reach a drain diffusion layer 19d of the memory cells.

A contact plug 32 made of a conductive material is buried in each of the contact holes 30. Then, bit lines 33 are formed on the interlayer insulating film 31. The bit lines 33 are electrically connected to the drain diffusion layers 19d of the memory cells through respective contact plug 32.

The bit lines 33 extend in a column direction. Specifically, the control gate layer 18 and the bit lines 33 are arranged such that they intersect perpendicular or generally perpendicular to each other. One memory cell is provided at each of the intersections of the control gate layer 18 with the bit lines 33.

In the NAND string, two adjacent transistors (memory cells, select transistors) share a single diffusion layer 19. Also, the drain diffusion layer 19d positioned closest to the bit line 33 in the NAND string is shared by two NAND strings in the column direction, however, the drain diffusion layers 19d are independent of each other for NAND strings in the row direction. The source diffusion layer 19s extends in the row direction, and serves as a common source line. Therefore, the source diffusion layer 19s is shared not only by two NAND strings in the column direction but also by a plurality of NAND strings in the row direction adjacent to the source diffusion layer 19s.

Also, in a region in which the source diffusion layer 19s is formed, no element isolation insulating material 14 is formed. In other words, the element isolation areas (element isolation insulating materials) 14, which are formed extending in the column direction, are interrupted by the source diffusion layer 19s. Also, the drain diffusion layers 19d of NAND strings existing in one column are electrically connected to each other through the bit line 33.

FIGS. 23 and 24 show the shape of contact holes (bit line contacts) when the device illustrated in FIGS. 19 through 22 is actually manufactured.

Specifically, as memory cells are miniaturized and contact holes (bit line contacts) are also miniaturized, even if the contact holes are laid out in the shape of square, a resist film serving as a mask is circular in shape, resulting in formation of circular contact holes which are caused by etching with the circular resist film used as a mask.

It should be noted that this example is intended to explain that the contact holes may be formed not only in the shape of square but also in the shape of circle.

The NOR cell type and NAND cell type non-volatile semiconductor memory devices have been described above. In either of the structures, the contact holes (bit line contacts) 30 are arranged in a line in the row direction.

This is because memory cells can be laid out in the highest density when the element areas and the element isolation areas alternately arranged in the row direction extend in the column direction and the control gate layers extend in the row direction orthogonal to the element areas. In other words, the employment of such a layout causes the contact holes (bit line contacts) 30 to be necessarily arranged in a line in the row direction.

In this case, as illustrated in FIGS. 13, 14, 19 and 20, the contact holes (bit lines contacts) 30 are equally spaced at a constant pitch (or a constant period) Xpitch. Then, this constant pitch Xpitch is equal to a repeating pitch (or a repeating period) Xi+Xe of the element areas and the element isolation areas alternately arranged in the row direction. This is because the contact holes are gradually deviated from drains of cells unless both the pitches are the same.

Here, the element areas and the element isolation areas alternately arranged in the row direction are repetitions of so-called lines (element areas or the silicon substrate 11) and spaces (element isolation areas or STI (Shallow Trench Isolation)), wherein the repeating pitch (or the repeating period) Xi+Xe can be reduced in accordance with the performance of an exposure apparatus and processing techniques.

The contact holes (bit line contacts) 30 are formed by opening holes through an interlayer insulating film made of silicon dioxide ($SiO_2$) or the like. The holes having a small diameter cannot be formed satisfactorily. Conversely, the holes having a large diameter cause narrow spacings between adjacent holes, resulting in difficulties in processing.

Therefore, unlike a repeating period of lines and spaces determined by exposure processing techniques, the pitch Xpitch of the contact holes (bit line contacts) 30 is determined not only by the exposure processing techniques but also by the size of the contact holes 30 themselves and the spacings between the contact holes 30.

Also, the contact holes (bit line contacts) 30 are shaped in square (after manufacturing, they may be transformed into circular holes). It is known that square holes are more difficult than a line and space pattern in miniaturization from a viewpoint of the processing techniques. Specifically, even if a reduction in size of memory cells enables the realization of a narrower repeating pitch Xi+Xe of the element areas and the element isolation areas, the contact holes 30 themselves cannot be reduced in size, resulting in the inability of narrowing the pitch Xpitch (repeating pitch Xi+Xe of the element areas and the element isolation areas) of the contact holes (bit line contacts) 30.

As appreciated from the foregoing, in the prior art, the contact holes (particularly, bit line contacts), because of their square shape, encounter difficulties in miniaturization thereof. This gives rise to a problem that the repeating pitch Xi+Xe of the element areas and the element isolation areas (equal to the pitch of the bit lines) is limited to the pitch Xpitch of the contact holes, so that a higher density of memory cells cannot be accomplished.

BRIEF SUMMARY OF THE INVENTION (1) Summary 1

It is an object of the present invention to provide a semiconductor device which has a novel device structure for solving a problem of increased wiring resistance and contact resistance as well as problems possibly arising in manufacturing processes in order to realize miniaturization and higher integration of memory cells.

A semiconductor device according to the present invention includes a contact plug buried in a contact hole and having an upper portion protruding from the contact hole, and
    a wiring in contact with the contact plug, made of a material different from a material of which the contact plug is made, wherein the contact plug extends through the wiring, and the contact plug has an upper surface substantially coplanar with an upper surface of the wiring.

A manufacturing method of a semiconductor device according to the present invention includes the steps of forming a contact hole through an insulating film having a planar upper surface, burying a contact plug in the contact hole, wherein the contact plug has an upper surface substantially coplanar with an upper surface of the insulating film, forming a wiring groove in the insulating film, overlapping the contact hole, and forming a wiring in the wiring groove such that the wiring has an upper surface substantially coplanar with the upper surface of the contact plug.

A semiconductor device according to the present invention includes an element area arranged between element isolation areas, and a metal film arranged on the element area, and having end portions buried in a contact hole overlapping the element isolation area and in a wiring groove on the contact hole. In the element area, memory cells are formed, and the contact hole is arranged on a diffusion layer in the element area.

A semiconductor device according to the present invention includes a bit line contact section for connecting a memory cell to a bit line, a word line contact section for a word line, a gate contact section for a gate of a MOS transistor in a peripheral circuit section, a diffusion layer contact section for a diffusion layer of the MOS transistor in the peripheral circuit section, and a well contact section for on a well region, wherein the bit line contact section has a contact structure substantially identical to a contact structure of at least one of the word line contact section, the gate contact section, the diffusion layer contact section and the well contact section.

A semiconductor device according to the present invention includes a bit line contact section for connecting a NAND cell unit to a bit line, a source line contact section for connecting the NAND cell unit to a source line, a word line contact section for a word line, gate contact sections for a gate of a MOS transistor in a peripheral circuit section and for a gate of a select transistor, a diffusion layer contact section for a diffusion layer of the MOS transistor in the peripheral circuit section, and a well contact section for a well region, wherein the bit line contact section, the source line contact section, the word line contact section, the gate contact sections, the diffusion layer contact section, and the well contact section are all substantially identical in contact structure.

A semiconductor device according to the present invention includes first and second element areas arranged between element isolation areas, a first contact section arranged on the first element area and formed of a conductive film buried in a contact hole, an end portion of which overlaps the element isolation area, and a second contact section arranged on the second element area and formed of a conductive film buried in a contact hole, an end portion of which does not overlap the element isolation area, wherein the first and second contact sections have substantially the same contact structure.

A manufacturing method of a semiconductor device according to the present invention includes the steps of forming a stopper film on first and second conductive layers, forming a first insulating film on the stopper film, etching the first insulating film on condition that the first insulating film has no selectivity to the stopper film to form a first contact hole reaching the first conductive film and a second contract hole not reaching the second conductive layer through the first insulating film, etching the first insulating film on condition that the first insulating film has an etching selectivity to the stopper film to extend the second contact hole such that a bottom of the second contact hole reaches the stopper film, removing the stopper film exposed on the bottom of the contact hole, and filling the same material in the first and second contact holes.

(2) Summary 2

It is an object of the present invention to modify the shape of contact holes to reduce the pitch of the contact holes, i.e., a repeating pitch of element areas and element isolation areas (equal to a pitch of bit lines) to accomplish a higher density, a larger capacity and a reduced cost of memory cells.

A non-volatile semiconductor memory device according to the present invention includes element areas and element isolation areas repeatedly arranged in one direction at a regular period, memory cells arranged in the element areas, contact holes arranged in the one direction at the same period as the regular period, and a wiring arranged in the contact holes for communicating data with the memory cells, wherein the contact holes have a width in a second direction orthogonal to the first direction larger than a width of the contact hole in the first direction.

A non-volatile semiconductor memory device according to the present invention includes element areas and element isolation areas repeatedly arranged in one direction at a regular period, memory cells arranged in the element areas, first contact holes arranged in the one direction generally at the same period as the regular period; a bit line arranged in the first contact holes and connected to one end of a current path of each memory cell through at least one transistor, second contact holes arranged in the one direction generally at the same period as the regular period, and a source line arranged in the second contact holes and connected to the other end of the current path of each memory cell through at least one transistor, wherein both the first and second contact holes have a width in a second direction orthogonal to the first direction larger than a width in the first direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 30 is a cross-sectional view taken along the line XXX—XXX in FIG. 29;

FIG. 31 is a cross-sectional view taken along the line XXXI—XXXI in FIG. 29;

FIG. 33 is a cross-sectional view taken along the line XXXIII—XXXIII in FIG. 32;

FIG. 34 is a cross-sectional view taken along the line XXXIV—XXXIV in FIG. 32;

FIG. 38 is a top plan view illustrating a step in the method of manufacturing the contact structure in FIGS. 26 through 28;

FIG. 41 is a top plan view showing a problem in the manufacturing method in FIGS. 29 through 40;

FIG. 42 is a cross-sectional view taken along the line XLII—XLII in FIG. 41;

FIG. 43 is a cross-sectional view taken along the line XLIII—XLIII in FIG. 41;

FIG. 44 is a top plan view showing a problem in the manufacturing method in FIGS. 29 through 40;

FIG. 47 is a top plan view illustrating a contact structure according to the first invention of the present application;

FIG. 68 is a diagram for explaining techniques which are the premise for a second invention of the present application;

FIG. 78 is a diagram illustrating a step in a method of manufacturing the contact structure in FIGS. 69 through 72;

FIG. 89 is a diagram illustrating a step in a method of manufacturing the contact structure in FIGS. 80 through 83;

FIG. 90 is a diagram illustrating a n exemplary modification to the contact structure according to the second invention of the present application;

FIG. 91 is a diagram illustrating an exemplary modification to the contact structure according to the second invention of the present application;

FIGS. 96A to 96D are diagrams illustrating a contact structure which is the premise for a third invention of the present application;

FIG. 107 is a diagram illustrating the shape of contact holes when the device in FIGS. 103 and 104 is actually manufactured;

FIG. 108 is a diagram illustrating the shape of contact holes when the device in FIGS. 103 and 104 is actually manufactured;

FIG. 113 is a diagram illustrating the shape of contact holes when the device in FIGS. 109 and 110 is actually manufactured;

FIG. 114 is a diagram illustrating the shape of the contact holes when the device in FIGS. 109 and 110 is actually manufactured;

FIG. 117 is a cross-sectional view taken along the line CXVII—CXVII in FIGS. 115 to 116B;

FIG. 118 is a cross-sectional view taken along the line CXVIII—CXVIII in FIGS. 115 to 116B;

FIG. 119 is a diagram illustrating the shape of contact holes when the device in FIGS. 115 to 116B is actually manufactured;

FIG. 120 is a diagram illustrating the shape of the contact holes when the device in FIGS. 115 to 116B is actually manufactured;

FIG. 121 is a top plan view illustrating a memory cell array of a NAND cell type non-volatile semiconductor memory device according to the present invention;

FIG. 122 is a top plan view illustrating bit lines formed on the device in FIG. 121;

FIG. 123 is a cross-sectional view taken along the line CXXIII—CXXIII in FIGS. 121 and 122;

FIG. 124 is a cross-sectional view taken along the line CXXIV—CXXIV in FIGS. 121 and 122;

FIG. 125 is a diagram illustrating the shape of contact holes when the device in FIGS. 121 and 122 is actually manufactured;

FIG. 126 is a diagram illustrating the shape of the contact holes when the device in FIGS. 121 and 122 is actually manufactured;

FIG. 127 is a top plan view illustrating a memory cell array of a NAND cell type non-volatile semiconductor memory device according to the present invention;

FIG. 128 is a top plan view illustrating bit lines formed on the device in FIG. 127;

FIG. 129 is a cross-sectional view taken along the line CXXIX—CXXIX in FIGS. 127 and 128;

FIG. 130 is a cross-sectional view taken along the line CXXX—CXXX in FIGS. 127 and 128;

FIG. 131 is a diagram illustrating the shape of contact hole when the device in FIGS. 127 and 128 is actually manufactured;

FIG. 132 is a diagram illustrating the shape of the contact hole when the device in FIGS. 127 and 128 is actually manufactured;

FIG. 133 is a top plan view illustrating an exemplary modification to the memory cell array of the NOR cell type non-volatile semiconductor memory device according to the present invention; and FIG. 134 is a top plan view illustrating an exemplary modification to the memory cell array of the NAND cell type non-volatile semiconductor memory device according to the present invention.

DETAILED DESCRIPTION OF THE INVENTION (1) Present Invention 1

Semiconductor devices according to the present invention will hereinafter be described in detail with reference to the accompanying drawings. It should be first noted that since the present application includes first through third inventions, these inventions will be described in sequence in independent sections which is subdivided into several items associated therewith.

1. First Invention

A first invention of the present application will be described below.

1.-1. Related Art

Prior to describing a semiconductor device according to the first invention of the present application, description will be made on techniques which are the premise for this invention.

1.-1.-1. Contact Plug Structure

Figure 1:
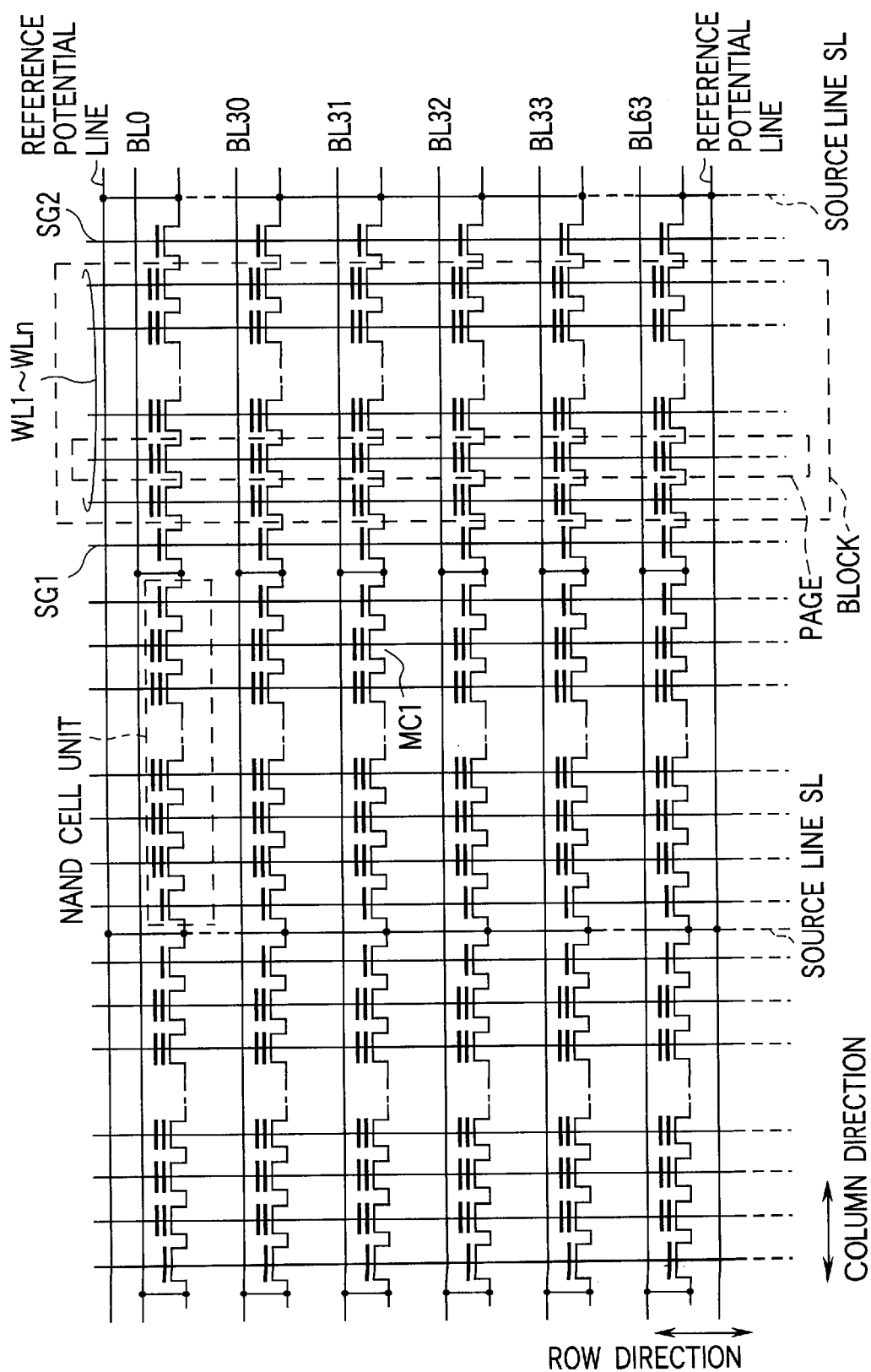
FIG. 1 is a circuit diagram illustrating a memory cell array of a NAND cell type flash memory.
Figure 2:
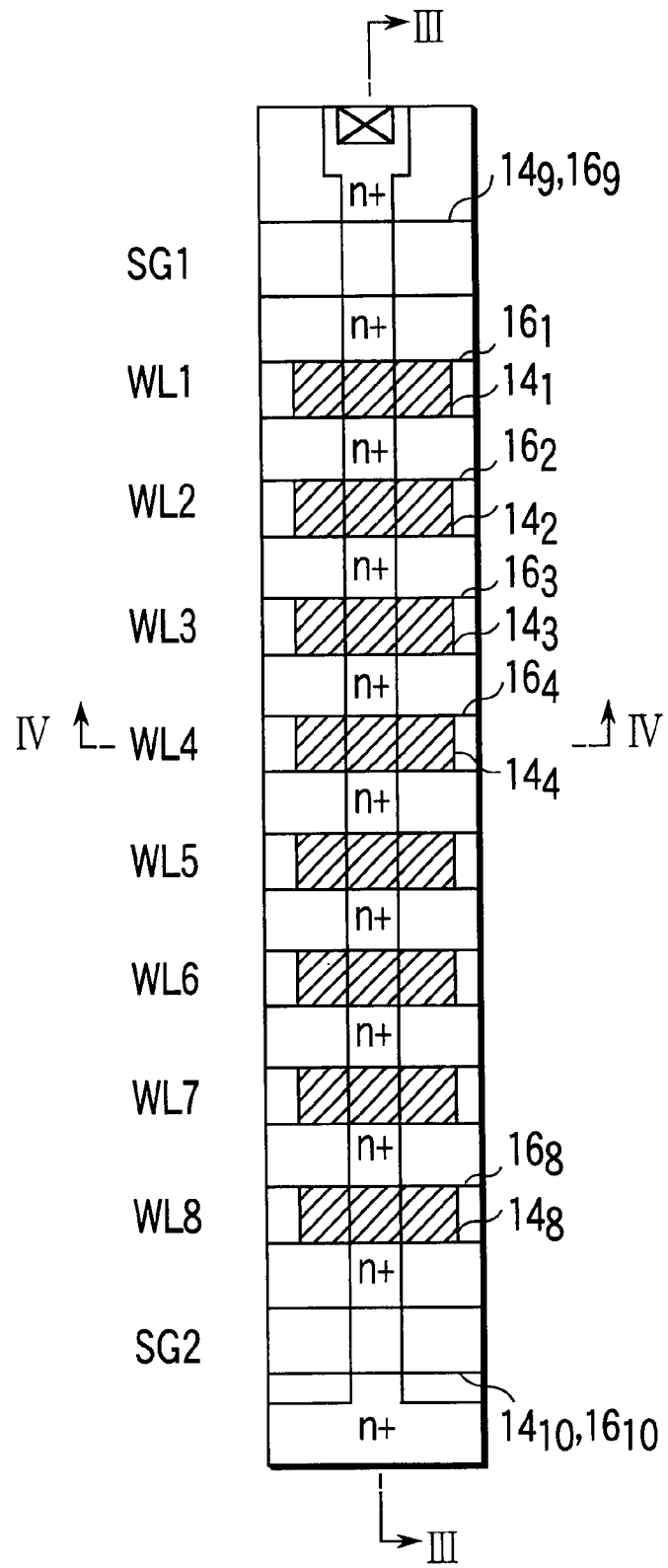
FIG. 2 is a top plan view illustrating the device structure of a NAND cell unit.
Figure 3:
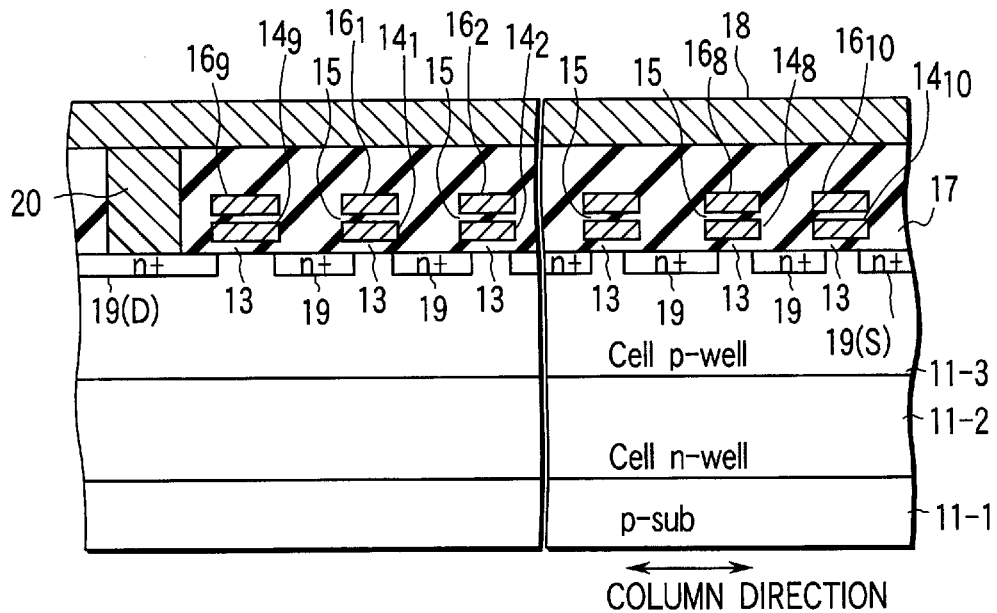
FIG. 3 is a cross-sectional view taken along the line III—III in FIG. 2.
Figure 4:
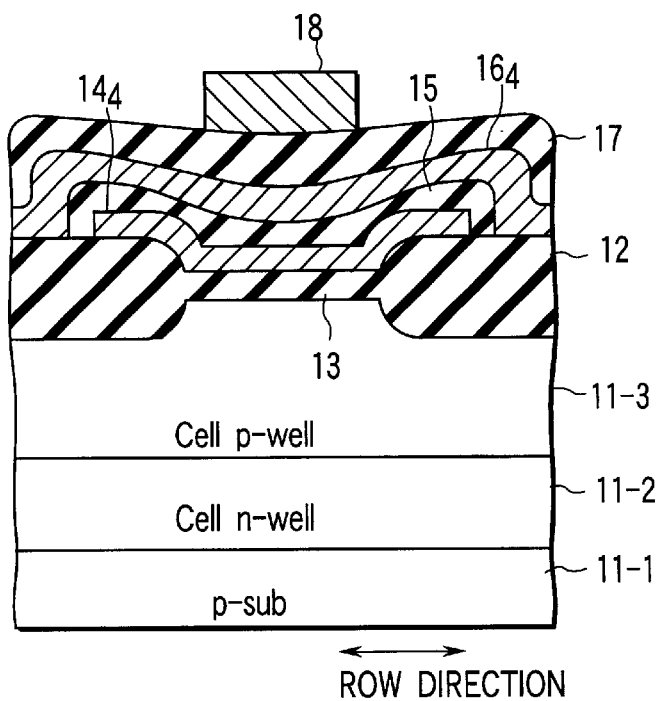
FIG. 4 is a cross-sectional view taken along the line IV—IV in FIG. 2.
Figure 5:
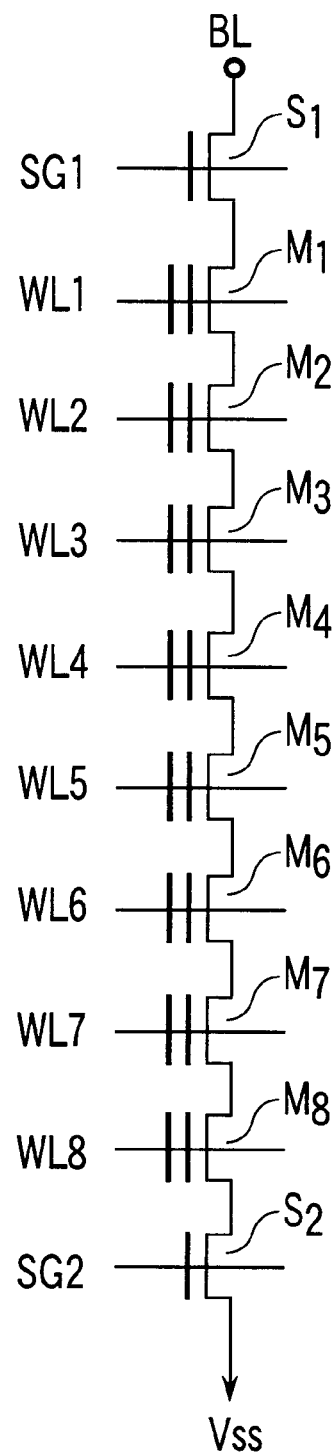
FIG. 5 is a diagram illustrating an equivalent circuit of the NAND cell unit in FIG. 2.
Figure 6:
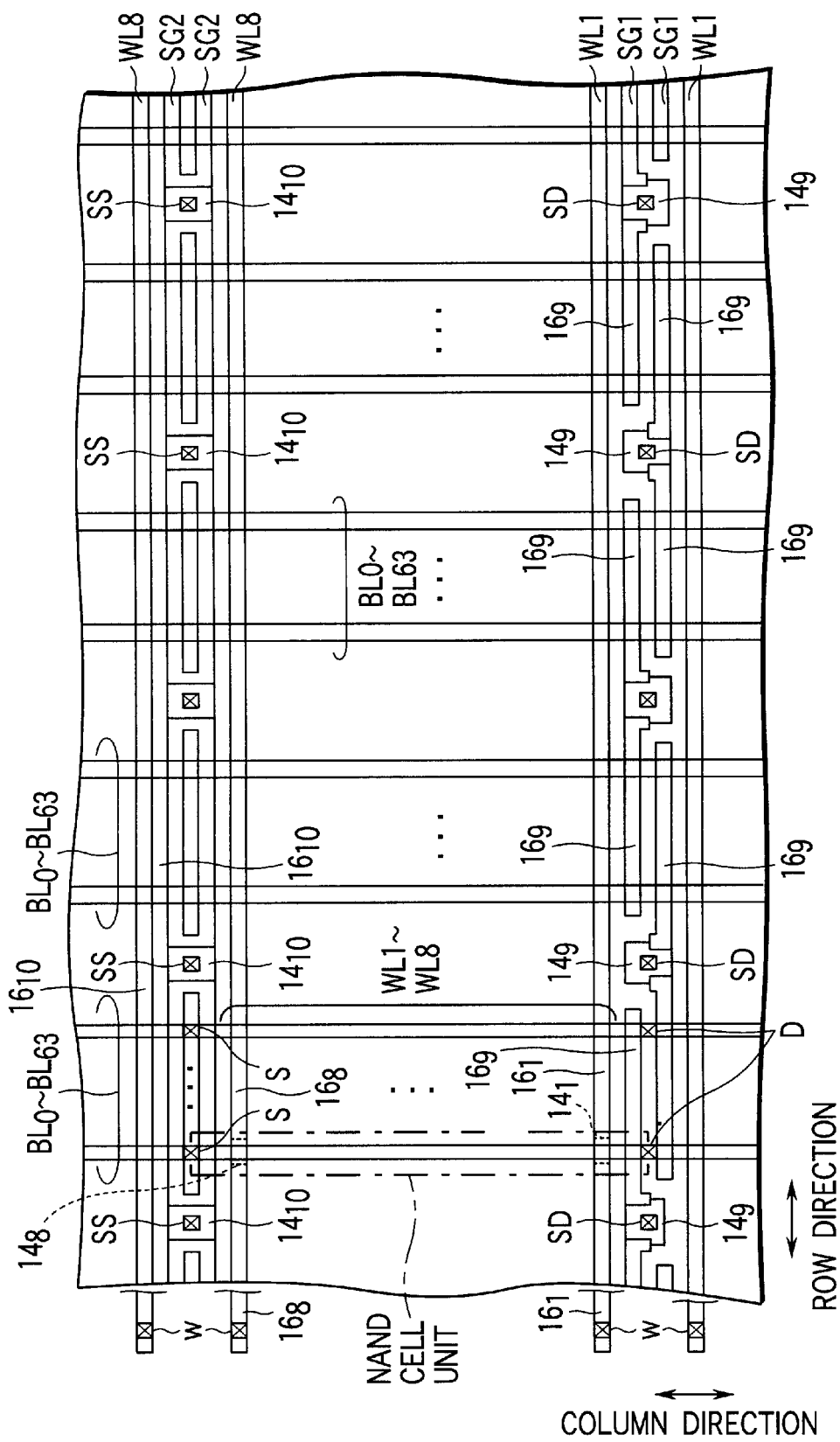
FIG. 6 is a diagram schematically illustrating a general layout of a memory cell array.
Figure 7:
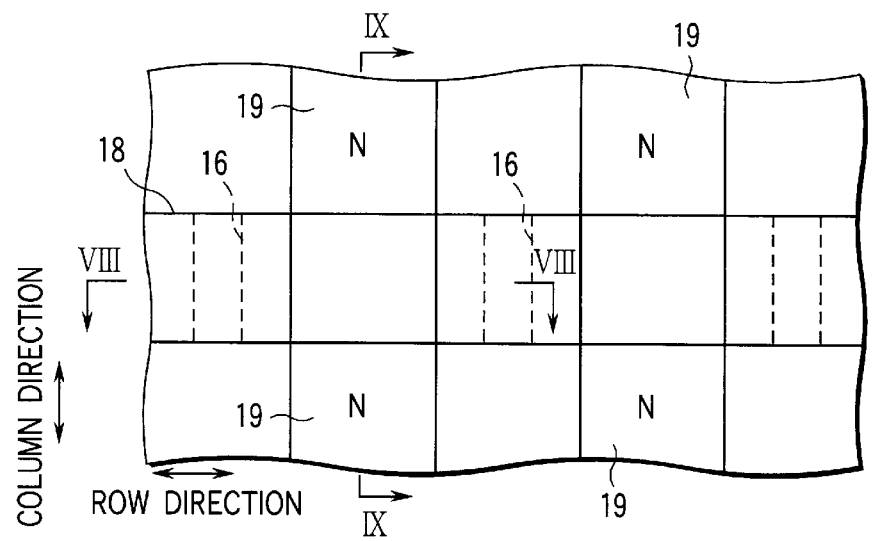
FIG. 7 is a top plan view illustrating the device structure of a stacked gate type memory cell.
Figure 8:
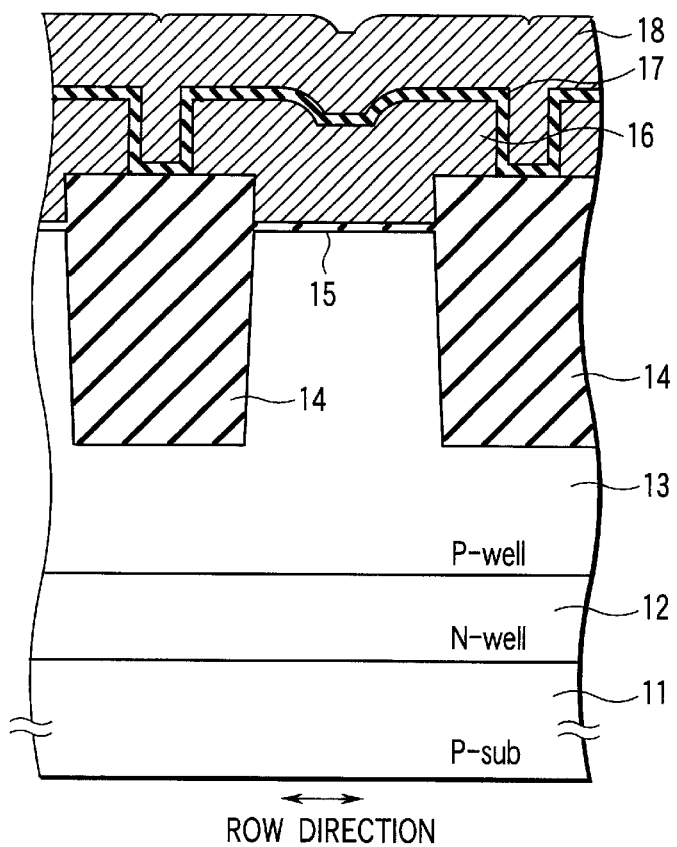
FIG. 8 is a cross-sectional view taken along the line VIII—VIII in FIG. 7.
Figure 9:
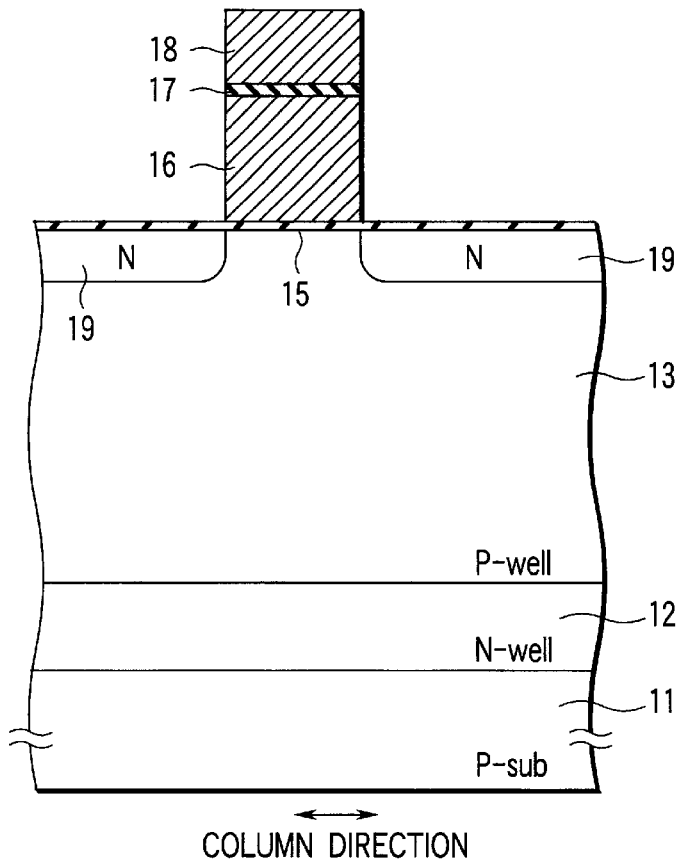
FIG. 9 is a cross-sectional view taken along the line XI—XI in FIG. 7.
Figure 10:
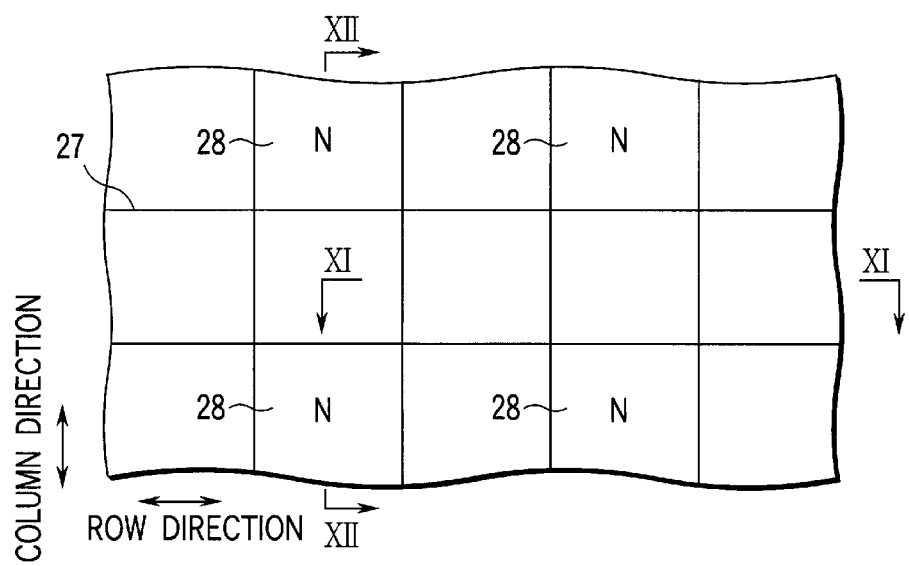
FIG. 10 is a top plan view illustrating the device structure of a single gate type memory cell.
Figure 11:
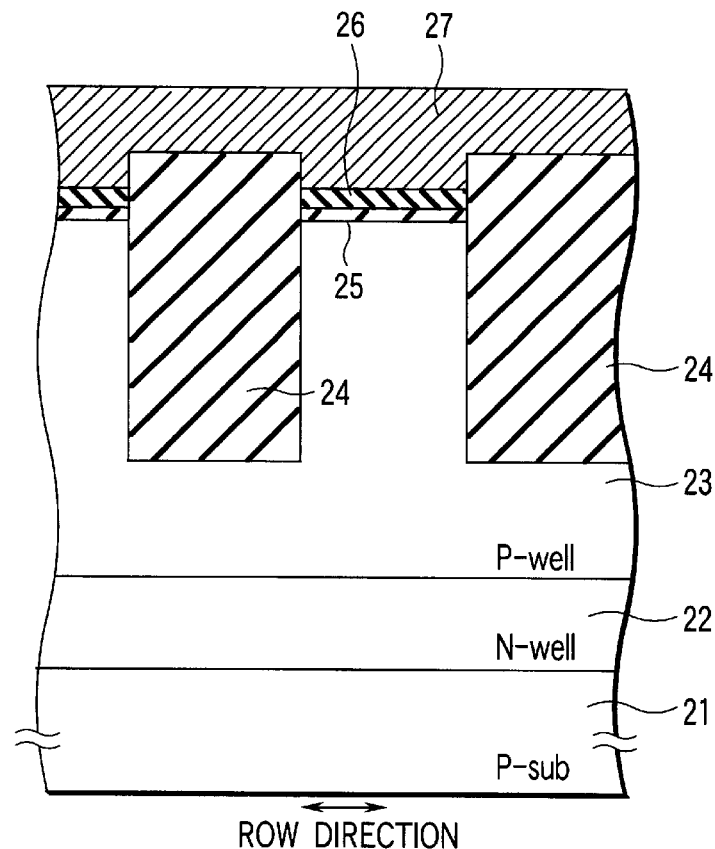
FIG. 11 is a cross-sectional view taken along the line XI—XI in FIG. 10.
Figure 12:
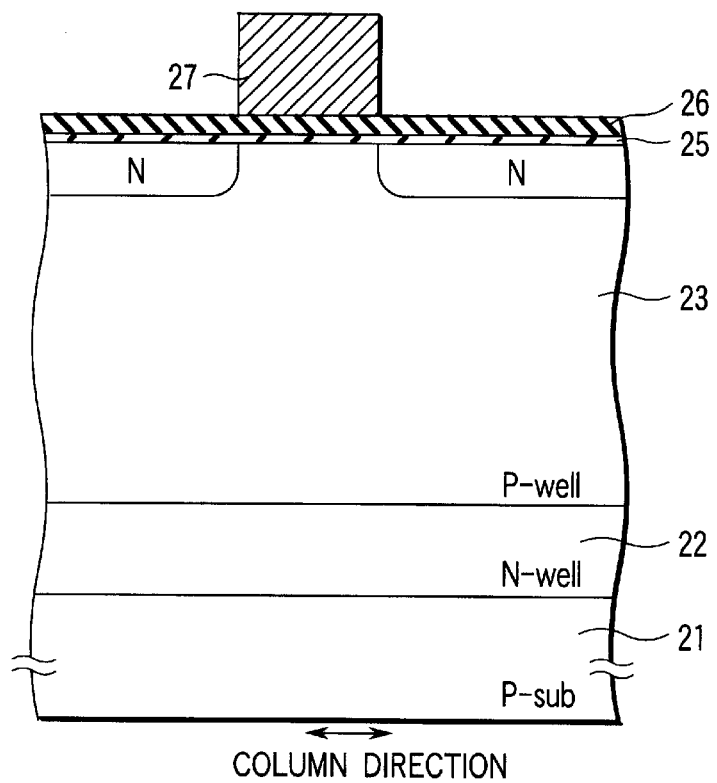
FIG. 12 is a cross-sectional view taken along the line XII—XII in FIG. 10.
Figure 13:
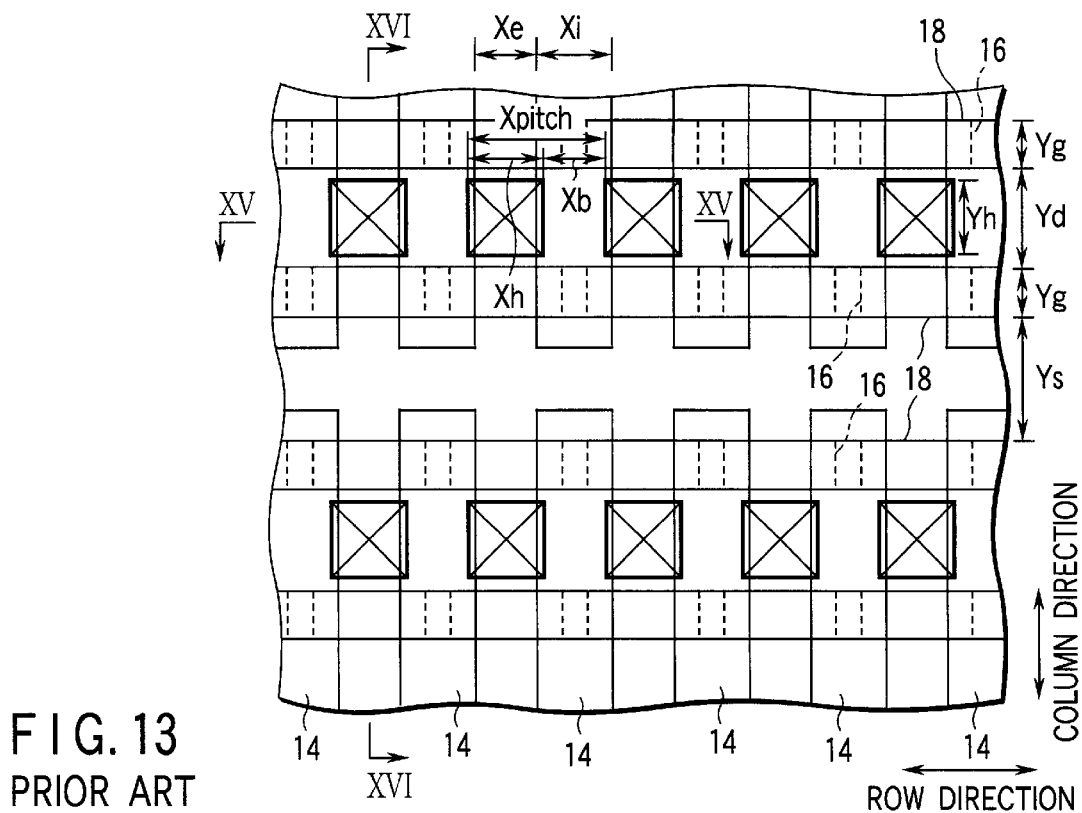
FIG. 13 is a top plan view illustrating a memory cell array of a conventional NOR cell type non-volatile semiconductor memory device.
Figure 14:
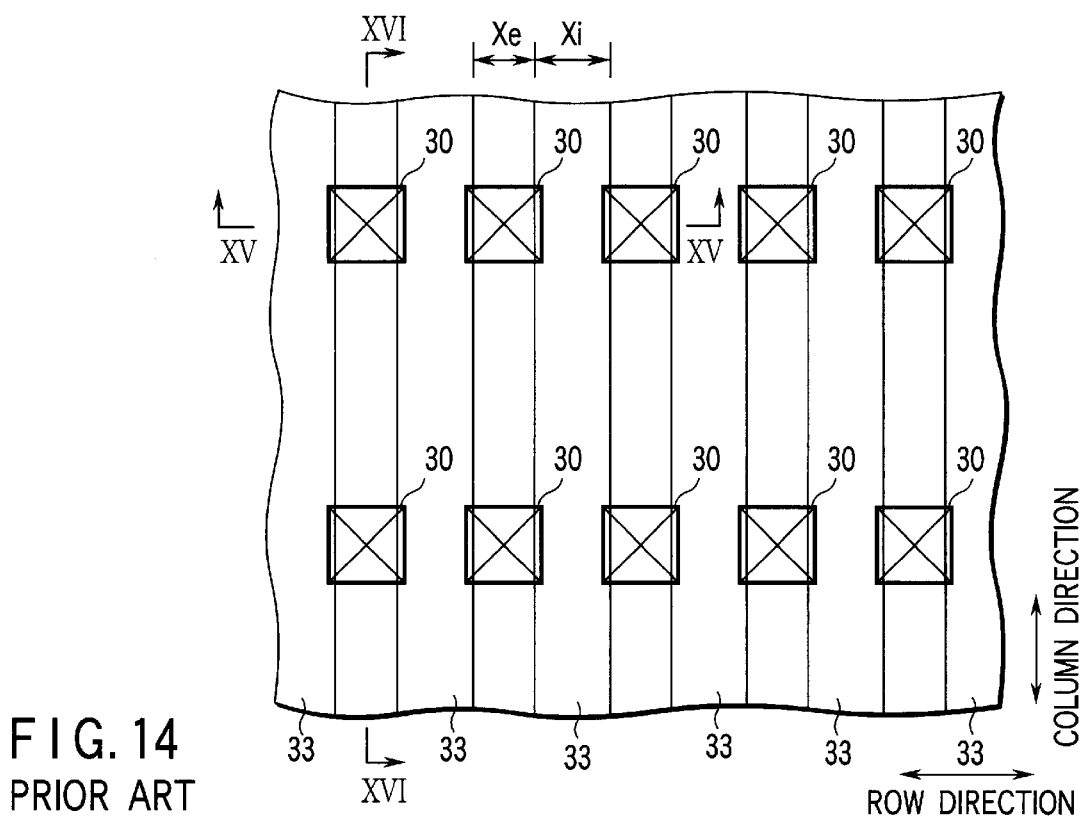
FIG. 14 is a top plan view illustrating bit lines formed on the device in FIG. 13.
Figure 15:
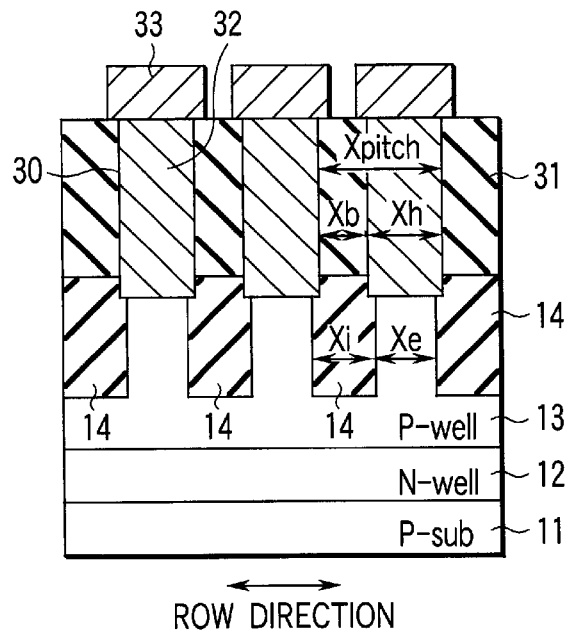
FIG. 15 is a cross-sectional view taken along the line XV—XV in FIGS. 13 and 14.
Figure 16:
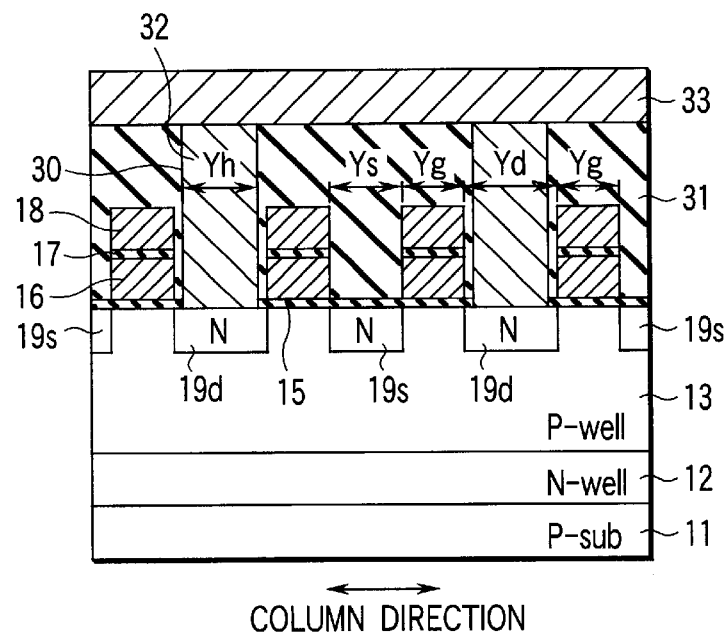
FIG. 16 is a cross-sectional view taken along the line XVI—XVI in FIGS. 13 and 14.
Figure 17:
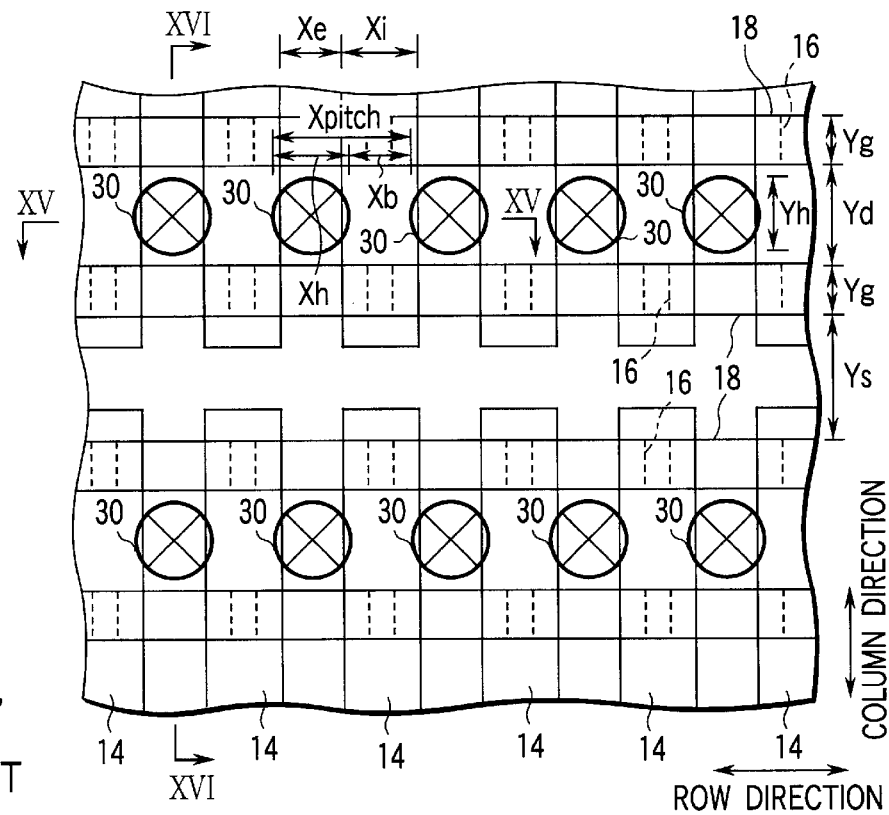
FIG. 17 is a diagram illustrating the shape of contact holes when the device of FIGS. 13 and 14 is actually manufactured.
Figure 18:
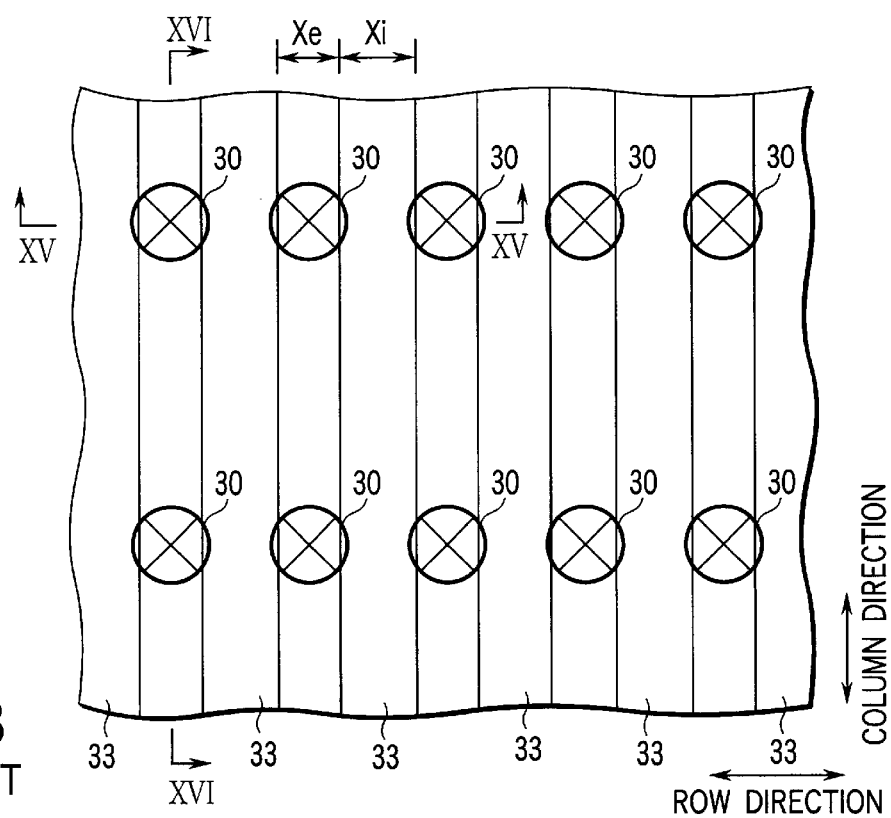
FIG. 18 is a diagram illustrating the shape of contact holes when the device of FIGS. 13 and 14 is actually manufactured.
Figure 19:
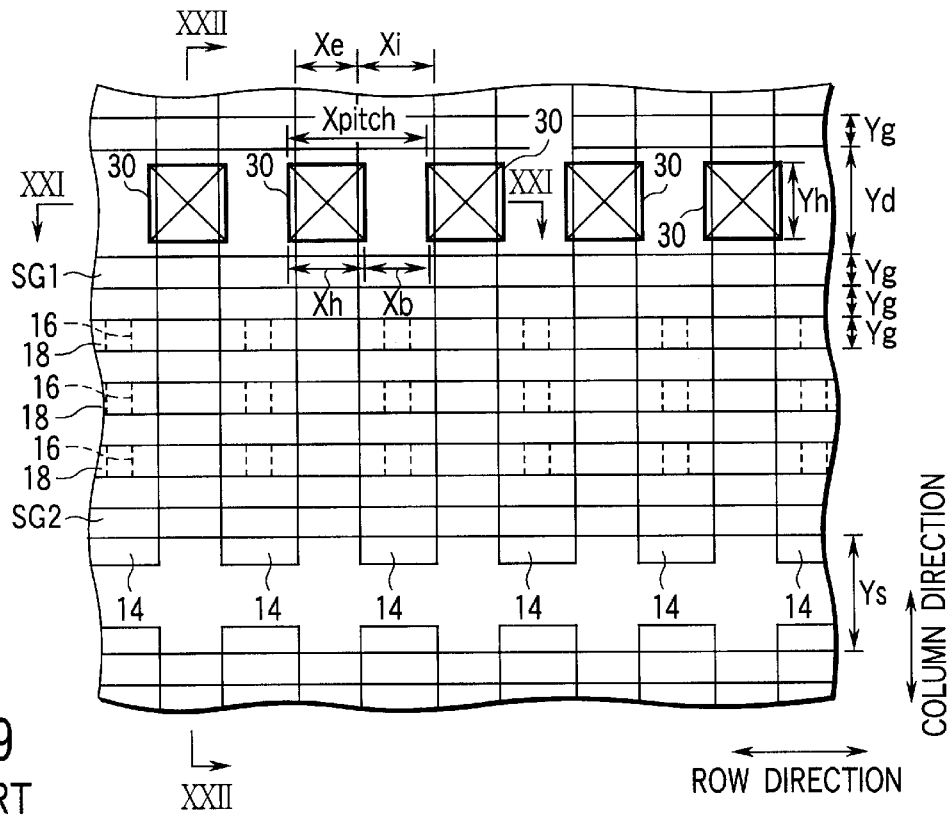
FIG. 19 is a top plan view illustrating a memory cell array of a conventional NAND cell type nonvolatile semiconductor memory device.
Figure 20:
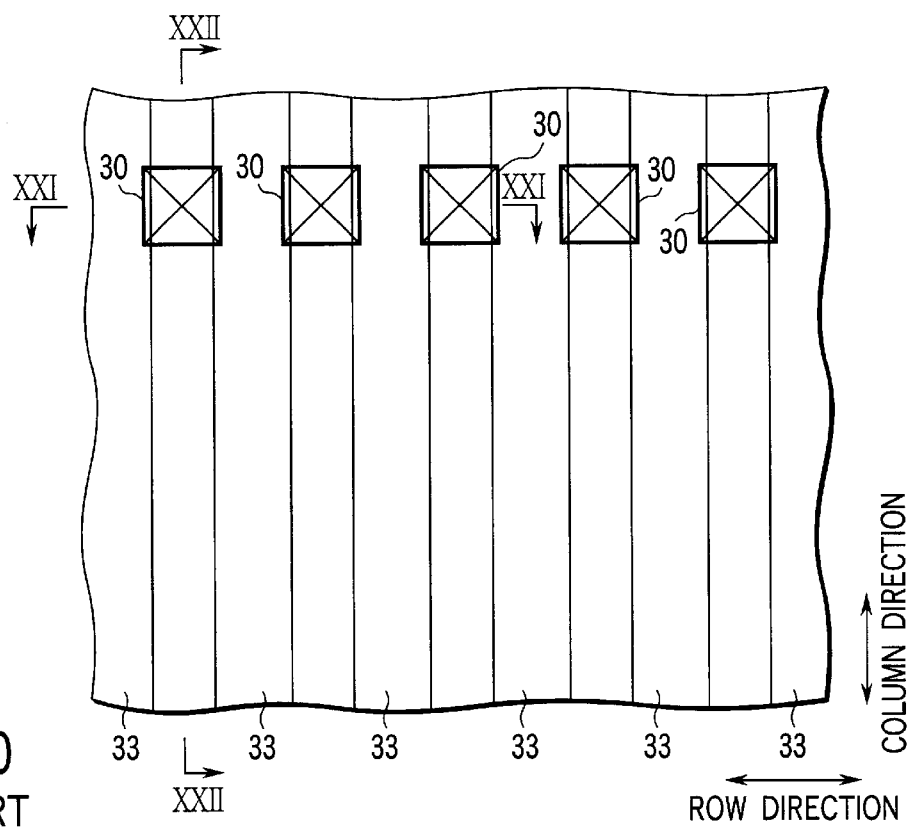
FIG. 20 is a top plan view illustrating bit lines formed on the device in FIG. 19.
Figure 21:
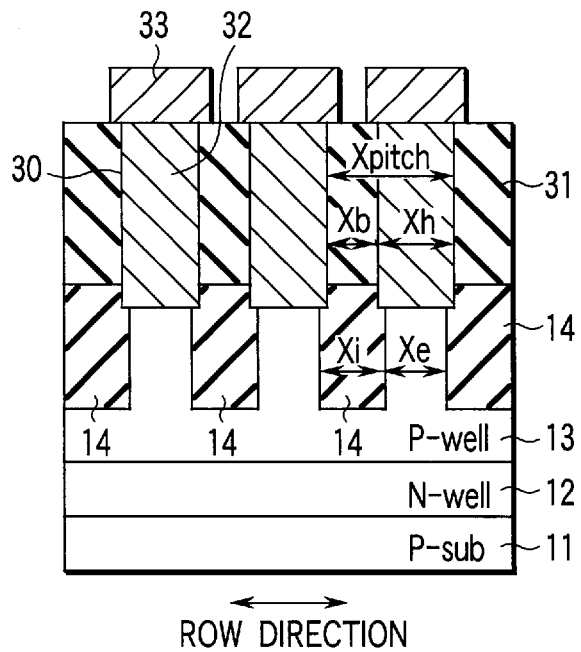
FIG. 21 is a cross-sectional view taken along the line XXI—XXI in FIGS. 19 and 20.
Figure 22:
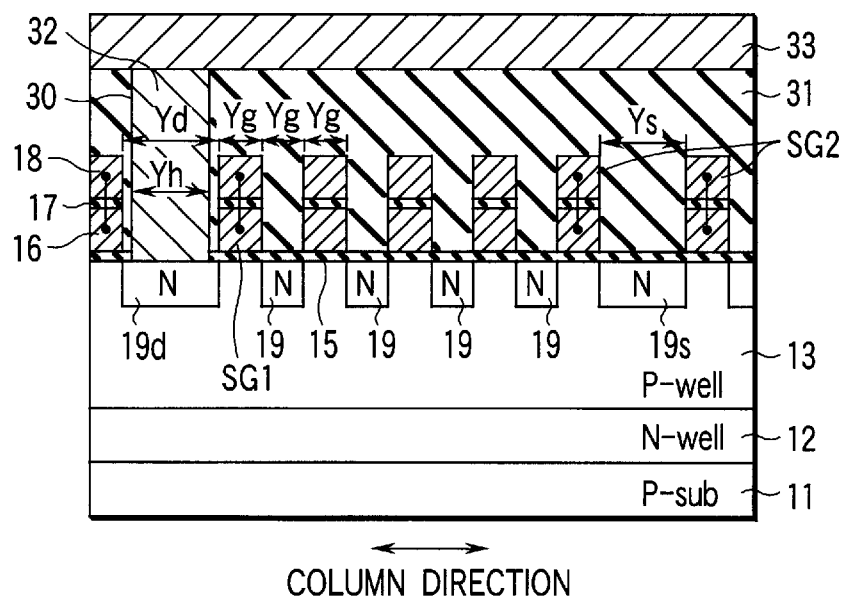
FIG. 22 is a cross-sectional view taken along the line XXII—XXII in FIGS. 19 and 20.
Figure 23:
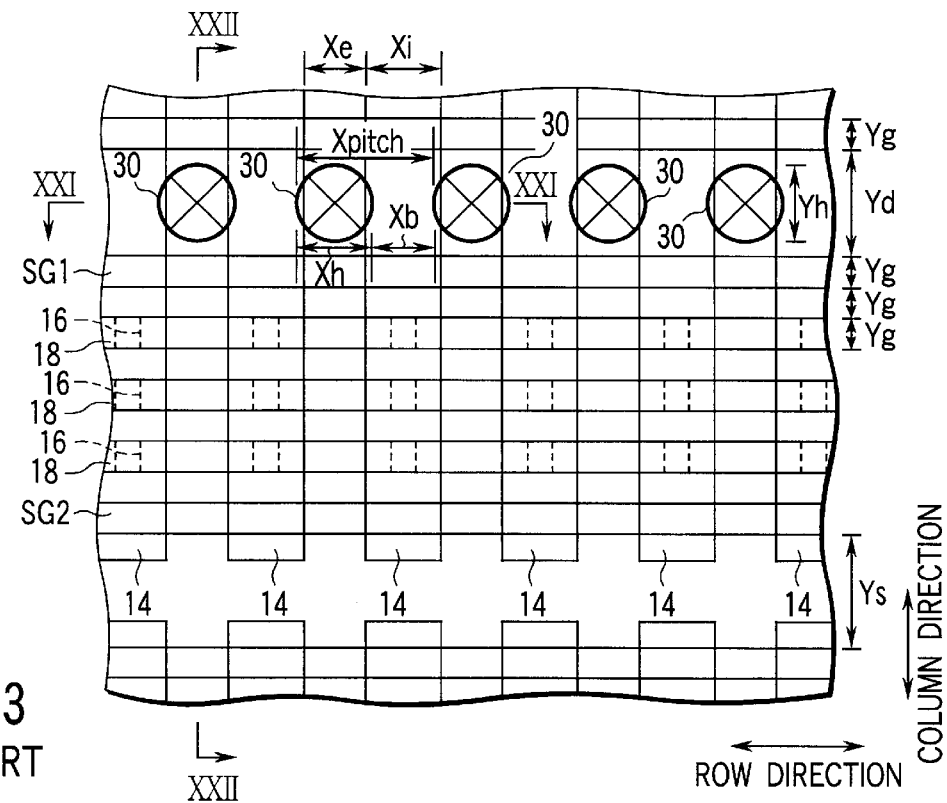
FIG. 23 is a diagram illustrating the shape of contact holes when the device of FIGS. 19 and 20 is actually manufactured.
Figure 24:
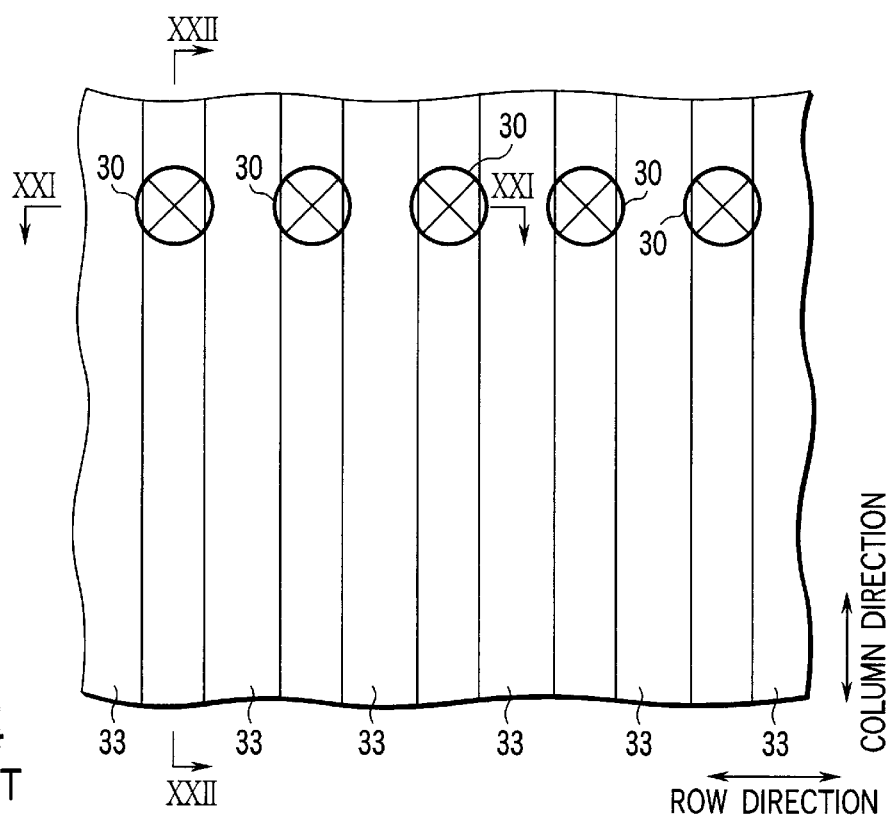
FIG. 24 is a diagram illustrating the shape of contact holes when the device of FIGS. 19 and 20 is actually manufactured.
Figure 25A:
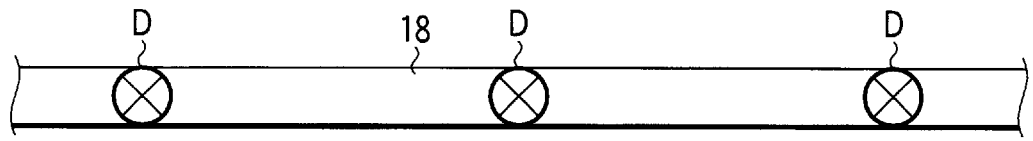
FIGS. 25A through 25C are diagrams for explaining contact structures which are the premise for a first invention of the present application.
Figure 25B:
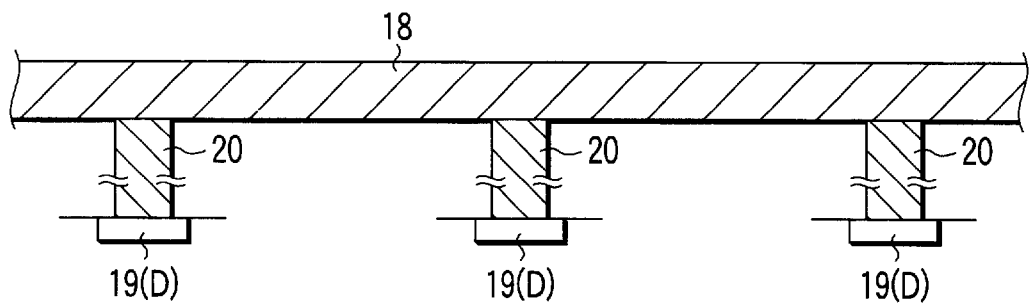
Figure 25C:
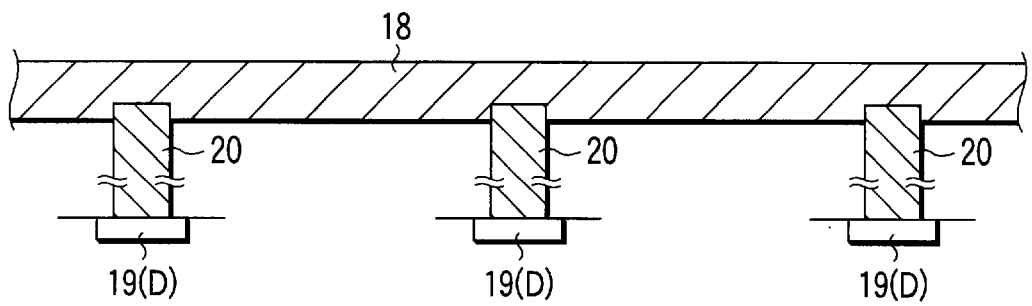

FIGS. 25A through 25C illustrate exemplary structures of contact plugs for connecting a bit line to drains of memory cells (or cell units). Reference numerals in these figures correspond to those in FIGS. 2 through 4.

FIG. 25A is a top plan view of the bit line 18, and FIGS. 25B and 25C are cross-sectional views of FIG. 25A. Bit line contact sections, i.e., contact sections D of the bit line 18 with drain regions 19(D) are provided at regular intervals along the bit line 18. Each of the bit line contact sections D is comprised of a contact hole and a contact plug 20 buried in the contact hole, as can be seen in FIGS. 25B and 25C.

There are two types of structures for the contact plug 20 as follows.

FIG. 25B illustrates a contact structure in which a lower surface of the bit line 18 is substantially coincident with an upper surface of the contact plug 20. FIG. 25C in turn illustrates a contact structure in which an upper surface of the contact plug 20 exists above a lower surface of the bit line 18 (between the lower surface and the upper surface of the bit line 18).

Either of the structures can be formed, for example, through a single-damascene process.

Also, the structure in FIG. 25C is advantageous over the structure in FIG. 25B in that its manufacturing process is simplified, and a contact resistance between the bit line 18 and each contact plug 20 is reduced.

1.-1.-2. SPECIFIC EXAMPLE

In the following, a specific example of the structure in FIG. 25C will be described.

Figure 26:
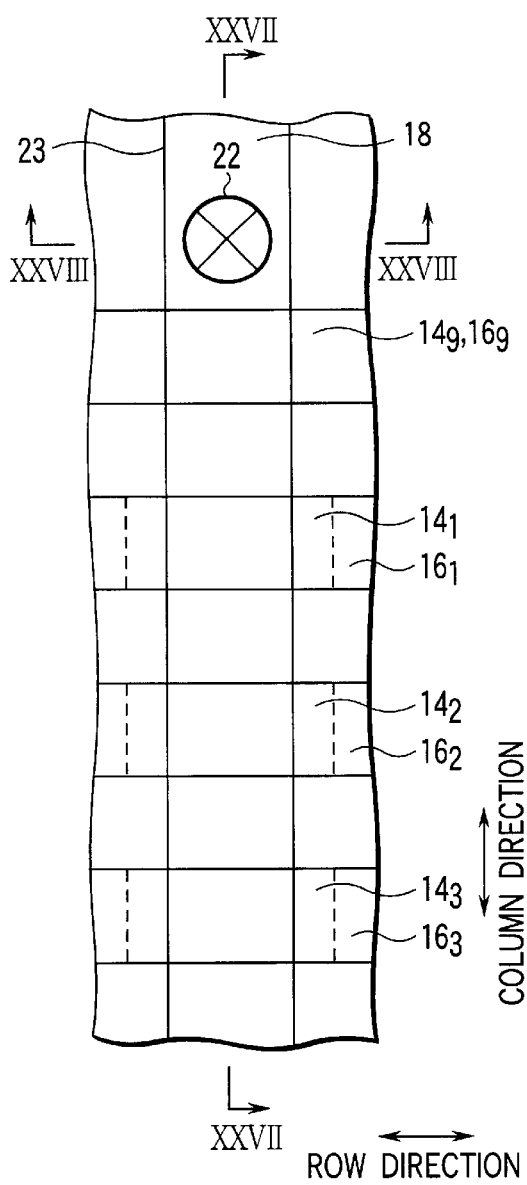
FIG. 26 is a top plan view illustrating the contact structure which is the premise for the first invention of the present application.
Figure 27:
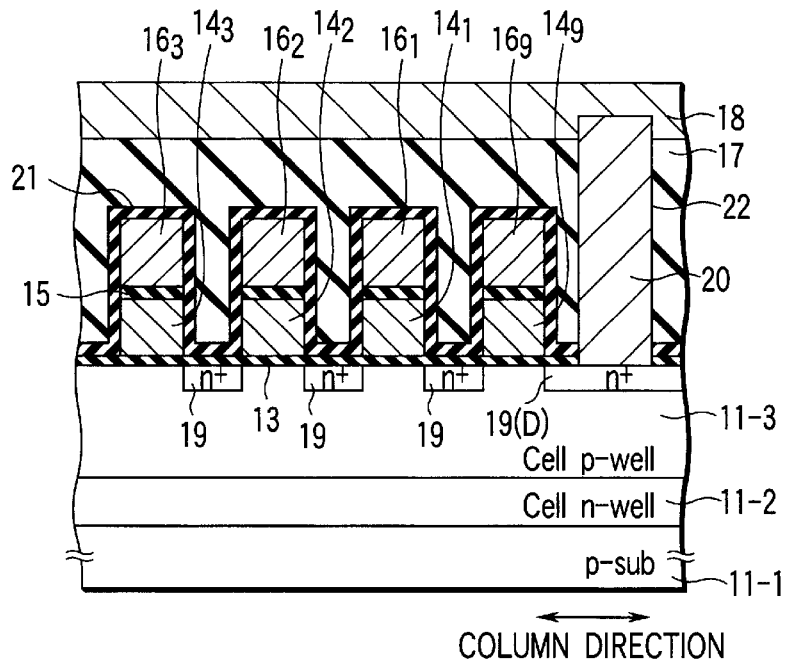
FIG. 27 is a cross-sectional view taken along the line XXVII—XXVII in FIG. 26.
Figure 28:
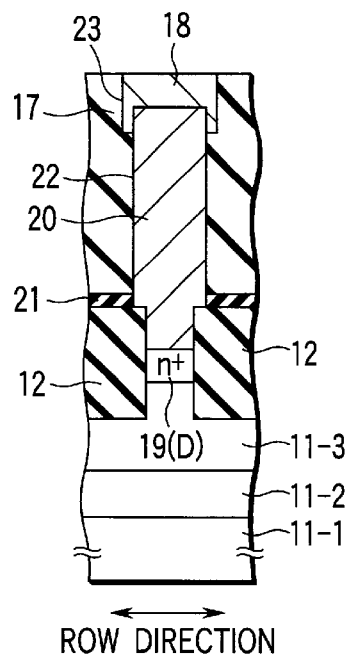
FIG. 28 is a cross-sectional view taken along the line XXVIII—XXVIII in FIG. 26.

FIG. 26 is a top plan view illustrating a portion of a device structure for a cell unit of a NAND cell type flash memory. FIG. 27 is a cross-sectional view taken along the line XXVII—XXVII in FIG. 26, and FIG. 28 is a cross-sectional view taken along the line XXVIII—XXVIII in FIG. 26.

A p-type substrate (p-sub) 11-1 is formed therein with a so-called double well region comprised of an n-type well region (Cell n-well) 11-2 and a p-type well region (Cell p-well) 11-3. Memory cells and select transistors are formed in the p-type well region 11-3.

Memory cells and select transistors are positioned within an element area in the p-type well region 11-3. The element area is surrounded by an element isolation oxide film (element isolation area) 12 formed on the p-type well region 11-3. In this example, the element isolation oxide film 12 has an STI (Shallow Trench Isolation) structure. Alternatively, a LOCOS structure may be employed for the element isolation oxide film 12.

The memory cells are comprised of a silicon oxide film (gate insulating film) 13 formed on the p-type well region (Cell p-well) 11-3; floating gate electrodes $14_1, 14_2, \ldots$ on the silicon oxide film 13; a silicon oxide film (interpoly insulating film) 15 on the floating gate electrodes $14_1, 14_2, \ldots$; control gate electrodes $16_1, 16_2, \ldots$ on the silicon oxide film 15; and source/drain regions 19 within the p-well region (Cell p-well) 11-3.

The select transistor on the bit line side is comprised of the silicon oxide film (gate insulating film) 13 formed on the p-type well region 11-3; gate electrodes $14_9, 16_9$ formed on the silicon oxide film 13; and a source region 19 and a drain region 19(D) within the p-well region 11-3.

Within a plurality of transistors (memory cells, select transistors) in the cell unit, one set of source/drain regions ($n^+$-type diffusion layers) 19 is shared by two adjacent transistors.

The memory cells and the select transistors are overlain by a stopper film (for example, a silicon nitride film) 21 which serves as an etching stopper for forming contact holes (bit line contacts) 22 reaching the $n^+$-type diffusion layer 19(D). In this way, the contact hole 22 can be formed in self alignment with an element area surrounded by the element isolation oxide film 12, for example, the $n^+$-type diffusion layer 19(D) (later described in detail in the section of Manufacturing Method).

A silicon oxide film 17 is formed on the stopper film 21. The silicon oxide film 17 has a flat surface, and is formed with the contact hole 22 and a wiring groove 23.

A contact plug 20 is buried in the contact hole 22. On the other hand, a bit line 18 is buried in the wiring groove 23. The wiring groove 23 and the bit line 18 linearly extend in a column direction. Also, the bit line 18 has an upper surface substantially coplanar with an upper surface of the silicon oxide film 17.

The contact plug 20 has, for example, a cylindrical shape, a top portion of which protrudes from the contact hole 22. In other words, in the structure of this example, the top portion of the contact plug 20 appears to stick into the bit line 18. However, an upper surface of the contact plug 20 does not reach an upper surface of the bit line 18 and exists between the upper surface and lower surface of the bit line 18.

According to such a contact plug structure, the manufacturing process is simplified. In addition, since the bit line 18 is in contact with the upper surface and side surfaces of the contact plug 20, a contact resistance between the bit line 18 and the contact plug 20 is reduced.

1.-1.-3. Manufacturing Method

Next described is a method of manufacturing a NAND cell type flash memory having the contact plug structure illustrated in FIGS. 26 through 28.

Figure 29:
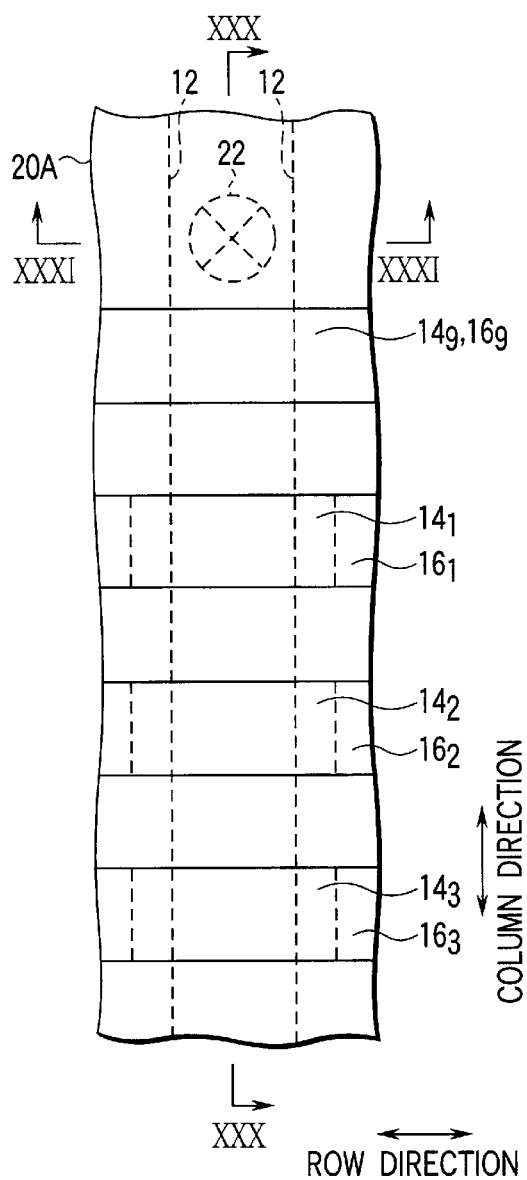
FIG. 29 is a top plan view illustrating a step in a method of manufacturing of the contact structure in FIGS. 26 through 28.

First, as illustrated in FIGS. 29 through 31, n-type impurities and p-type impurities are implanted into a p-type substrate (p-sub) 11-1, for example, using an ion implantation method to form an n-type well region (Cell n-well) 11-2 and a p-type well region (Cell p-well) 11-3 in the p-type substrate 11-1.

Also, a trench is formed in the p-type well region 11-3, for example, using methods such as PEP (Photo Engraving Process), RIE (Reactive Ion Etching) and the like. Further, a silicon oxide film is buried in this trench using, for example, methods such as CVD (Chemical Vapor Deposition) and CMP (Chemical Mechanical Polishing) to form an element isolation oxide film 12 in STI structure.

Next, a silicon oxide film 13 as a gate insulating film is formed on the p-type well region 11-3, for example, by a thermal oxidization method. Subsequently, floating gate electrodes $14_1, 14_2, \ldots$, silicon oxide film (interpoly insulating film) 15 and control gate electrodes $16_1, 16_2, \ldots$ of memory cells, and gate electrodes $14_9, 16_9$ of select transistors are formed, for example, using methods such as CVD, PEP, RIE and the like.

Also, n-type impurities are implanted into the p-type well region 11-3 using an ion implanting method. In this case, since the control gate electrodes $16_1, 16_2, \ldots$, and the gate electrode 169 of the select transistor serve as a mask, source/drain regions ($n^+$-type diffusion regions) 19, 19(D) are formed in self alignment.

Subsequently, a stopper film (for example, a silicon nitride film) 21 is formed on the element isolation oxide film 12 and on transistors (memory cells and select transistors) in the element areas, for example, using a CVD method. Further, a silicon oxide film 17 is subsequently formed on the stopper film 21, for example, using a CVD method.

Then, a contact hole 22 reaching the $n^+$-type diffusion layer 19(D) is formed through the silicon oxide film 17, the stopper film 21 and the silicon oxide film 13, for example, using methods such as PEP, RIE and the like.

The contact hole 22 is formed by a combination of etching under the following condition, by way of example (details will be described later).

① The silicon oxide film 17 is etched on condition that the stopper film (for example, a silicon nitride film) 21 is etched. In other words, the silicon oxide film 17 is etched on condition that the silicon oxide film 17 has substantially no etching selection ratio (selectivity) to the stopper film 21.

② The silicon oxide film 17 is etched on condition that the stopper film 21 is not etched. In other words, the silicon oxide film 17 is etched on condition that has an etching selection ratio (selectivity) to the stopper film 21.

③ The stopper film 21 is etched (for example, the stopper film 21 is etched on condition that the silicon oxide film or silicon has a etching selection ratio (selectivity) to the stopper film 21).

In this way, the contact hole 22 is formed in self alignment with the element area surrounded by the element isolation oxide film 12, for example, with the $n^+$-type diffusion layer 19(D), thereby making it possible to contribute to a reduction in the chip size resulting from a reduction in the memory cell array area.

Subsequently, a conductive film (for example, a polysilicon film doped with impurities) 20A is formed on the silicon oxide film 17 to completely fill the contact hole 22, for example, using a method such as a CVD method.

Figure 32:
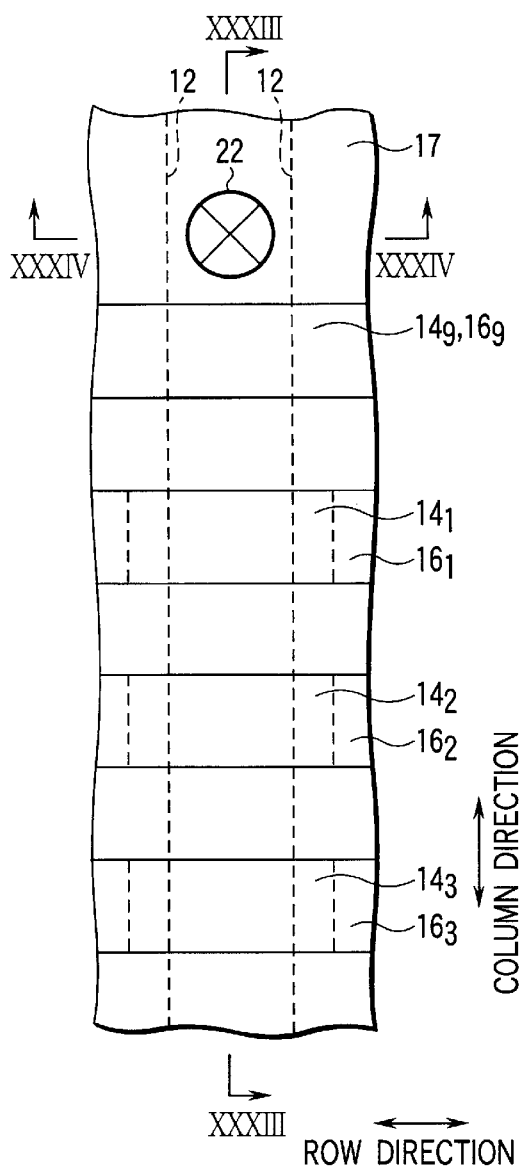
FIG. 32 is a top plan view illustrating a step in the method of manufacturing the contact structure in FIGS. 26 through 28.

Next, as illustrated in FIGS. 32 through 34, the conductive film 20A (see FIGS. 29 through 31) is etched back, for example, using an etching method such as CDE (Chemical Dry Etching), RIE or the like, and a contact plug 20 is formed in the contact hole 22.

Here, the conductive film 20A (see FIGS. 29 through 31) is etched back for an etching time which is controlled such that an upper surface of the contact plug 20 is located at a level lower than an upper surface of the silicon oxide film 17. In other words, the level of the upper surface of the contact plug 20 is determined by the etching time.

Figure 35:
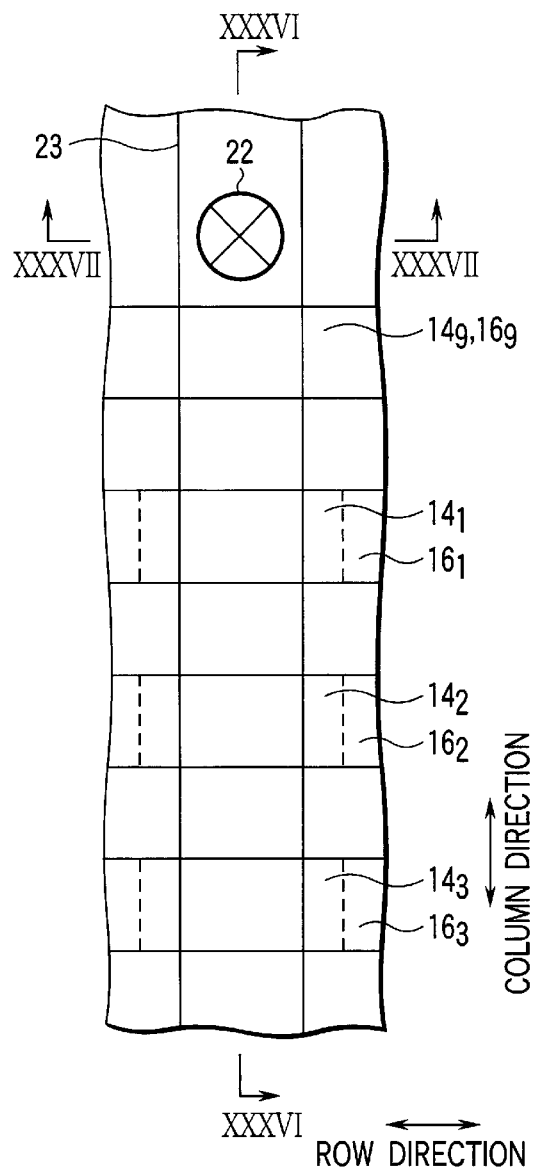
FIG. 35 is a top plan view illustrating a step in the method of manufacturing the contact structure in FIGS. 26 through 28.
Figure 36:
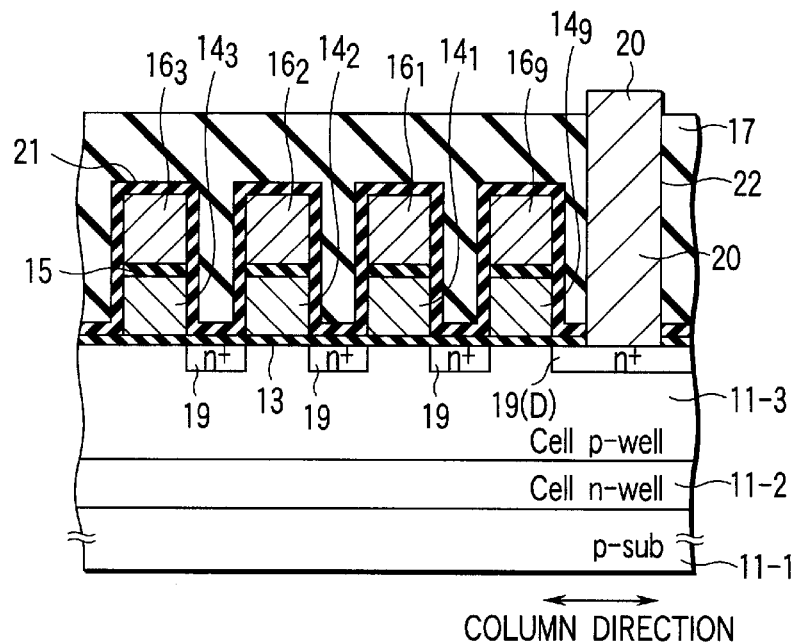
FIG. 36 is a cross-sectional view taken along the line XXXVI—XXXVI in FIG. 35.
Figure 37:
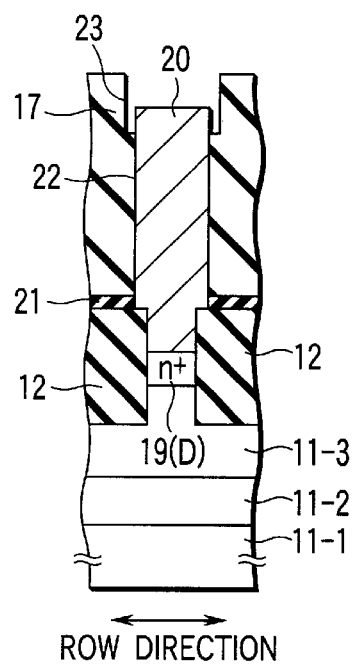
FIG. 37 is a cross-sectional view taken along the line XXXVII—XXXVII in FIG. 35.

Next, as illustrated in FIGS. 35 through 37, a wiring groove 23 is formed in the silicon oxide film 17, for example, using methods such as PEP, RIE and the like. The wiring groove 23 is formed such that it overlaps the contact hole 22 and extends in the column direction. Also, in this case, the silicon oxide film 17 is etched for an etching time which is controlled such that a lower surface of the wiring groove is located at a level lower than the upper surface of the contact plug 20.

As a result, the upper surface and side surfaces (side surfaces of a top portion of the contact plug 20) of the contact plug 20 are exposed to the wiring groove 23. In other words, the top portion of the contact plug 20 protrudes into the wiring groove 23.

Figure 39:
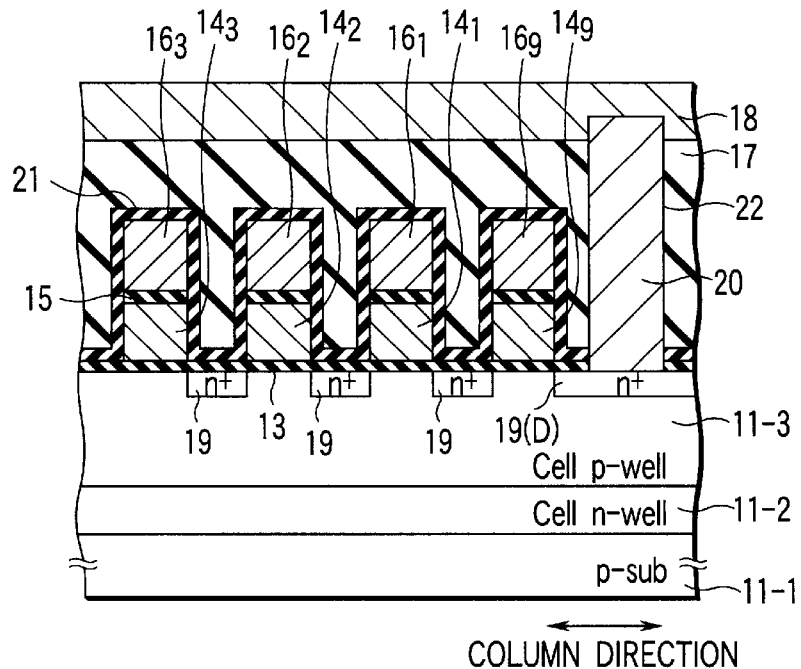
FIG. 39 is a cross-sectional view taken along the line XXXIX—XXXIX in FIG. 38.
Figure 40:
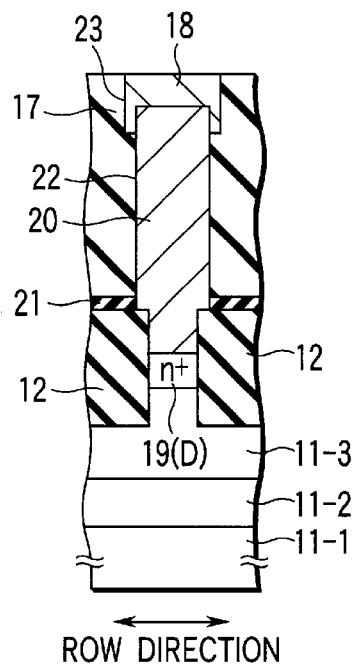
FIG. 40 is a cross-sectional view taken along the line XL—XL in FIG. 38.

Next, as illustrated in FIGS. 38 through 40, a conductive film (for example, a metal film or the like) is formed on the silicon oxide film 17, for example, using a method such as a CVD, sputtering or the like. In the alternative, when a CMP method or an etching method such as CDE, RIE or the like is used to leave the conductive film in the wiring groove 23, a bit line 18 is formed.

1.-1.-4. Problem

When a non-volatile semiconductor memory having the contact plug structure as illustrated in the foregoing FIGS. 26 through 28 is formed using the manufacturing method as illustrated in the foregoing FIGS. 29 through 40, the following problem may arise.

With the recent trend of increasing miniaturization and integration of memory cells, the contact holes are also miniaturized. In addition, the aspect ratio of the contact hole is becoming gradually larger. Thus, in the current situation, it is extremely difficult to form miniaturized contact holes having a large aspect ratio with a satisfactory coverage.

Therefore, as illustrated in FIGS. 41 through 43, when a conductive film 20A is buried in a contact hole 22, the buried conductive film 20A is more susceptible to a seam, i.e., a fracture or a wrinkle in the contact hole 22.

Figure 45:
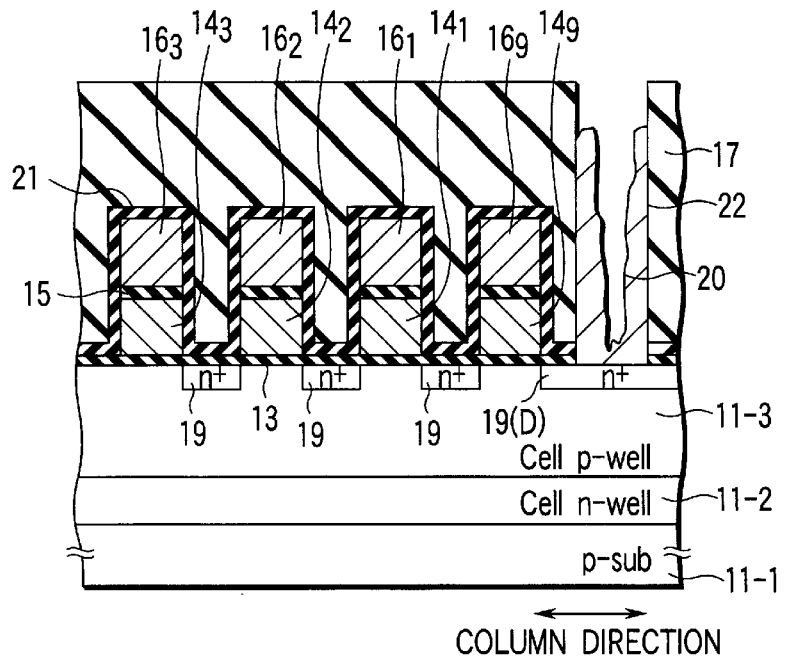
FIG. 45 is a cross-sectional view taken along the line XLV—XLV in FIG. 44.
Figure 46:
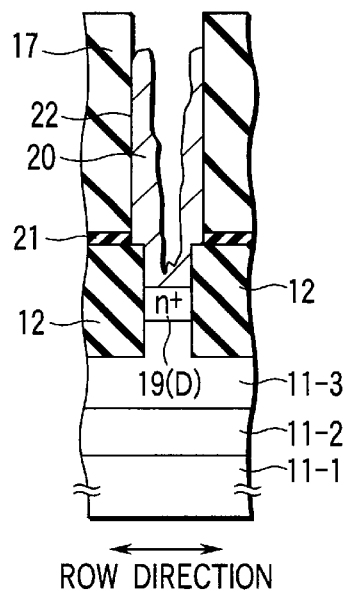
FIG. 46 is a cross-sectional view taken along the line XLVI—XLVI in FIG. 44.

In this case, if the conductive film 20A is etched back, for example, using an etching method such as CDE, RIE or the like, the seam may be spread as illustrated in FIGS. 44 through 46. This spread seam results from the conductive film 20A (see FIGS. 41 through 43) etched to a level lower than the upper surface of the silicon oxide film 17.

Specifically, when the conductive film 20A (see FIGS. 41 through 43) is etched to a level lower than the upper surface of the silicon oxide film 17, the seam is more likely to be exposed on the upper surface of the contact plug 20, as a matter of course. Then, once the seam is exposed, the contact plug 20 is etched from the inner surface of the seam, resulting in the spread seam.

Consequently, as illustrated in FIGS. 44 through 46, as the seam is spread, the conductive material comprising the contact plug 20 is substantially removed from the contact hole 20, causing significantly large variations in contact resistance between such defective contact plugs and normal contact plugs.

The variations in contact resistance also result in variations in operation timing of the memory, thus causing malfunctions.

1.-2. Embodiment

Next, a semiconductor device and a method of manufacturing the same according to the first invention of the present application, for solving the problem set forth above, will be described in detail.

1.-2.-1. Contact Plug Structure

Figure 48:
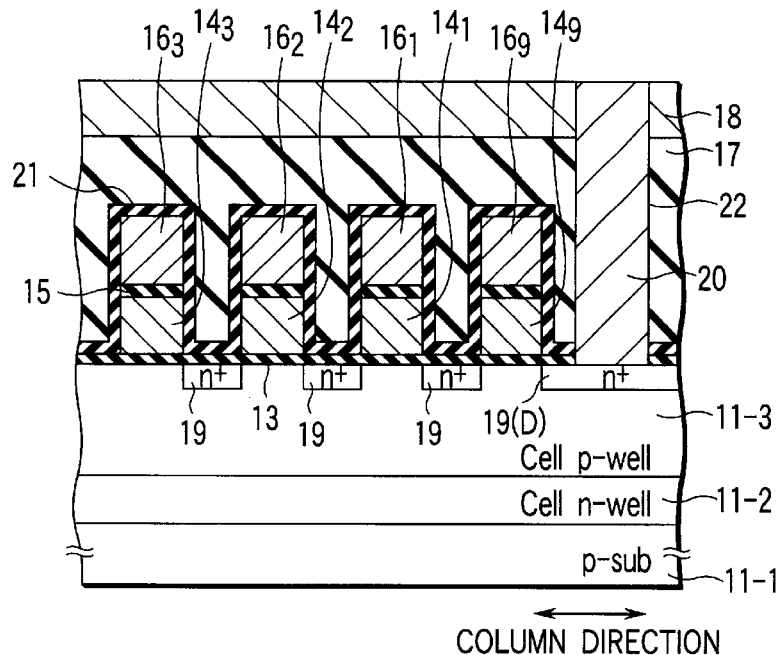
FIG. 48 is a cross-sectional view taken along the line XLVIII—XLVIII in FIG. 47.
Figure 49:
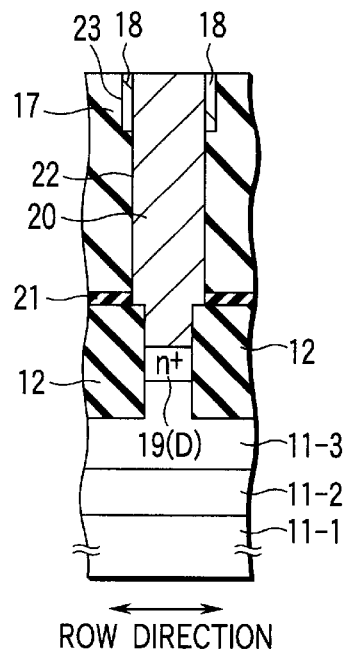
FIG. 49 is a cross-sectional view taken along the line XLIX—XLIX in FIG. 47.

FIG. 47 is a top plan view illustrating a portion of the device structure for a cell unit in a NAND cell type flash memory according to the first invention of the present application. FIG. 48 is a cross-sectional view taken along the line XLVIII—XLVIII in FIG. 47, and FIG. 49 is a cross-sectional view taken along the line XLIX—XLIX in FIG. 47.

A p-type substrate (p-sub) 11-1 is formed therein with a so-called double well region comprised of an n-type well region (Cell n-well) 11-2 and a p-type well region (Cell p-well) 11-3. Memory cells and select transistors are formed in the p-type well region 11-3.

Memory cells and select transistors are positioned within an element area in the p-type well region 11-3. The element area is surrounded by an element isolation oxide film (element isolation area) 12 formed on the p-type well region 11-3. In this example, the element isolation oxide film 12 has an STI (Shallow Trench Isolation) structure. Alternatively, a LOCOS structure may be employed for the element isolation oxide film 12.

The memory cells are comprised of a silicon oxide film (gate insulating film) 13 formed on the p-type well region (Cell p-well) 11-3; floating gate electrodes $14_1, 14_2, \ldots$ on the silicon oxide film 13; a silicon oxide film (interpoly insulating film) 15 on the floating gate electrodes $14_1, 14_2, \ldots$; control gate electrodes $16_1, 16_2, \ldots$ on the silicon oxide film 15; and source/drain regions 19 within the p-well region (Cell p-well) 11-3.

The select transistor on the bit line side is comprised of the silicon oxide film (gate insulating film) 13 formed on the p-type well region 11-3; gate electrodes 149, 169 formed on the silicon oxide film 13; and a source region 19 and a drain region 19(D) within the p-well region 11-3.

Within a plurality of transistors (memory cells, select transistors) in the cell unit, one set of source/drain regions ($n^+$-type diffusion layers) 19 is shared by two adjacent transistors.

The memory cells and the select transistors are overlain by a stopper film (for example, a silicon nitride film) 21 which serves as an etching stopper for forming contact holes including a contact hole (bit line contact) 22 reaching the $n^+$-type diffusion layer 19(D). In this way, the contact hole 22 can be formed in self alignment with the element area surrounded by the element isolation oxide film 12, for example, the $n^+$-type diffusion layer 19(D).

A silicon oxide film 17 is also formed on the stopper film 21. The silicon oxide film 17 has a flat surface, and is formed with the contact hole 22 and a wiring groove 23.

A contact plug 20 is buried in the contact hole 22. On the other hand, a bit line 18 is buried in the wiring groove 23. The wiring groove 23 and the bit line 18 linearly extend in a column direction. Also, the bit line 18 has an upper surface substantially coplanar with an upper surface of the silicon oxide film 17.

The contact plug 20 has, for example, a cylindrical shape, a top portion of which protrudes from the contact hole 22. Further, the contact plug structure according to the first invention of the present application features that the contact plug 20 extends through the bit line 18. In other words, the upper surface of the contact plug 20 is exposed on the upper surface of the bit line 18 and substantially coplanar with the upper surface of the bit line 18.

According to the contact plug structure as described above, since the upper surface of the contact plug 20 is substantially coplanar with the upper surface of the bit line 18, even if a seam were formed in the contact hole 22, the seam would not be exposed during etch-back for forming the contact plug 20, and the seam would not either be spread.

Consequently, all contact plugs are made normal, thereby reducing variations in contact resistance between the contact plugs. As such, variations in the operation timing of the memory are eliminated, thus making it possible to provide a highly reliable non-volatile semiconductor memory.

When the contact plug 20 extends through the bit line 18, the contact plug 20 traverses the bit line 18 which has a lower resistance than the contact plug 20. Therefore, if a plurality of contact plugs 20 are connected to a single bit line 18, the wiring resistance of the bit line 18 may be problematic. Also, since the contact plug 20 is in contact with the bit line only on its sides, a contact area of the contact plug 20 with the bit line 18 is reduced.

As countermeasures taken to such problems, a means for providing a fringe in the contact section is contemplated. Also, a third invention of the present invention, later described, may be applied.

1.-2.-2. Manufacturing Method

Next described is a method of manufacturing a NAND cell type flash memory having the contact plug structure illustrated in FIGS. 47 through 49.

Figure 50:
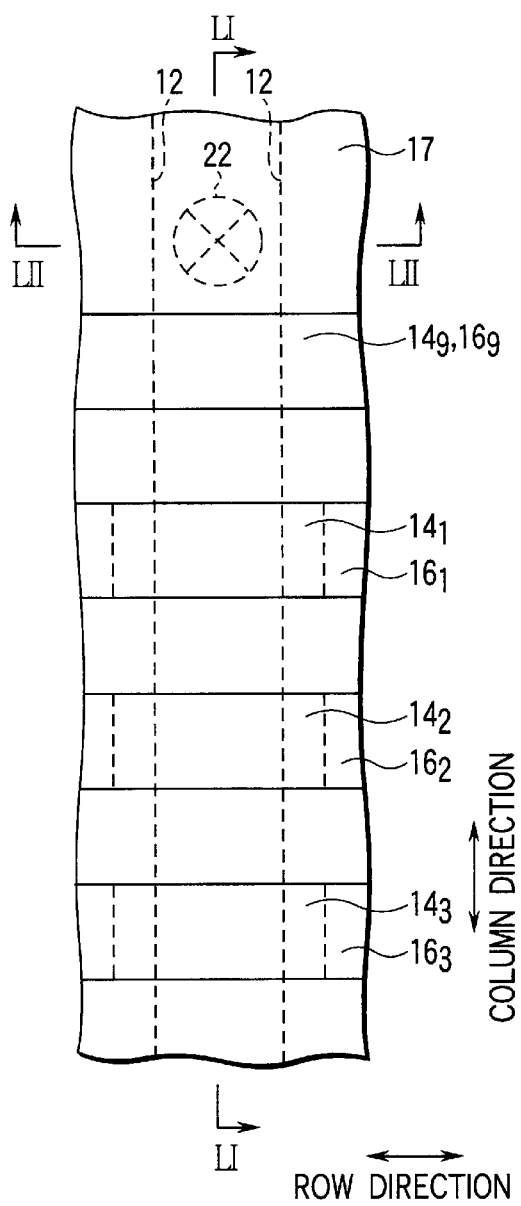
FIG. 50 is a top plan view illustrating a step in a method of manufacturing the contact structure in FIGS. 47 through 49.
Figure 51:
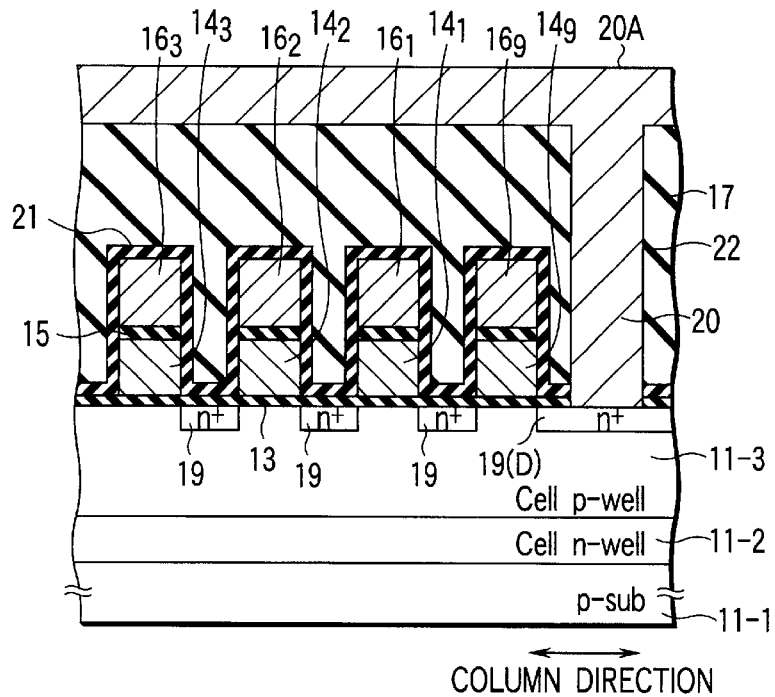
FIG. 51 is a cross-sectional view taken along the line LI—LI in FIG. 50.
Figure 52:
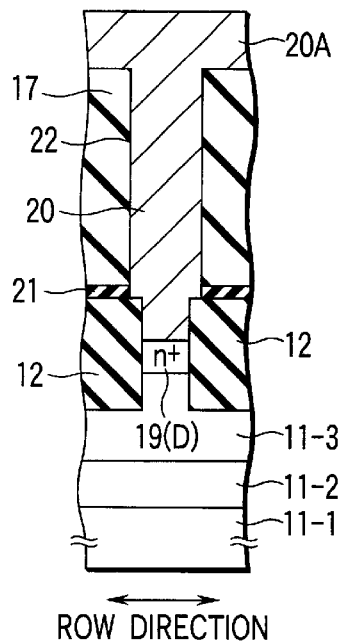
FIG. 52 is a cross-sectional view taken along the line LII—LII in FIG. 50.

First, as illustrated in FIGS. 50 through 52, n-type impurities and p-type impurities are implanted into a p-type substrate (p-sub) 11-1, for example, using an ion implantation method to form a n-type well region (Cell n-well) 11-2 and a p-type well region (Cell p-well) 11-3, respectively, in the p-type substrate 11-1.

Also, a trench is formed in the p-type well region 11-3, for example, using methods such as PEP (Photo Engraving Process), RIE (Reactive Ion Etching) and the like. Further, a silicon oxide film is buried in this trench using, for example, methods such as CVD (Chemical Vapor Deposition) and CMP (Chemical Mechanical Polishing) to form an element isolation oxide film 12 in STI structure.

Next, a silicon oxide film 13 as a gate insulating film is formed on the p-type well region 11-3, for example, by a thermal oxidization method. Subsequently, floating gate electrodes $14_1$, $14_2$, . . . , silicon oxide film (interpoly insulating film) 15 and control gate electrodes $16_1$, $16_2$, . . . of memory cells, and gate electrodes $14_9$, $16_9$ of select transistors are formed, for example, using methods such as CVD, PEP, RIE and the like.

Also, n-type impurities are implanted into the p-type well region 11-3 using an ion implanting method. In this case, since the control gate electrodes $16_1$, $16_2$, . . . , and the gate electrode $16_9$ of the select transistor serve as a mask, source/drain regions ($n^+$-type diffusion regions) 19, 19(D) are formed in self alignment.

Subsequently, a stopper film (for example, a silicon nitride film) 21 is formed on the element isolation oxide film 12 and on transistors (memory cells and select transistors) in the element area, for example, using a CVD method. Further, a silicon oxide film 17 is subsequently formed on the stopper film 21, for example, using a CVD method.

Then, a contact hole 22 reaching the $n^+$-type diffusion layer 19(D) is formed through the silicon oxide film 17, the stopper film 21 and the silicon oxide film 13, for example, using methods such as PEP, RIE and the like.

The contact hole 22 is formed by a combination of: ① etching the silicon oxide film 17 on condition that the stopper film (for example, a silicon nitride film) 21 is etched; ② etching the silicon oxide film 17 on condition that the stopper film 21 is not etched; and ③ etching the stopper film 21 (details will be described in a second invention).

In this way, the contact hole 22 is formed in self alignment with the element area surrounded by the element isolation oxide film 12, for example, with the $n^+$-type diffusion layer 19(D), thereby making it possible to contribute to a reduction in the chip size resulting from a reduction in the memory cell array area.

Subsequently, a conductive film (for example, a polysilicon film doped with impurities) 20A is formed on the silicon oxide film 17 to completely fill the contact hole 22, for example, using a method such as a CVD method.

Figure 53:
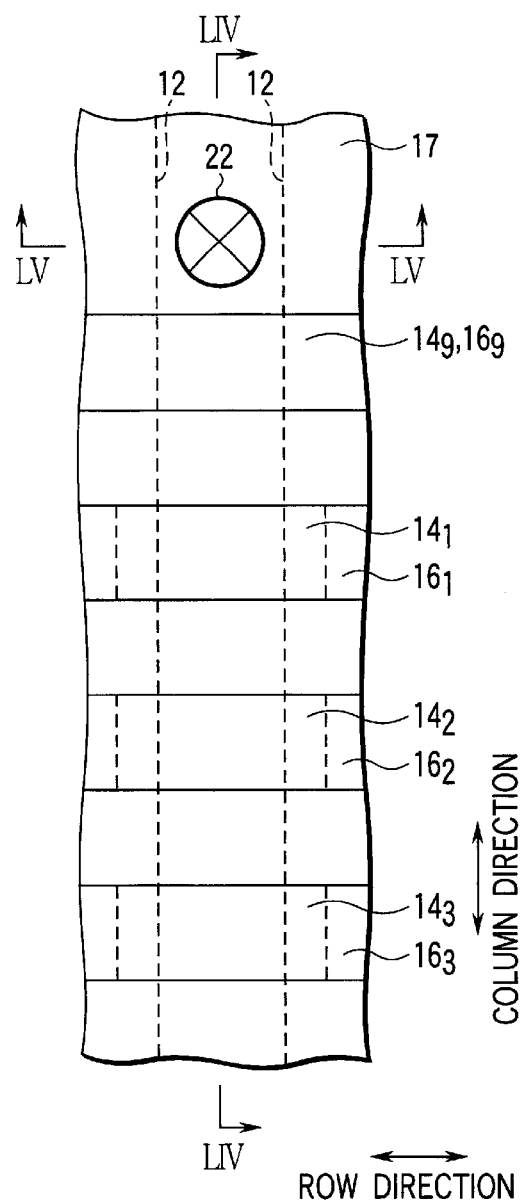
FIG. 53 is a top plan view illustrating a step in the method of manufacturing the contact structure in FIGS. 47 through 49.
Figure 54:
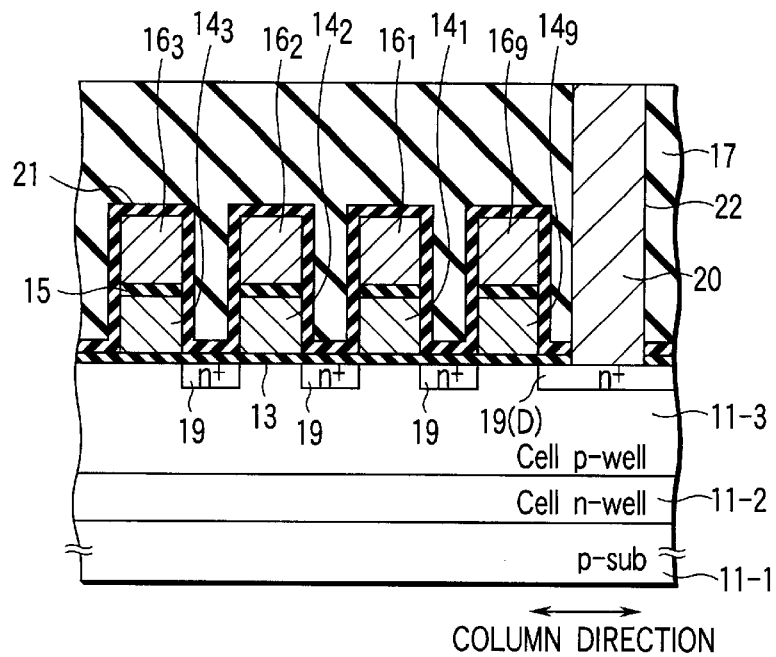
FIG. 54 is a cross-sectional view taken along the line LIV—LIV in FIG. 53.
Figure 55:
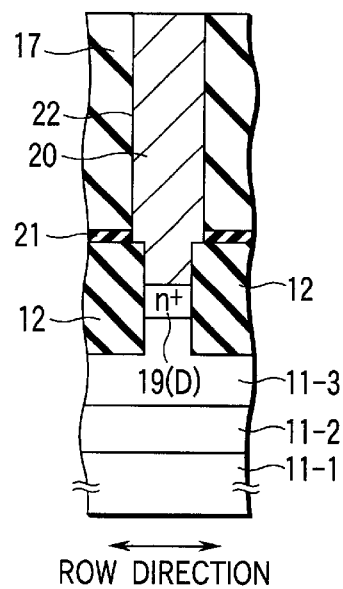
FIG. 55 is a cross-sectional view taken along the line LV—LV in FIG. 53.

Next, as illustrated in FIGS. 53 through 55, the conductive film 20A (see FIGS. 50 through 52) is etched (etched back), for example, using a CMP method or an etching method such as CDE (Chemical Dry Etching), RIE or the like, and a contact plug 20 is formed in the contact hole 22.

Here, the conductive film 20A (see FIGS. 50 through 52) is etched (or etched back) for an etching time which is controlled such that an upper surface of the contact plug 20 is substantially coplanar with an upper surface of the silicon oxide film 17.

Figure 56:
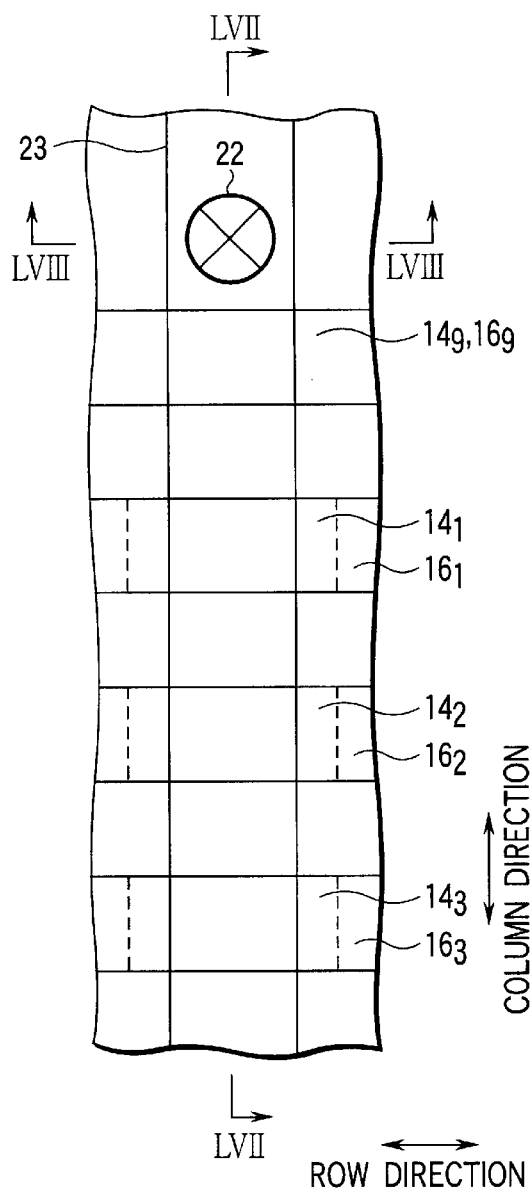
FIG. 56 is a top plan view illustrating a step in the method of manufacturing the contact structure in FIGS. 47 through 49.
Figure 57:
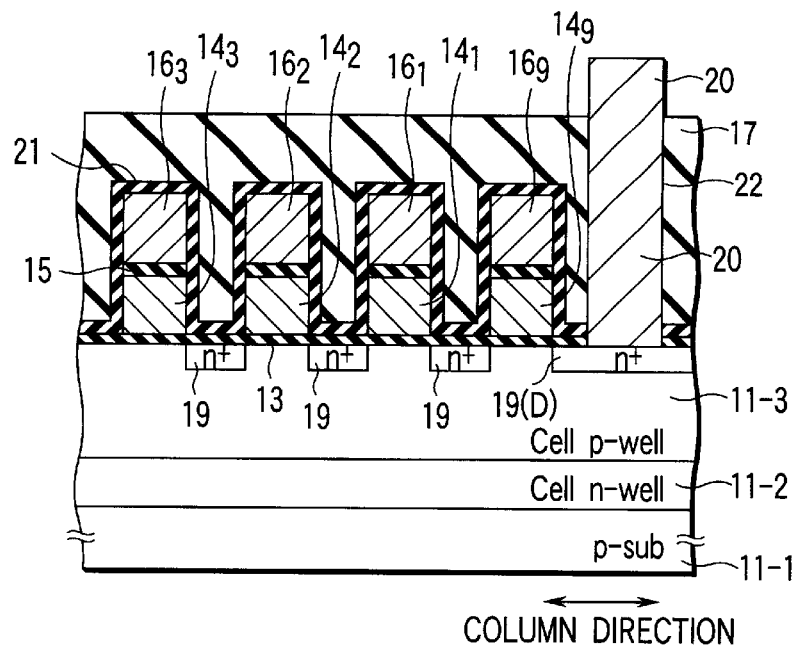
FIG. 57 is a cross-sectional view taken along the line LVII—LVII in FIG. 56.
Figure 58:
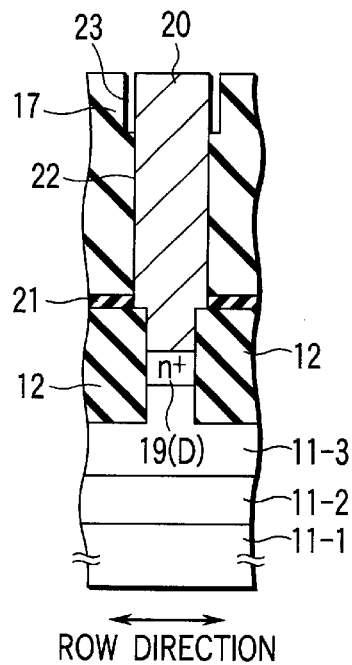
FIG. 58 is a cross-sectional view taken along the line LVIII—LVIII in FIG. 56.

Next, as illustrated in FIGS. 56 through 58, a wiring groove 23 is formed in the silicon oxide film 17, for example, using methods such as PEP, RIE and the like. The wiring groove 23 is formed such that it overlaps the contact hole 22 and extends in the column direction. The depth of the wiring groove 23 can be readily controlled by controlling the etching time for the silicon oxide film 17.

As a result of etching the silicon oxide film 17, the upper surface and side surfaces of the contact plug 20 (side surfaces of a top portion of the contact plug 20) are exposed to the wiring groove 23. In other words, the top portion of the contact plug 20 protrudes into the wiring groove 23.

Figure 59:
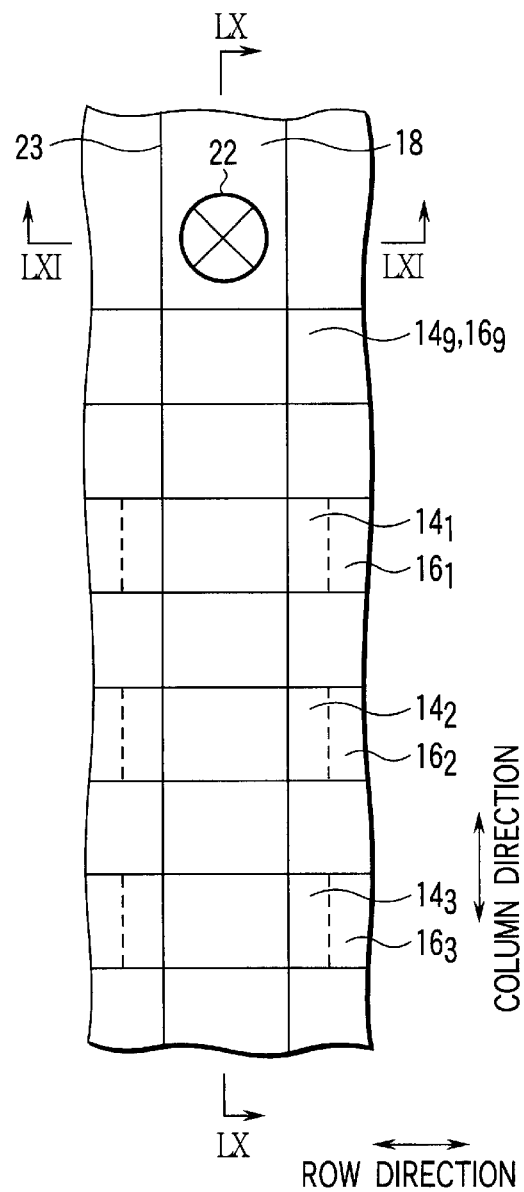
FIG. 59 is a top plan view illustrating a step in the method of manufacturing the contact structure in FIGS. 47 through 49.
Figure 60:
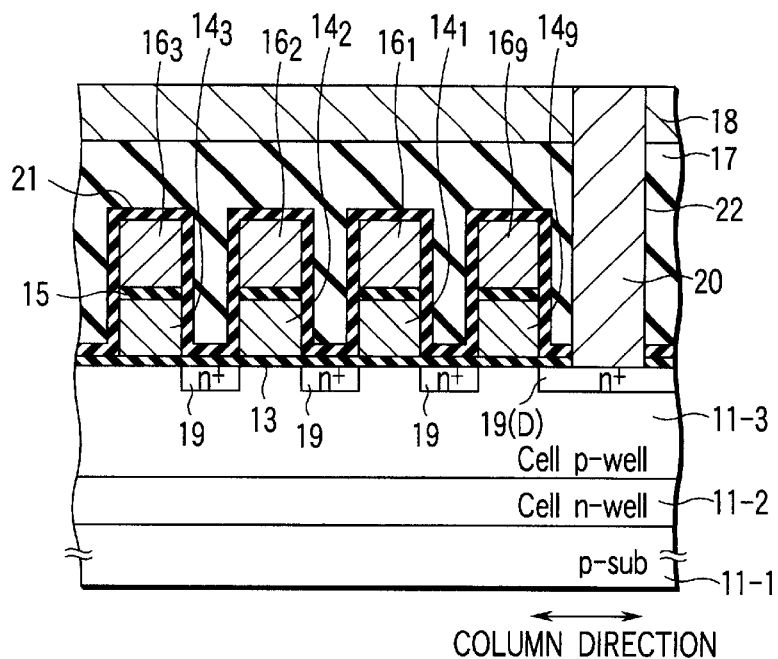
FIG. 60 is a cross-sectional view taken along the line LX—LX in FIG. 59.
Figure 61:
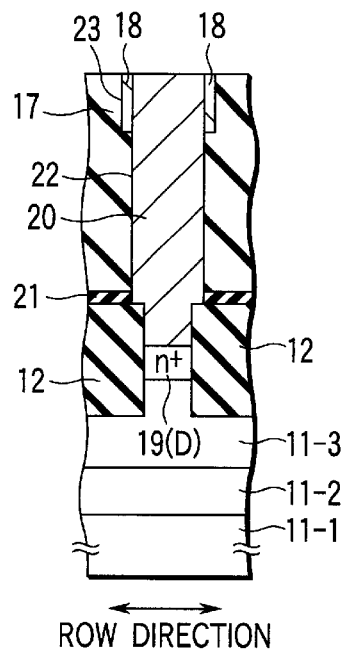
FIG. 61 is a cross-sectional view taken along the line LXI—LXI in FIG. 59.

Next, as illustrated in FIGS. 59 through 61, a conductive film (for example, a metal film or the like) is formed on the silicon oxide film 17, for example, using a method such as a CVD, sputtering or the like. In the alternative, when a CMP method or an etching method such as CDE, RIE or the like is used to leave the conductive film in the wiring groove 23, a bit line 18 is formed.

In the device structure completed by the foregoing steps, the contact plug 20 extends through the bit line 18, and the upper surface of the contact plug 20 is substantially coplanar with the upper surface of the bit line 18 and the upper surface of the silicon oxide film 17.

1.-2.-3. Effects

According to the semiconductor device and the method of manufacturing the same in the first invention of the present application, it is possible to provide a highly reliable non-volatile semiconductor memory even if the contact holes are miniaturized and the aspect ratio thereof is larger to the accompaniment with the miniaturization and higher integration of the memory cells.

Figure 62:
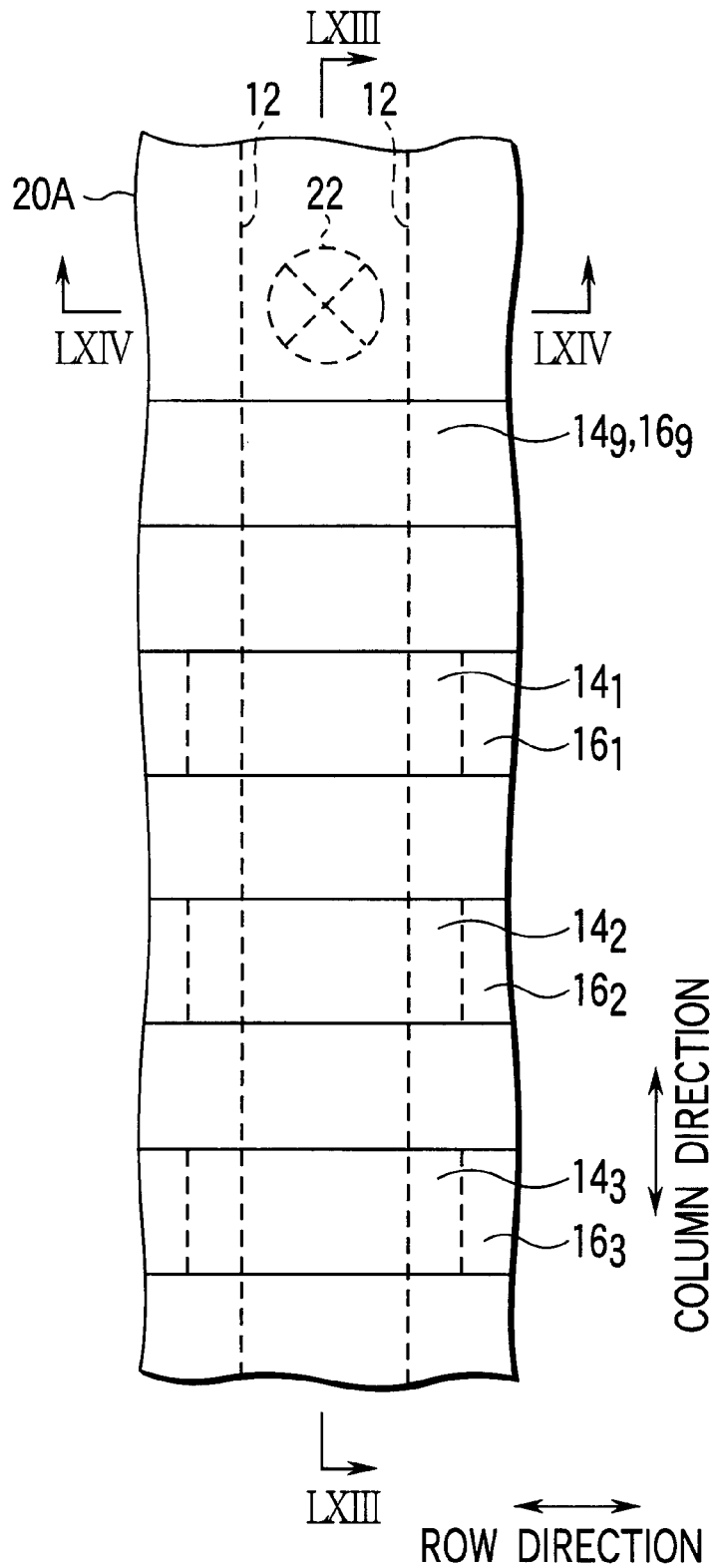
FIG. 62 is a top plan view showing an advantage of the manufacturing method in FIGS. 50 through 61.
Figure 63:
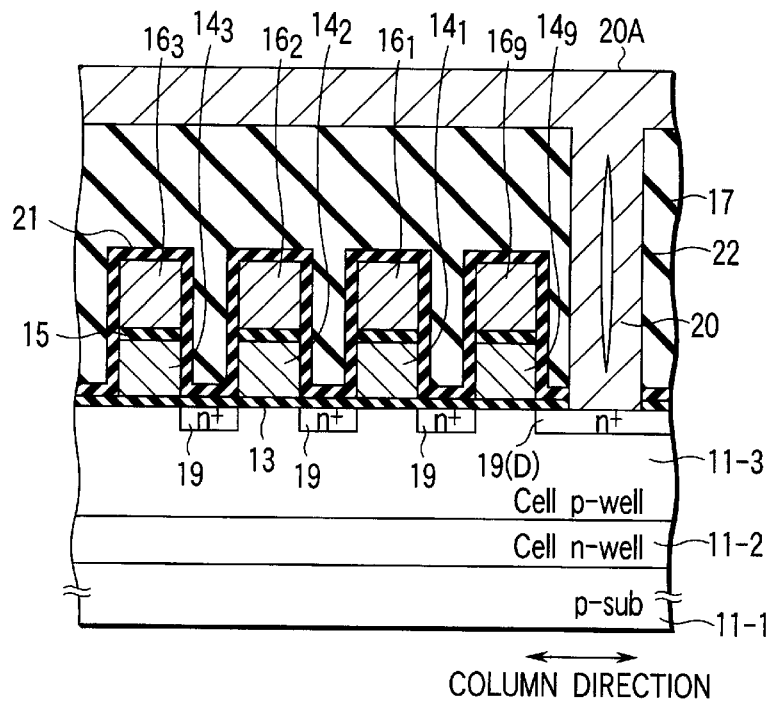
FIG. 63 is a cross-sectional view taken along the line LXIII—LXIII in FIG. 62.
Figure 64:
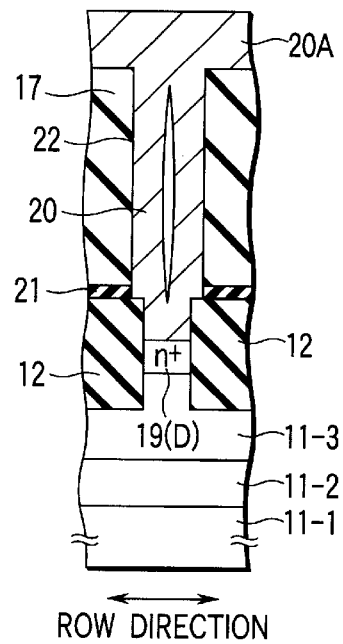
FIG. 64 is a cross-sectional view taken along the line LXIV—LXIV in FIG. 62.

Specifically, as illustrated in FIGS. 62 through 64, even if a seam occurs in a contact hole, the seam will not be exposed while the conductive film 20A is etched back, for example, by an etching method such as CDE, RIE or the like, so that the seam will not be spread due to the etching.

Figure 65:
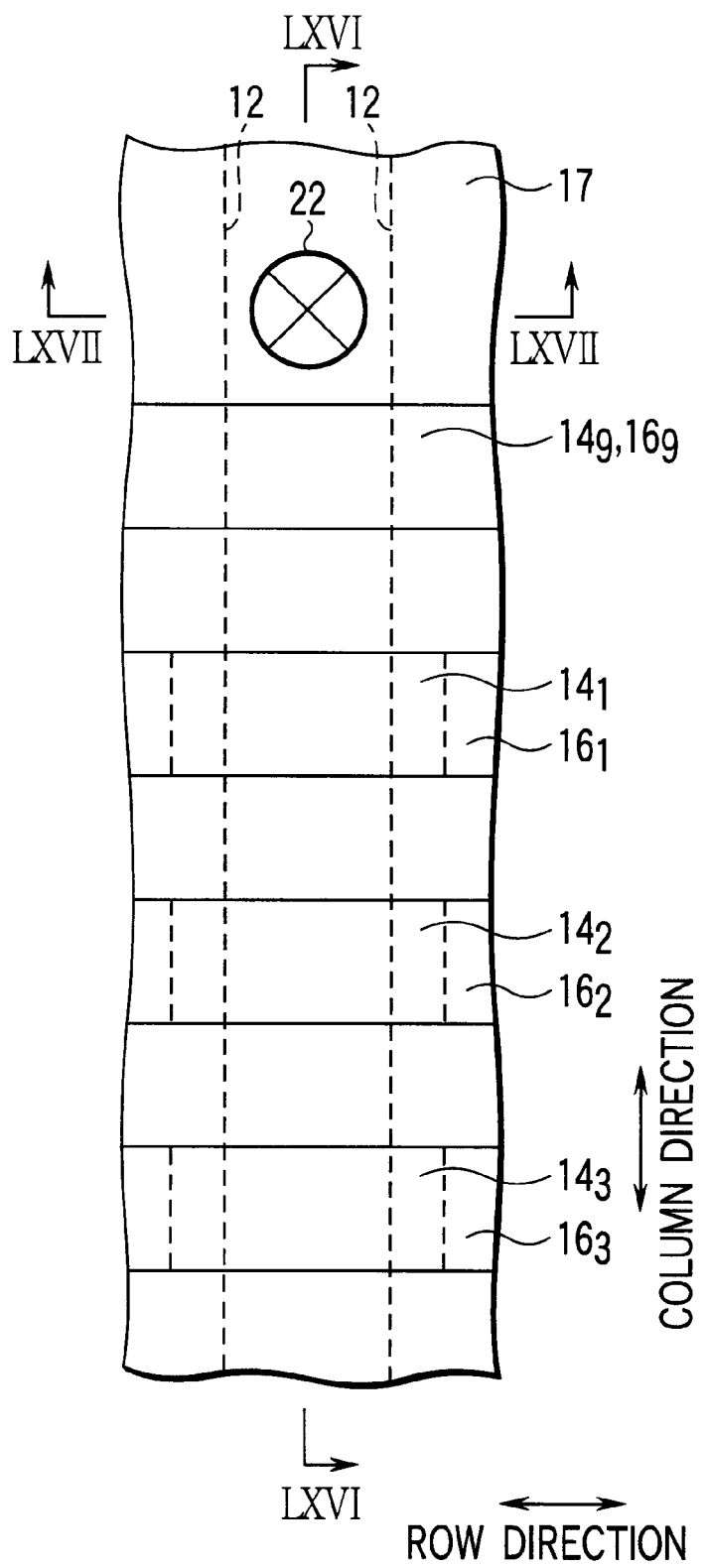
FIG. 65 is a top plan view showing an advantage of the manufacturing method in FIGS. 50 through 61.
Figure 66:
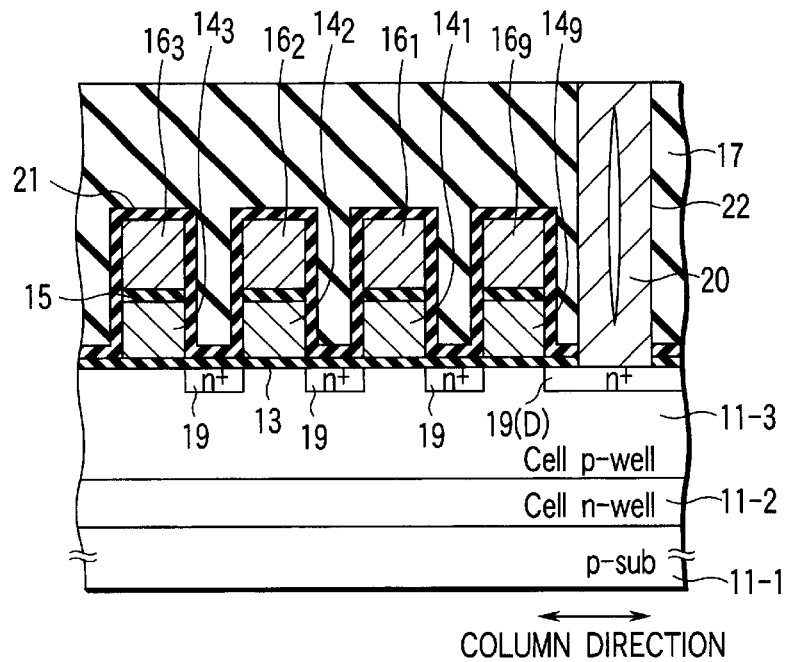
FIG. 66 is a cross-sectional view taken along the line LXVI—LXVI in FIG. 65.
Figure 67:
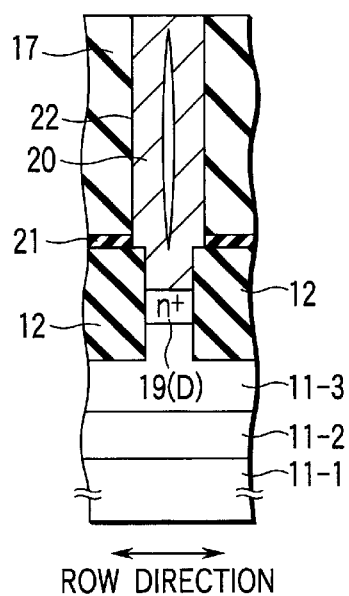
FIG. 67 is a cross-sectional view taken along the line LXVII—LXVII in FIG. 65.

More specifically, as illustrated in FIGS. 65 through 67, since the seam, even if occurring in the contact plug 20, always appears at a level lower than the upper surface of the bit line 18 or the upper surface of the silicon oxide film 17, the seam will not be exposed or spread only if the upper surface of the contact plug 20 is positioned substantially coplanar with the upper surface of the bit line 18 or the upper surface of the silicon oxide film 17.

Consequently, all contact plugs are made normal, thereby eliminating variations in contact resistance between the contact plugs and variations in the operation timing of the memory, thus making it possible to provide a highly reliable non-volatile semiconductor memory.

1.-3. Others

While the foregoing description has been made on the contact plug structure in the bit line contact section and the method of manufacturing the same, it goes without saying that the first invention of the present application can be applied to all contact plug structures including the contact plug structure in the bit line contact section.

Specifically, the first invention of the present application can be applied to contact plug structures in all contact sections (a bit line contact section, a source line contact section and the like) which are miniaturized, have a high aspect ratio, and are susceptible to a seam.

Also, the first invention of the present application can be applied to semiconductor memories such as DRAM, SRAM and the like other than non-volatile semiconductor memories including a NAND cell type flash memory as described above. The first invention of the present application can further be applied to memory mixed logic LSIs which are equipped with logics and memories, other than general-purpose memories.

The first invention of the present application can still further be applied to any device which has a contact structure with contact plugs, miniaturized contact holes, and a high aspect ratio, other than semiconductor memories.

2. Second Invention

A second invention of the present application will be described.

2.-1. Related Art

Prior to describing a semiconductor device according to the second invention of the present application, description will be made on techniques which are the premise for this invention.

2.-1.-1. Types of Contact Sections

FIG. 68 is a diagram for explaining types of contact sections which may be provided on a substrate.

A memory cell array section in a p-type silicon substrate 11-1 is formed with an n-type well region (Cell n-well) 11-2 and a p-type well region (Cell p-well) 11-3, and a peripheral circuit section of the p-type silicon substrate 11-1 is formed with an n-type well region 11-3 and a p-type well region 11-5.

Memory cells and select transistors forming part of an NAND cell unit are formed in the p-type well region 11-3. A low voltage type p-channel MOS transistor applied with a low voltage is formed in the n-type well region 11-4. A low voltage type n-channel MOS transistor is formed in the p-type well region 11-5. Also, a high voltage type n-channel MOS transistor applied with a high voltage is formed in the p-type silicon substrate 11-1.

Contact sections possibly provided on a substrate may be classified, for example, into the following four types:

(a) a contact section which overlaps an element isolation area;
(b) a contact section which does not overlap an element isolation area;
(c) a contact section for a second gate electrode; and
(d) a contact section for a first gate electrode.

First, the contact section which overlaps an element isolation area includes a bit line contact section (Drain1) for connecting a bit line with a diffusion layer, a source line contact section (Source1) for connecting a source line with the diffusion layer, and the like.

Next, the contact section which does not overlap an element isolation area includes contact sections (Drain, Source) for a diffusion layer of a MOS transistor in the peripheral circuit section, a contact section (Well) for a well region, and the like.

Next, the contact section for a second gate electrode includes a contact section (Control Gate) for a word line (control gate line).

Finally, the contact section for a first gate electrode includes a contact section (Select Gate) for a gate of a select transistor (a first layer polysilicon), a contact section (Gate) for a gate of a MOS transistor in the peripheral circuit section.

As described above, a variety of contact sections are provided on a silicon substrate.

It should be noted that in addition to the aforementioned contact sections, there are other contact sections such as a contact section between wires, for example, existing on the silicon substrate. However, the second invention of the present application is directed to a contact section for the silicon substrate (including wells) or MOS transistors (including memory cells and select transistors), as described later.

2.-1.-2. Contact Structure

Next, the aforementioned four types of contact sections will be described in terms of the structure.

Figure 69:
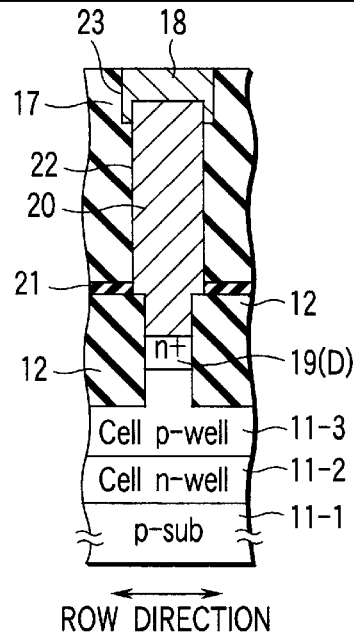
FIG. 69 is a diagram for explaining a contact structure which is the premise for the second invention of the present application.

FIG. 69 illustrates a contact structure of a contact section which overlaps an element isolation area.

In this example, a bit line contact section will be described.

A contact hole 22 is formed extending over an element isolation oxide film (element isolation area) 12. The contact hole 22 is formed in a top portion thereof with a wiring groove 23 which overlaps the contact hole 22.

A contact plug 20 made of a polysilicon film doped with impurities (doped-Polysi) is buried in the contact hole 22. Also, a bit line 18 made of a metal film, for example, is buried in the wiring groove 23.

The contact plug 20 has, for example, a structure in which a top portion of the contact plug 20 protrudes into the wiring groove 23. Also, an upper surface of the contact plug 20 exists between an upper surface and a lower surface of the bit line 18. However, as is the case of the aforementioned first invention, the upper surface of the contact plug 20 may be coplanar with the upper surface of the bit line 18, as a matter of course.

In the structure described above, an important aspect lies in that as a contact section for a substrate which overlaps the element isolation area (a bit line contact section, a source line contact section, and the like), the contact plug 20 made of a polysilicon film doped with impurities is buried in the contact hole 22.

The contact plug 20 is buried in the contact hole 22 in the contact section for the substrate which overlaps the element isolation area for the following reasons.

First, as described above, the contact hole 22 is formed intruding into the element isolation oxide film (element isolation area) 12 for a reduction in the size of a chip, and the like. In other words, the contact hole 22 is formed in self alignment with an element area surrounded by the element isolation oxide film 12.

Here, a process employed for forming the contact hole 22 generally involves etching a silicon oxide film 17 with a stopper film 21 used as a stopper, followed by removal of the stopper film 21 alone.

However, while the silicon oxide film 17 is being etched, a portion of the stopper film 21 may be removed for some cause. In such a case, when the silicon oxide film 17 is etched, the element isolation oxide film (generally, made of a silicon oxide film) 12 is simultaneously etched, resulting in the formation of a small groove which may reach the p-type well region 11-3.

Figure 73:
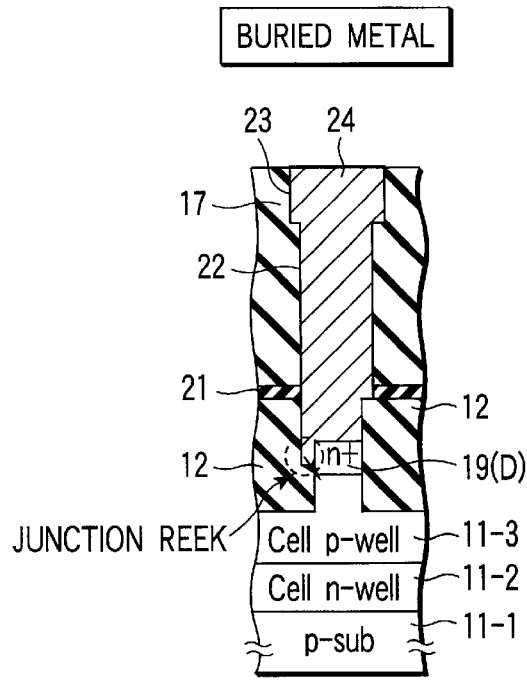
FIG. 73 is a diagram showing a problem in the contact structure which is the premise for the second invention of the present application.

In such a situation, if the same material, i.e., a metal film 24 is buried in the contact hole 22 and the wiring groove 23 as illustrated in FIG. 73, this metal film 24 comes into contact with an $n^+$ diffusion layer 19(D) and also into direct contact with the p-type well region 11-3. Thus, the metal film 24 is short-circuited with the p-type well region 11-3, causing a junction leak current to flow between the metal film 24 and the p-type well region 11-3 to hamper a normal operation of the memory.

Also, when the element isolation oxide film 12 is formed with a small groove, a junction leak current may flow therethrough even if the groove does not reach the p-type well region 11-3. Specifically, when a refractory metal film, for example, is used as the metal film 24, a barrier metal (Ti/TiN or the like) is generally formed immediately below the metal film 24 for preventing a reaction of the refractory metal film with silicon.

However, it is difficult to attach the barrier metal to the small groove formed in the element isolation oxide film 12, with the result that the metal film 24 may be in direct contact with the $n^+$-type diffusion layer 19(D). In this case, the metal film 24 reacts with silicon in the $n^+$-type diffusion layer 19(D) to cause formation of alloy spike in the $n^+$-type diffusion layer 19(D) and a junction leak current flowing between the metal film 24 and the p-type well region 11-3.

Figure 74:
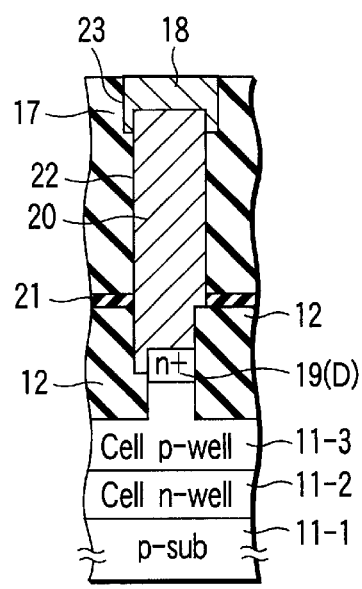
FIG. 74 is a diagram showing a problem in the contact structure which is the premise for the second invention of the present application.

On the other hand, when the contact plug 20 made of a polysilicon film doped with n-type impurities is buried in the contact hole 22 and the bit line (metal film) 18 is buried in the wiring groove 23 as illustrated in FIG. 74, even if the element isolation oxide film 12 is etched, it is the polysilicon film that intrudes into the small groove formed in the element isolation oxide film 12. Since no chemical reaction occurs between the metal film 24 and the $n^+$-type diffusion layer 19(D) as mentioned above, the bit line 18 ad the p-type well region 11-3 are free from short-circuiting therebetween. Consequently, no junction leak current will flow between the bit line 18 and the p-type well region 11-3.

For the reason described above, in the contact section which overlaps the element isolation area (a bit line contact section, a source line contact section and the like), the contact plug 20 made of a polysilicon film doped with impurities is generally buried in the contact hole 22.

Figure 70:
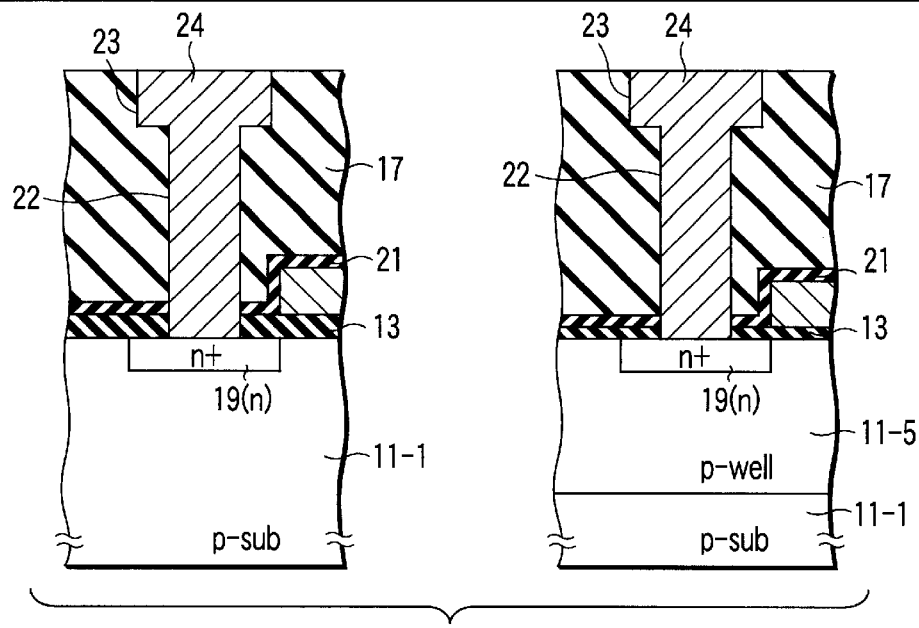
FIG. 70 is a diagram for explaining the contact structure which is the premise for the second invention of the present application.

FIG. 70 illustrates a contact structure of a contact section which does not overlap an element isolation area.

Specifically, FIG. 70 illustrates a contact section for a diffusion layer of an MOS transistor in the peripheral circuit section.

The contact section which does not overlap the element isolation area has a contact structure in which the same material, i.e., a metal film 24 is buried in a contact hole 22 and a wiring groove 23.

Thus, the contact section which does not overlap the element isolation area is free from a problem of the leak caused by a small groove formed in the element isolation oxide film as mentioned above, so that it is not necessary to bury a contact plug made of a polysilicon film in the contact hole 22 (no problem would arise, however, if such a contact plug is buried in the contact hole 22).

Therefore, the same material, i.e., the metal film 24 is buried in the contact hole 22 and the wiring groove 23. When the metal film 24 is made of a metal such as a refractory metal film which tends to react with silicon, a barrier metal is formed immediately below the metal film 24, as a matter of course.

Figure 71:
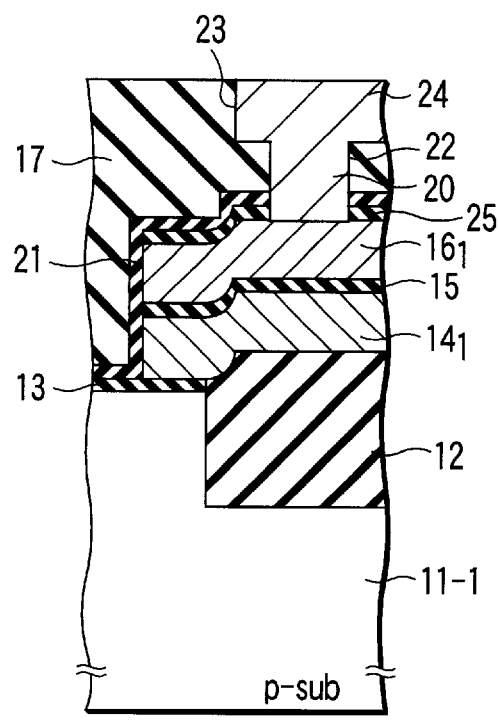
FIG. 71 is a diagram for explaining the contact structure which is the premise for the second invention of the present application.

FIG. 71 illustrates a contact structure of a contact section for a second gate electrode.

The second gate electrode refers to a control gate electrode (word line) of a memory cell having a stacked gate structure, in which case the contact section is provided, for example, at an end of a word line.

The contact section for the second gate electrode has a contact structure in which the same material, i.e., a metal film 24 is buried in a contact hole 22 and a wiring groove 23. In addition, a barrier metal may be formed immediately below the metal film 24 as is the case of the aforementioned contact section for the substrate.

Figure 72:
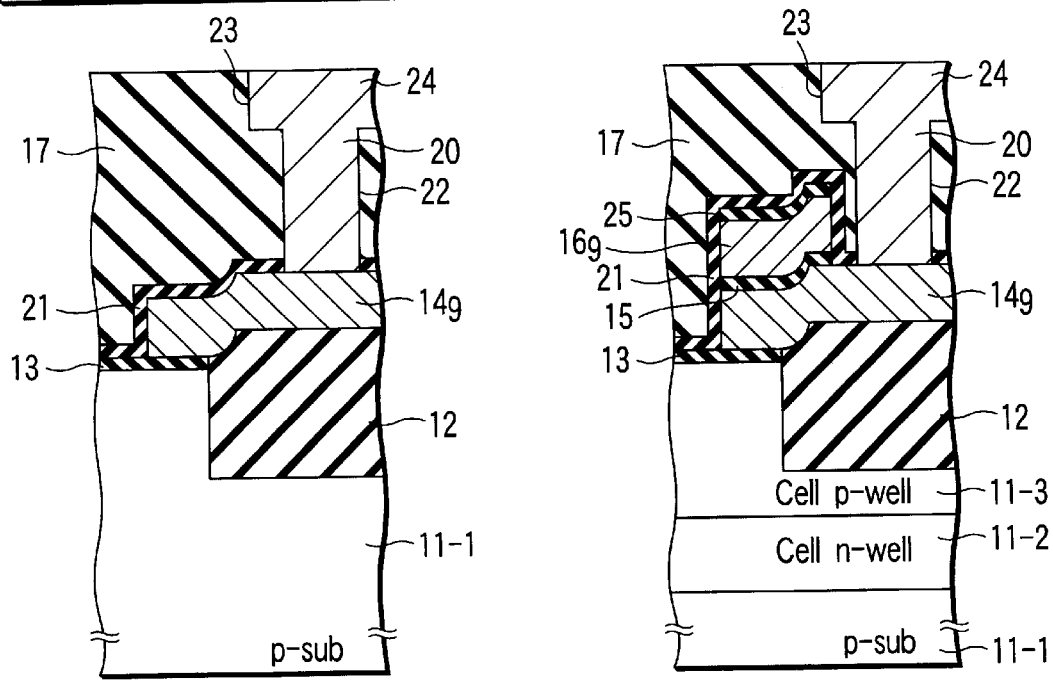
FIG. 72 is a diagram for explaining the contact structure which is the premise for the second invention of the present application.

FIG. 72 illustrates a contact structure of a contact section for a first gate electrode.

The first gate electrode refers to a gate electrode made of a first polysilicon layer (the polysilicon layer closest to the substrate) and includes a gate electrode of a select transistor, a gate electrode of an MOS transistor in the peripheral circuit section, and the like.

The contact section for the first gate electrode has a contact structure in which the same material, i.e., a metal film 24 is buried in a contact hole 22 and a wiring groove 23. In addition, a barrier metal may be formed immediately below the metal film 24 as is the case of the aforementioned contact section for the substrate.

2.-1.-3. Manufacturing Method

Described next is a method of manufacturing a variety of contact sections as illustrated in FIGS. 69 through 72.

1st Step

Figure 75:
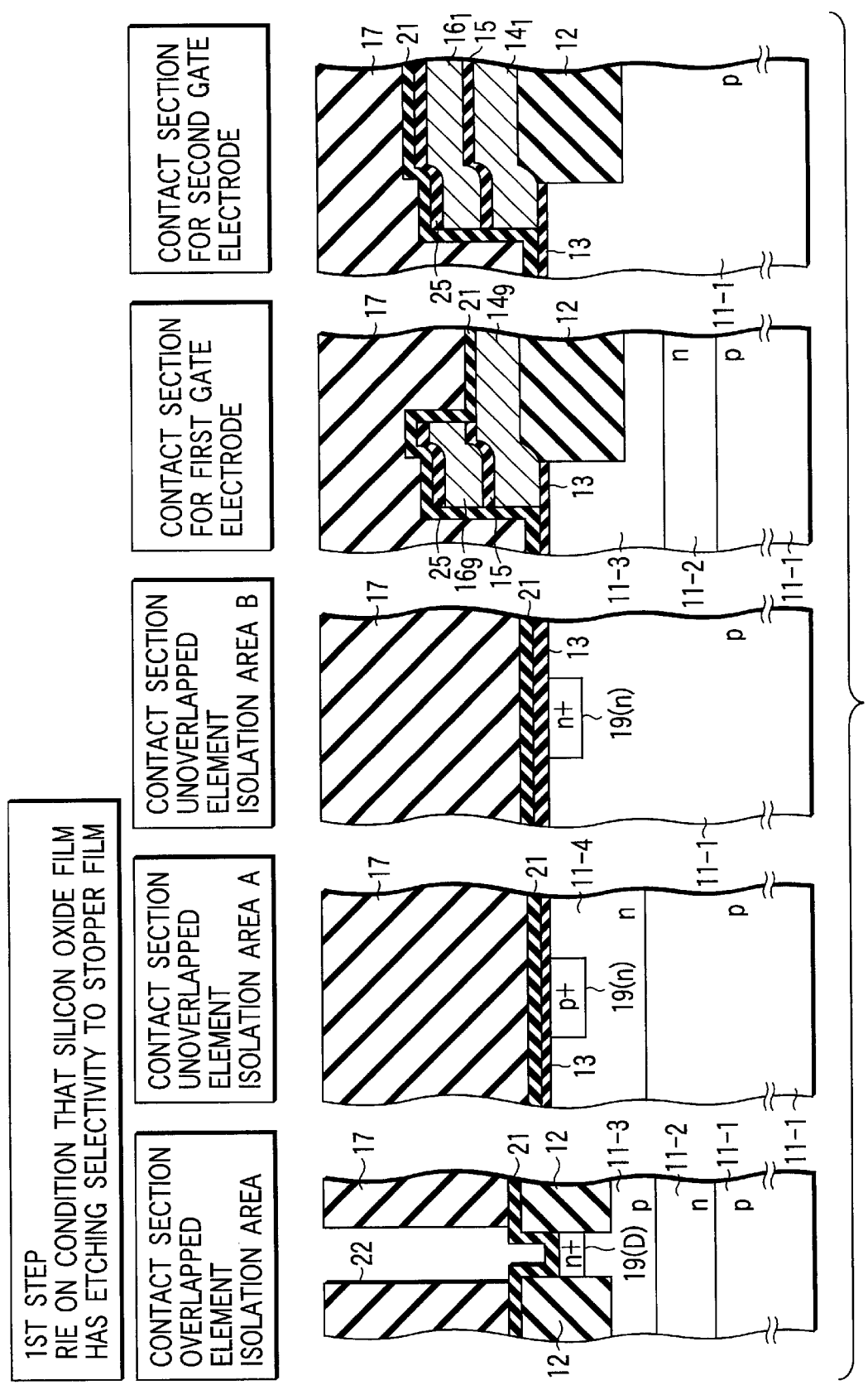
FIG. 75 is a diagram illustrating a step in a method of manufacturing the contact structure in FIGS. 69 through 72.

In this step, as illustrated in FIG. 75, the silicon oxide film 17 is etched by RIE using a mask which is a resist film (not shown) having an opening on a contact section overlapping an element isolation area (a bit line contact section, a source line contact section or the like).

Here, for preventing the element isolation oxide film 12 from being etched, the silicon oxide film 17 is etched by RIE on condition that the silicon oxide film has an etching selectivity to the stopper film 21. In the etching of this step, therefore, the stopper film 21 functions as an etching stopper, so that the bottom of the contact hole 22 does not reach the element isolation oxide film 12 or the $n^+$-type diffusion layer 19(D).

2nd Step

Figure 76:
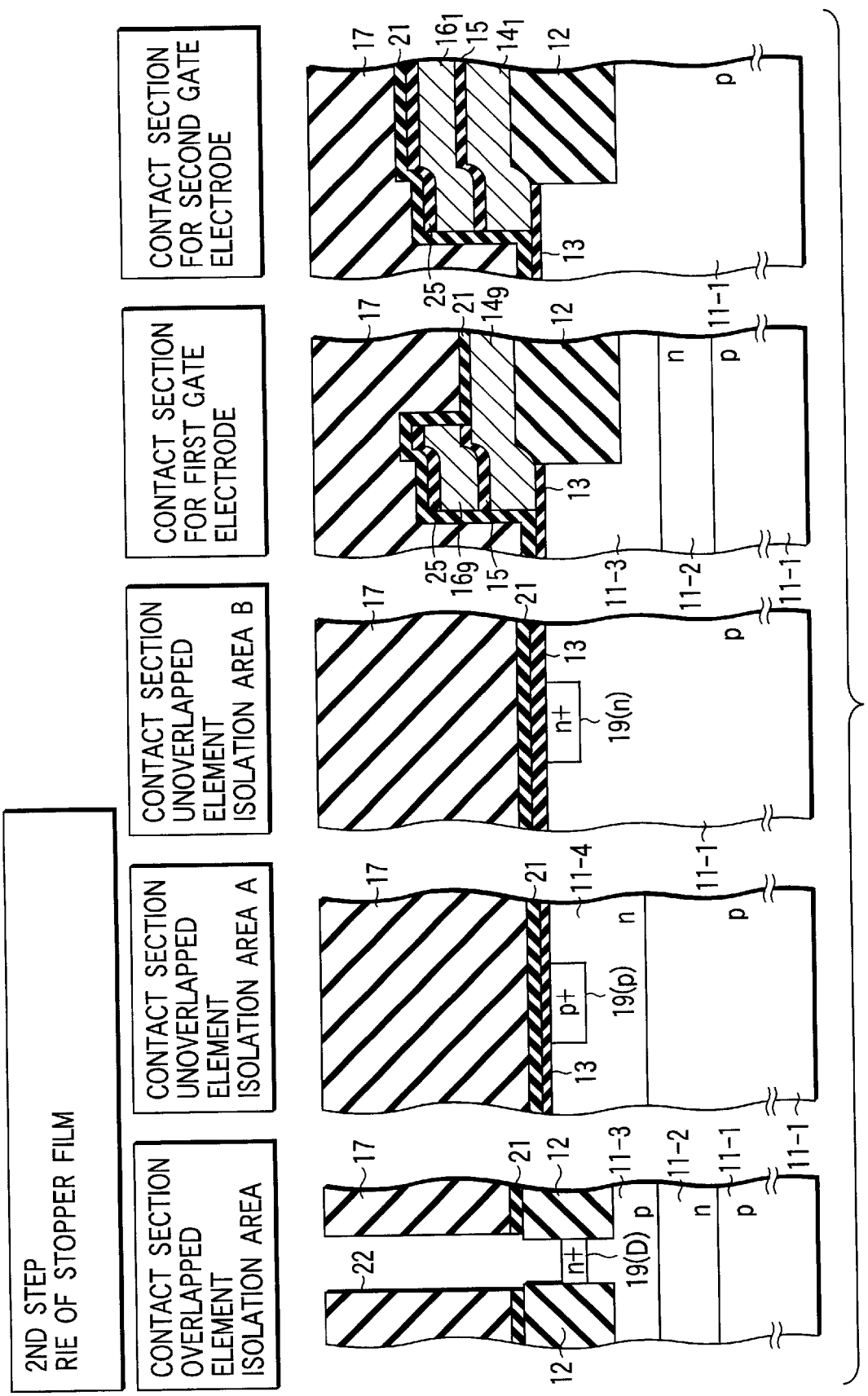
FIG. 76 is a diagram illustrating a step in a method of manufacturing the contact structure in FIGS. 69 through 72.

In this step, as illustrated in FIG. 76, the stopper film 21 present in the contact hole 22 of the contact section overlapping the element isolation area (a bit line contact section, a source line contact section or the like) is etched by an etching method such as RIE, CDE or the like, subsequent to the first step.

Here, the stopper film 21 is etched on condition that the stopper film 21 has an etching selectivity to the element isolation oxide film (silicon oxide film) 12 and the $n^+$-type diffusion layer 19(D). Therefore, upon completion of this step, the bottom of the contact hole 22 reaches the element isolation oxide film 12 and the $n^+$-type diffusion layer 19(D).

3rd Step

Figure 77:
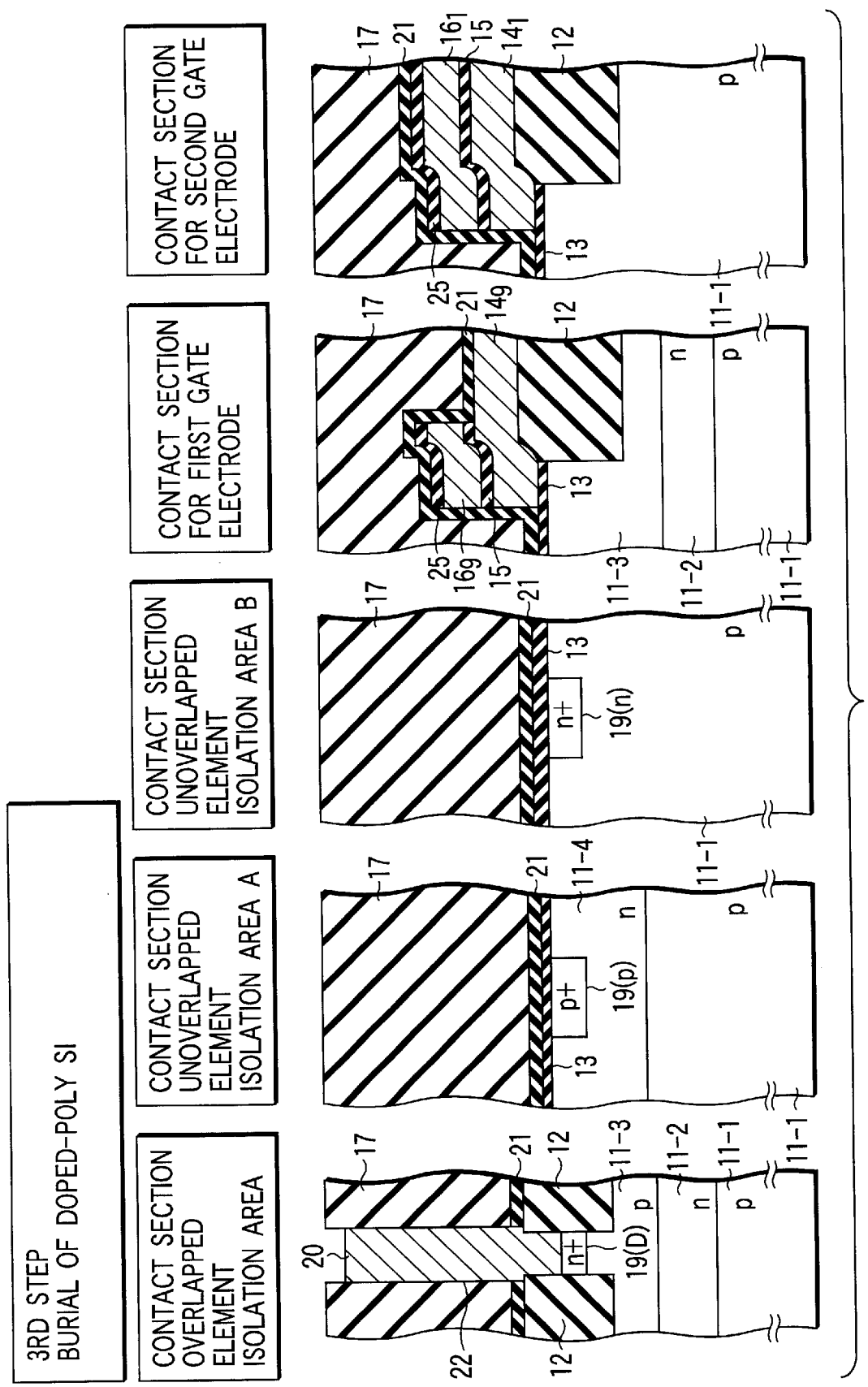
FIG. 77 is a diagram illustrating a step in a method of manufacturing the contact structure in FIGS. 69 through 72.

In this step, as illustrated in FIG. 77, a polysilicon film doped with impurities is buried in the contact hole 22 of the contact section overlapping the element isolation area (a bit line contact section, a source line contact section or the like) to form the contact plug 20.

Here, the structure of the contact plug 20 may be such that the upper surface thereof is lower than the upper surface of the silicon oxide film 17 as illustrated in FIG. 77, or the upper surface thereof is substantially coplanar with the upper surface of the silicon oxide film 17.

4th Step

In this step, as illustrated in FIG. 78, the silicon oxide films 17, 25 and the stopper film 21 are etched by RIE using a mask which is a resist film (not shown) having openings on all contact sections other than the contact section that overlaps the element isolation area.

Here, the silicon oxide film 17 is etched by RIE on condition that the silicon oxide film 17 has no etching selectivity to the stopper film 21. In other words, the stopper 21 does not function as an etching stopper in the etching of this step, so that the silicon oxide films 17, 25 and the stopper film 21 are etched, respectively, at one time. As a result, the bottom of the contact hole 22 in each contact section reaches the control gate electrode 161, select gate electrode 149, $n^+$-diffusion layer 19($n$) and $p^+$-type diffusion layer 19($p$).

It should be noted that even if the etching is performed under the RIE condition as mentioned above, the contact hole 22 does not extend over the element isolation oxide film 12 in these contact sections, so that the element isolation oxide film 12 will not be etched.

5th Step

Figure 79:
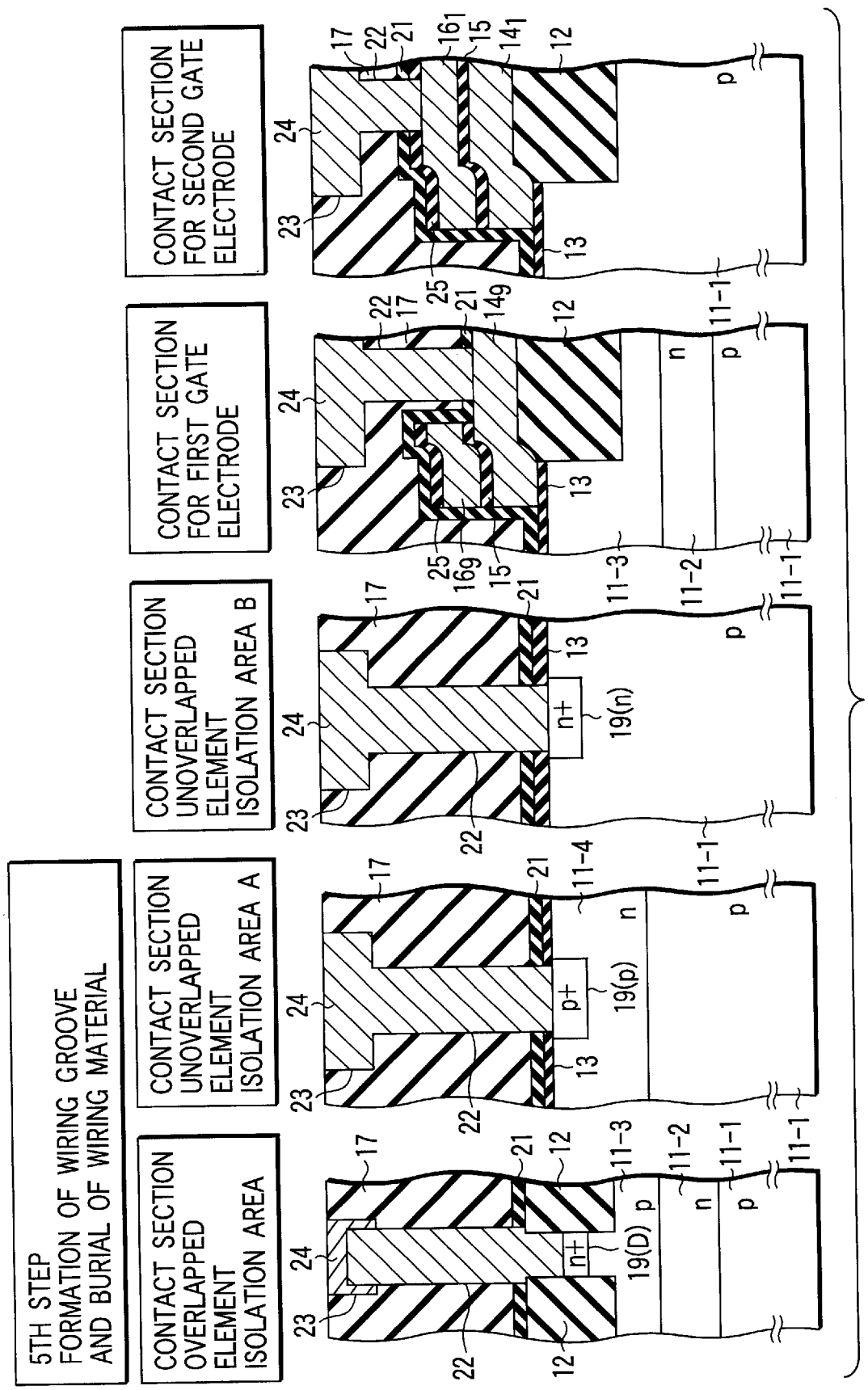
FIG. 79 is a diagram illustrating a step in a method of manufacturing the contact structure in FIGS. 69 through 72.
Figure 80:
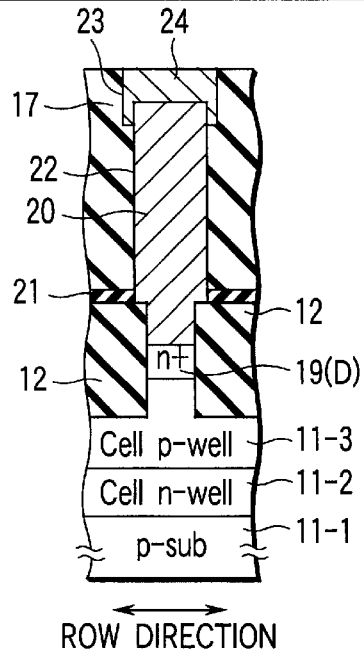
FIG. 80 is a diagram for explaining a contact structure according to the second invention of the present application.
Figure 81:
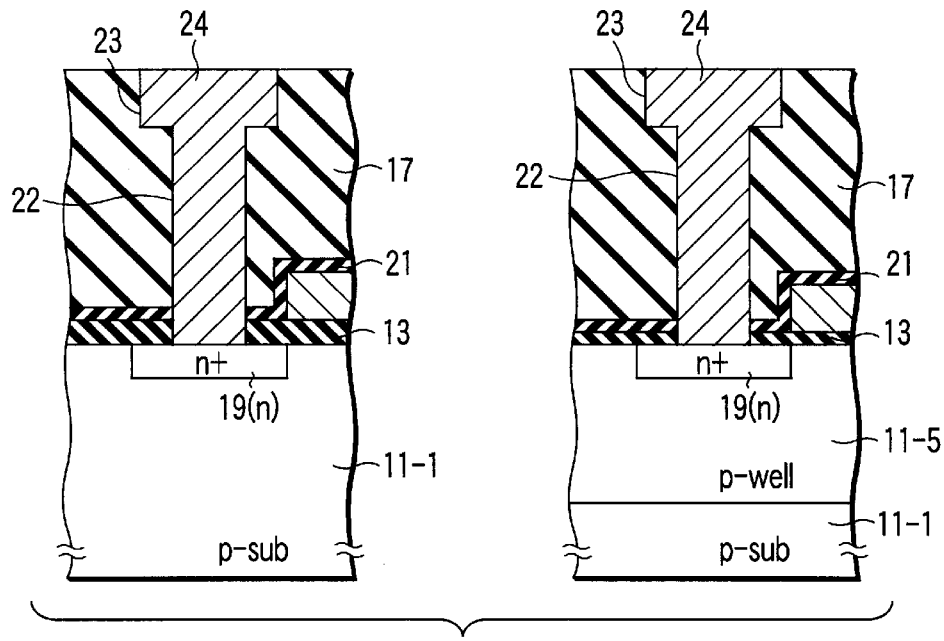
FIG. 81 is a diagram for explaining the contact structure according to the second invention of the present application.
Figure 82:
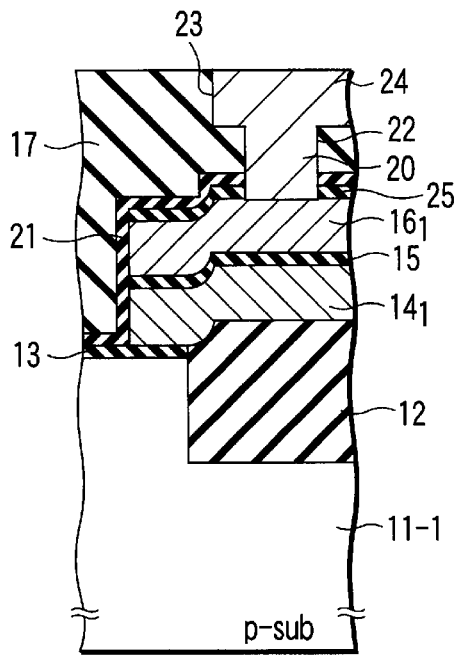
FIG. 82 is a diagram for explaining the contact structure according to the second invention of the present application.
Figure 83:
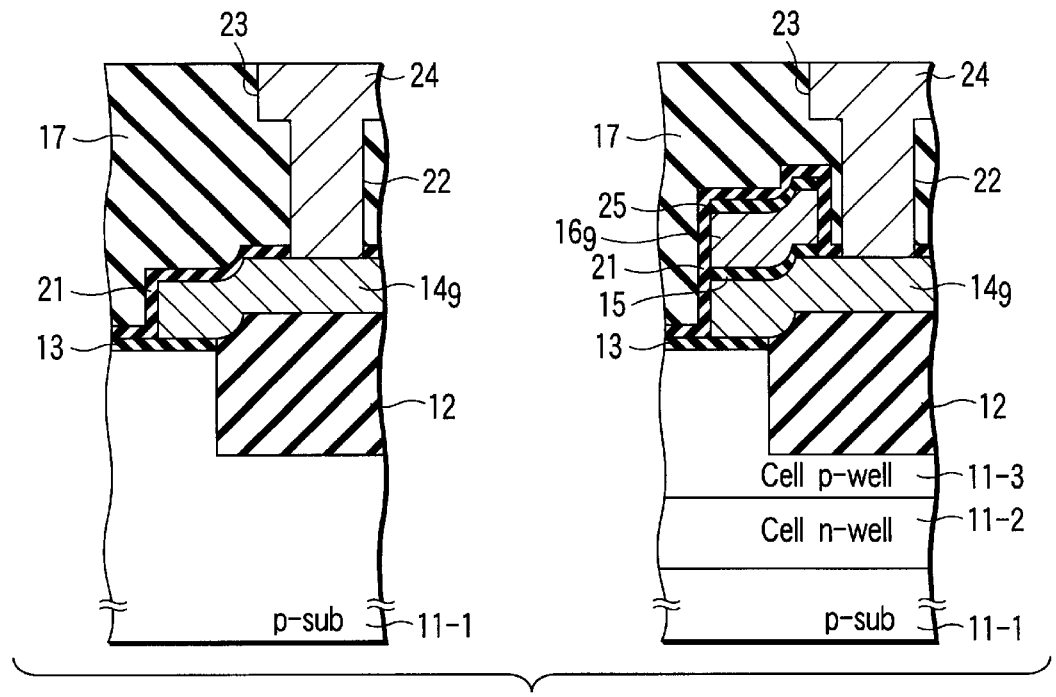
FIG. 83 is a diagram for explaining the contact structure according to the second invention of the present application.

At this step, as illustrated in FIG. 79, after forming wiring grooves 23 in all contact sections, a wiring, i.e., a metal film 24 is buried in each of the wiring grooves 23. Before burying the metal film 24, a barrier metal may be formed. The metal film may be buried in the wiring groove 23, for example, by a CMP method or by an etching method such as RIE, CDE or the like.

2.-1.-4. Problem

As illustrated in FIG. 69, in the contact section which overlaps the element isolation area (a bit line contact section, a source line contact section and the like), the contact hole 22 is formed therein with the contact plug 20 made of a polysilicon film doped with impurities. Also, as illustrated in FIGS. 70 through 72, in other contact sections, the same material, i.e., the metal film 24 is simultaneously buried in the contact hole 22 and the wiring groove 23 (dual damascene process).

In this case, as previously shown in the description of the manufacturing method, the formation of the contact hole 22 in any contact section requires two PEP (Photo Engraving Process) processes and three etching (RIE) processes. Specifically, since the contact structure of the contact section for the substrate overlapping the element isolation area is different from the contact structure of the remaining contact sections, an increased number of steps is required in the manufacturing process, causing a higher cost.

2.-2. Embodiments

Next, a semiconductor device and a method of manufacturing the same according to the second invention of the present application for solving the aforementioned problem will be described below in detail.

2.-2.-1. Contact Plug Structure

The semiconductor device according to the second invention of the present application features that contact sections for a substrate (including wells) and contact sections for MOS transistors (including memory cells and select transistors) all have the same structure.

Specifically, in an embodiment illustrated in FIGS. 80 through 83, the same material, for example, a metal film 24 is buried in contact holes 22 and wiring grooves 23 in all of contact sections for a substrate and contact sections for MOS transistors. In addition, a barrier metal may be placed immediately below the metal film 24.

Figure 84:
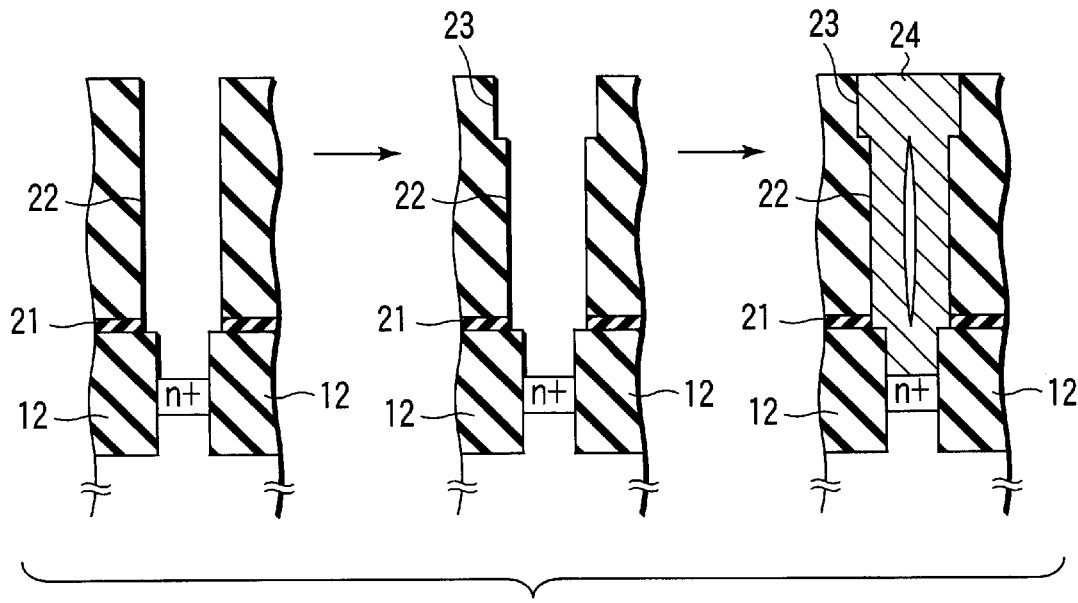
FIG. 84 is a diagram showing an advantage of the contact structure according to the second invention of the present application.

According to such a contact structure, first, as illustrated in FIG. 84, even if a seam occurs in the contact section, this seam will not be exposed on the surface of the metal film 24 when the metal film 24 is etched back, thereby eliminating a degraded reliability due to the spread seam.

Second, since no contact plugs are provided, the step required for etching back the contact plugs is omitted, and all the contact sections can be simultaneously formed by the dual damascene process, the manufacturing process is simplified, thereby making it possible to contribute to a reduction in the cost (later described in detail).

Figure 85:
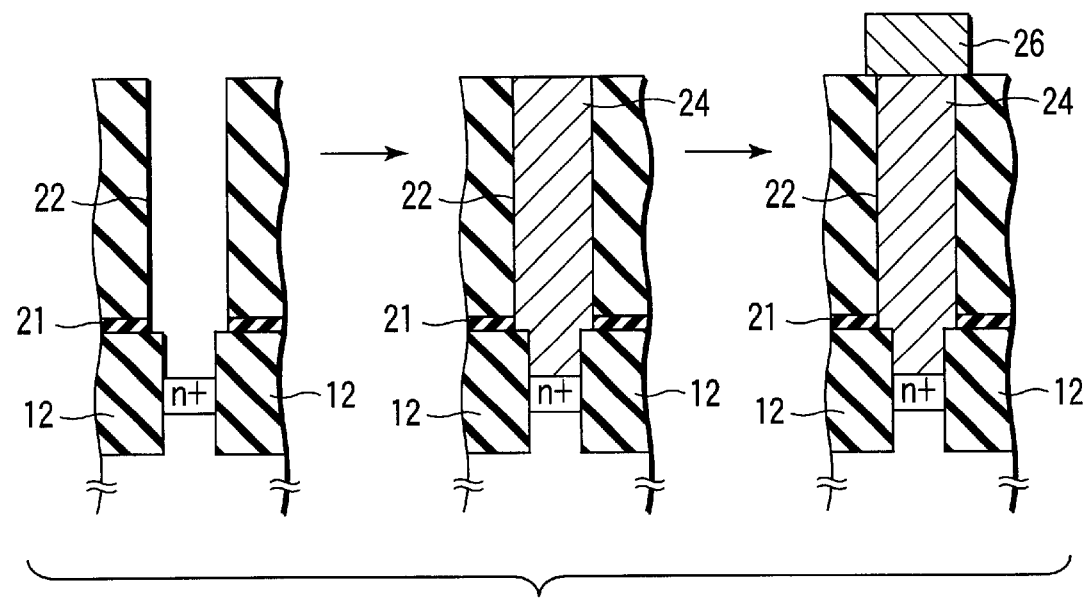
FIG. 85 is a diagram illustrating an exemplary modification to the contact structure according to the second invention of the present application.

Also, in an embodiment illustrated in FIG. 85, a contact plug made of a metal film 24 is buried in the contact hole 22, and a wiring 26 is formed on the contact plug. This contact plug may be formed, for example, by a damascene process. In this embodiment, all of contact portions for the substrate and contact portions for MOS transistors are also designed to have the same contact structure. In addition, a barrier metal may be placed immediately below the metal film 24.

In an embodiment illustrated in FIGS. 90 through 93, in all of contact sections for a substrate and contact sections for MOS transistors, the contact plug 20 made of a polysilicon film doped with impurities is buried in the contact hole 22, and the metal film 24 is buried in the wiring groove 23. While the contact plug 20 is in contact with the metal film 24 on its upper surface and side surfaces, the contact plug 20 may be in contact with the metal film 24 only on its side surfaces as an alternative.

In the contact structure as described above, even if a seam occurs in the contact section, this seam will not be exposed when the contact plug 20 is formed (etched back), thereby eliminating a degraded reliability due to the spread seam. Also, since all the contact sections can be simultaneously formed in the same steps, the manufacturing process is simplified, thereby making it possible to contribute to a reduction in the cost.

2.-2.-2. Manufacturing Method

Next described is a method of manufacturing a plurality of contact sections illustrated in FIGS. 80 through 83.

1st Step

Figure 86:
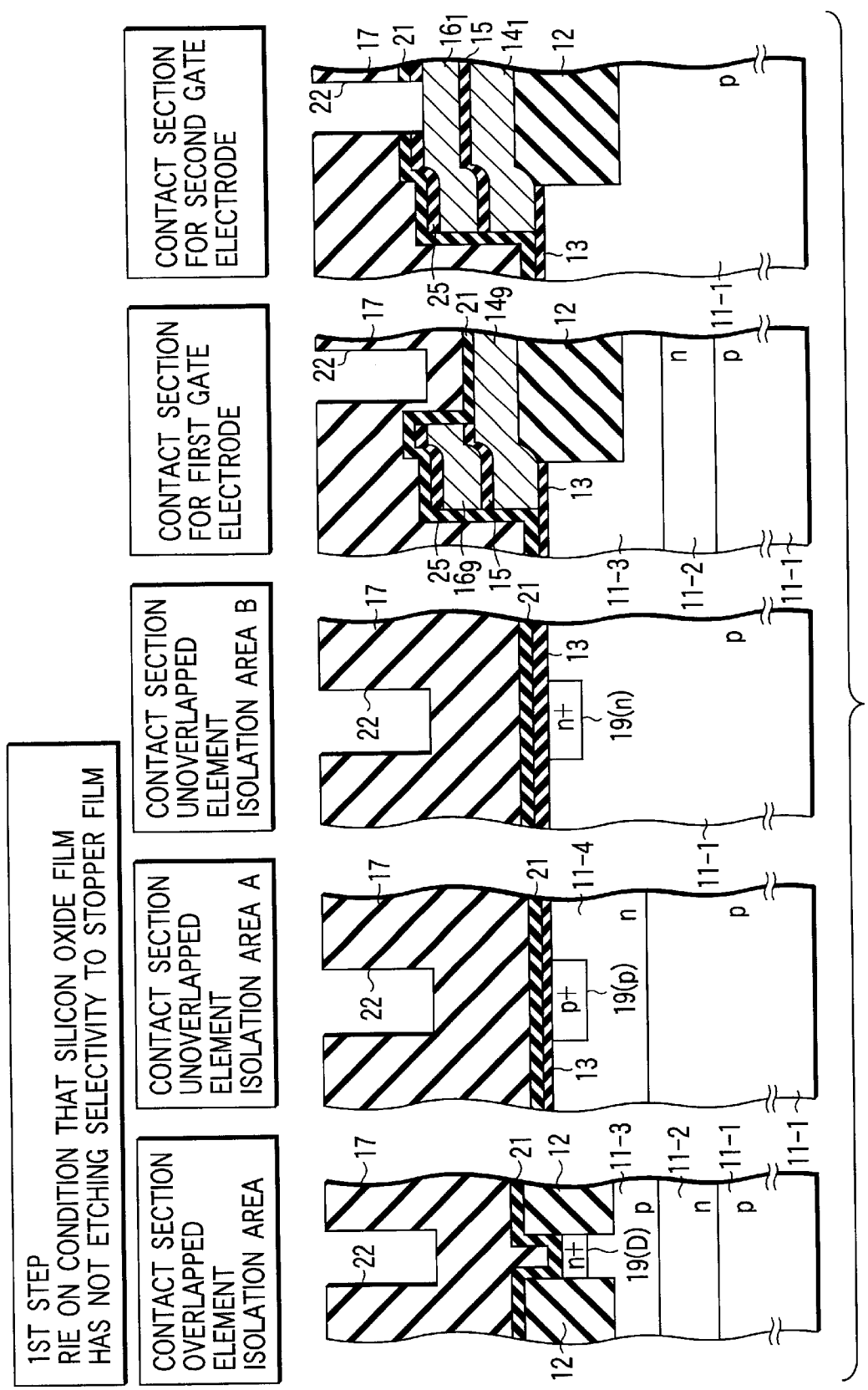
FIG. 86 is a diagram illustrating a step in a method of manufacturing the contact structure in FIGS. 80 through 83.

In this step, as illustrated in FIG. 86, the silicon oxide films 17, 25 and the stopper film (silicon nitride film) 21 are etched by RIE using a mask which is a resist film (not shown) having openings on all contact sections.

Here, the silicon oxide film 17 is etched by RIE on condition that the silicon oxide film 17 has no etching selectivity to the stopper film 21. In other words, the stopper 21 does not function as an etching stopper in the etching of this step, so that the silicon oxide films 17, 25 and the stopper film 21 are etched, respectively.

At this step, however, an etching time is controlled such that the bottom of the contact hole 22 reaches a control gate electrode 161 only in a contact section for a second gate electrode. Also, in contact sections except for that for the second gate electrode, the etching time is controlled such that the bottom of the contact hole 22 exists in the middle of the silicon oxide film 17.

2nd Step

Figure 87:
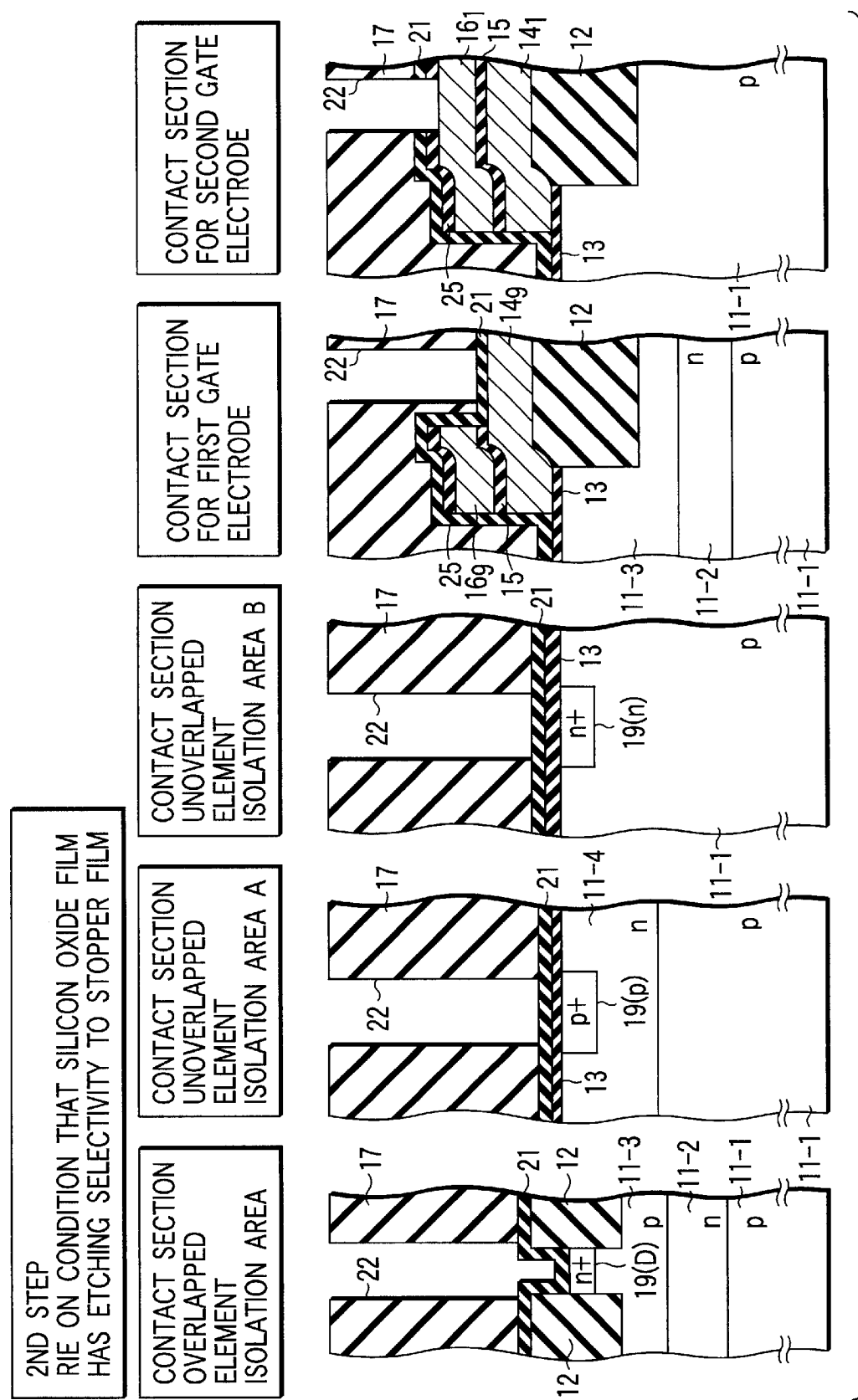
FIG. 87 is a diagram illustrating a step in a method of manufacturing the contact structure in FIGS. 80 through 83.

At this step, as illustrated in FIG. 87, the silicon oxide film 17 is etched by RIE using a mask which is a resist film having openings on all contact sections (the mask used at the first step is used as it is).

Here, the silicon oxide film 17 is etched by RIE on condition that the silicon oxide film 17 has an etching selectivity to the stopper film 21. In other words, since the stopper film 21 functions as an etching stopper in the etching of this step, the bottom of the contact hole 22 is substantially coincident with the surface of the stopper film 21 in contact sections except for the contact section for the second gate electrode.

The RIE condition at this step should be further set such that a control gate electrode 161 is not etched. This is because the control gate electrode 161 has already been exposed on the bottom of the contact hole 22 in the contact section for the second gate electrode at the first step.

After this step is completed, the resist film used as the mask for RIE is removed.

3rd Step

Figure 88:
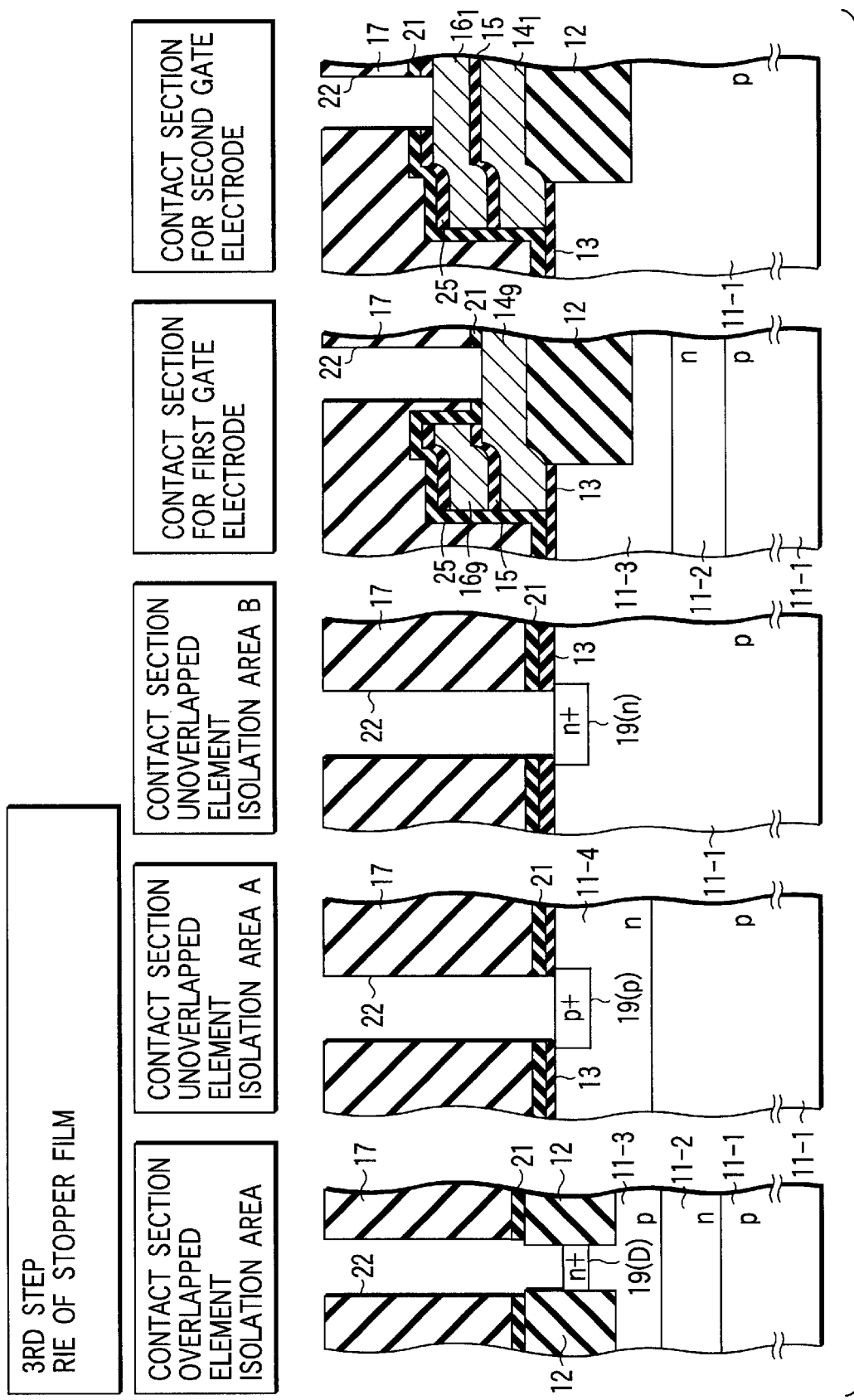
FIG. 88 is a diagram illustrating a step in a method of manufacturing the contact structure in FIGS. 80 through 83.
Figure 92:
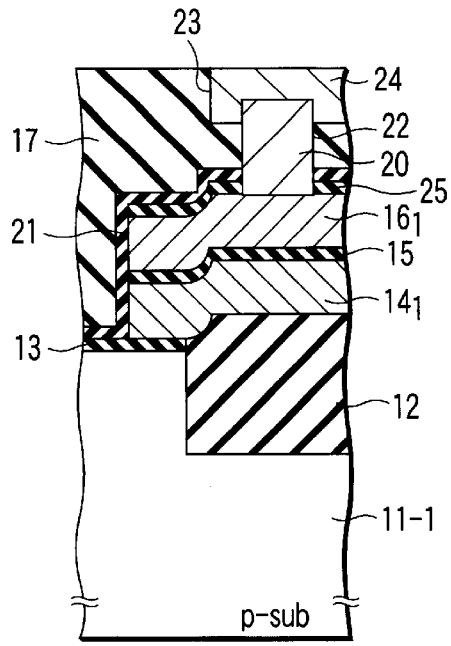
FIG. 92 is a diagram illustrating an exemplary modification to the contact structure according to the second invention of the present application.
Figure 93:
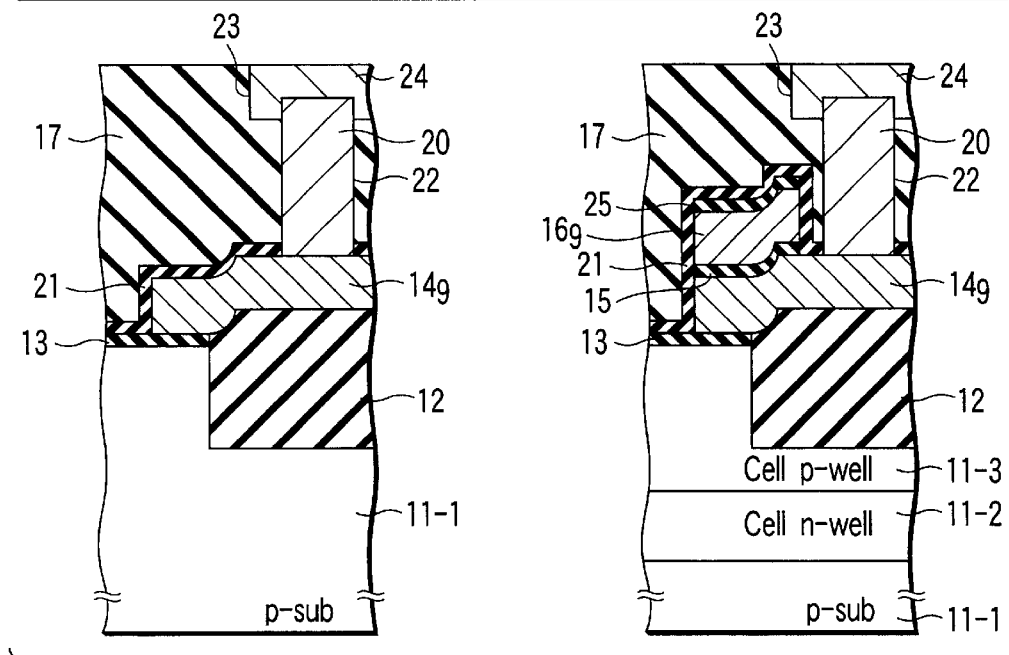
FIG. 93 is a diagram illustrating an exemplary modification to the contact structure according to the second invention of the present application.

At this step, as illustrated in FIG. 88, the stopper film 21 existing on the bottom of the contact holes 22 in the contact sections other than the contact section for the second gate electrode is etched by an etching method such as RIE, CDE or the like.

As a result, when this step is completed, the bottoms of the contact holes 22 reach the element isolation oxide film 12, $n^+$-type diffusion layers 19(D), 19($n$), $p^+$-type diffusion layer 19($p$) and select gate electrode 149, respectively. Here, the stopper film 21 is preferably etched by RIE on condition that the stopper film 21 has an etching selectivity to the element isolation oxide film (silicon oxide film) 12, diffusion layers (silicon) 19(D), 19($n$), 19($p$), select gate electrode (polysilicon) 149 and control gate electrode (polysilicon) 161.

4th Step

At this step, as illustrated in FIG. 89, after wiring grooves 23 are formed, wirings, i.e., metal films 24 are buried into the contact holes 22 and the wiring grooves 23 in all the contact sections. Barrier metals may be formed before the metal films 24 are buried. The metal films are buried in the contact holes 22 and the wiring grooves 23, for example, by a CMP method or an etching method such as RIE, CDE or the like.

2.-2.-3. Effects

In the contact structure according to the second invention of the present application, all of the contact sections for the substrate and the contact sections for MOS transistors have the same structure. For example, the same material, i.e., a metal film is buried in all of these contact sections, the contact hole 22 and the wiring grooves 23.

Therefore, even if a seam occurs, for example, in the contact section, this seam will not be exposed on the surface of the metal film 24 when the metal film 24 is etched back, thereby eliminating a degraded reliability due to the spread seam.

Also, since no contact plugs are provided, the step required for etching back the contact plugs is omitted, and all the contact sections can be simultaneously formed by the dual damascene process, the manufacturing process is simplified, thereby making it possible to contribute to a reduction in the cost.

Specifically, this embodiment requires one PEP step and three etching (RIE) steps for completing all the contact sections. Since the aforementioned related art (FIGS. 75 through 79) requires two PEP steps and three etching (RIE) steps, the manufacturing method previously described with reference to FIGS. 86 through 89 can omit one PEP step as compared with the manufacturing method illustrated in FIGS. 75 through 79, thereby making it possible to accomplish a reduced cost.

2.-3. Others

The embodiment of the second invention of the present application is implemented on the assumption that the silicon oxide film 25 is formed on the control gate electrode 161. This silicon oxide film 25 serves as a mask for etching the overlying gate electrode to expose the underlying gate electrode in the contact section for the first gate electrode (a contact section for a gate of a select transistor).

The "1st STEP" in the aforementioned manufacturing method is required due to the existence of the silicon oxide film 25. In other words, if the "1st STEP" were omitted, the existence of the silicon oxide film 25 would prevent the contact hole 22 from reaching the control gate electrode 161 in the contact section for the second gate electrode. For this reason, the contact hole 22 reaching the control gate electrode 161 is previously formed at the "1st STEP."

If the silicon oxide film 25 is not formed on the control gate electrode 161, the "1st STEP" can be omitted, as a matter of course. In other words, the contact structure according to the second invention of the present application is completed by the "2nd STEP" through the "4th STEP."

Figure 94:
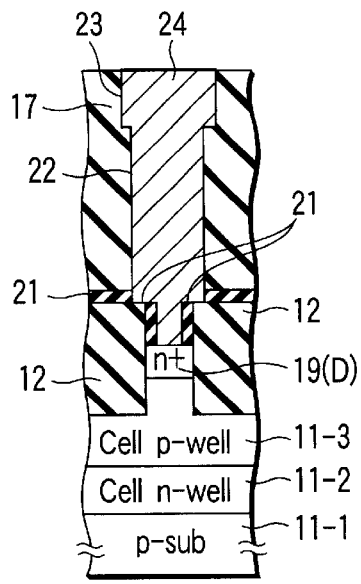
FIG. 94 is a diagram illustrating an exemplary modification to the contact structure according to the second invention of the present application.
Figure 95:
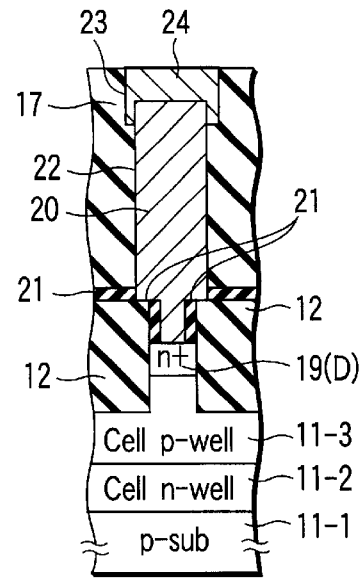
FIG. 95 is a diagram illustrating an exemplary modification to the contact structure according to the second invention of the present application.

In addition, in the contact structure according to the second invention of the present application, the stopper film 21 may be left on the $n^+$-type diffusion layer 19(D) as illustrated in FIGS. 94 and 95. This may be realized, for example, by adjusting the RIE condition at the "3rd STEP."

3. Third Invention

A third invention of the present application will be described.

3.-1. Related Art

The third invention of the present application is premised on the aforementioned first invention, and therefore may be regarded as an exemplary modification to the first invention.

The contact structure according to the first invention features that a contact plug is buried in a contact hole, and that the contact plug extends through overlying wirings (a bit line, a source line or the like). With this structure, the first invention is advantageous in that even if the contact holes are miniaturized and the aspect ratio of the contact holes is increased to cause a higher susceptibility to the occurrence of a seam, the seam will not be spread by the etch-back performed for forming the contact plug.

In the contact structure according to the first invention, on the other hand, the contact plug is in contact with the overlying wiring only on its side surfaces, and the wiring is cut in halves by the contact plug. Therefore, if the first invention is applied to bit line contact sections, a linear bit line will be cut in halves by the contact plugs of a plurality of bit line contact sections. This will increase the wiring resistance of the bit line to potentially hinder the operation of the memory, as the memory capacity is further increased.

FIGS. 96A through 96D briefly summarize contact structures (having a contact plug) of bit line contact sections.

FIG. 96A illustrates a top plan view of a bit line 18, and FIGS. 96B through 96D illustrate exemplary contact structures (cross sections).

FIG. 96B illustrates contact plugs 20 formed by a single damascene process, where upper surfaces of the contact plugs 20 are substantially coincident with a lower surface of bit line 18. The bit line 18 can be formed by the single damascene process, a wiring processing method using normal etching, or the like.

FIG. 96C illustrates a contact structure completed by the single damascene process, and a technique which is the premise for the first invention, where upper surfaces of contact plugs 20 exist between an upper surface and lower surface of a bit line 18.

FIG. 96D illustrates the first invention, where upper surfaces of contact plugs 20 are substantially coplanar with an upper surface of a bit line 18. In the contact structure illustrated in FIG. 96D, the linear bit line 18 is cut in halves by the contact plugs 20 in a plurality of bit line contact sections, giving rise to a problem related to the wiring resistance of the bit line 18 as the trend of increasing the capacity of the memory requires the bit line 18 itself to be thinner and longer.

In the following, techniques for solving this problem will be proposed.

3.-2. Embodiment

3.-2.-1. Summary

Figure 97A:
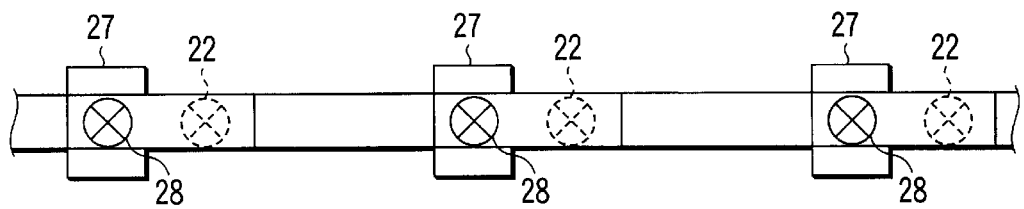
FIGS. 97A and 97B are diagrams illustrating a contact structure according to the third invention of the present application.
Figure 97B:
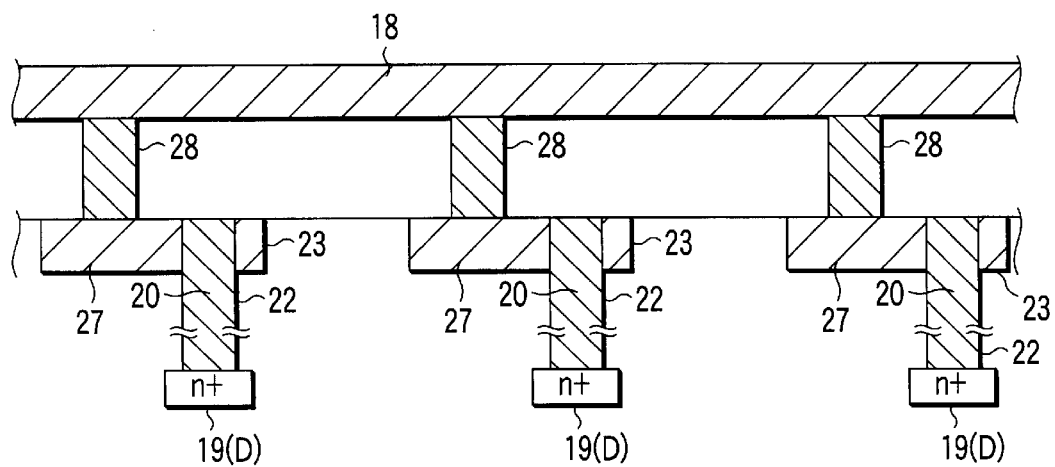

FIGS. 97A and 97B illustrate a contact structure according to a third invention of the present application.

The illustrated contact structure features that in bit line contact sections, contact plugs 20 are connected to a bit line 18 through draw-out lines 27 without direct contact with the bit line 18.

Specifically, the contact plugs 20, for example, made of a polysilicon film doped with impurities are buried in contact holes 22, and the draw-out lines (for example, metal films, silicide films or the like) 27 are buried in wiring grooves 23. Also, the contact plugs 20 are formed such that they extend through the draw-out lines 27 at one end thereof, and their upper surfaces are substantially coplanar with upper surfaces of the draw-out lines 27. Each of the draw-out lines 27 has its other end in contact with the bit line 18 formed thereover through a contact hole 28.

According to the contact structure as described above, the contact plugs 20 extend through the associated draw-out lines 27 but not through the bit line 18, so that the wiring resistance of the bit line 18 will not be increased. Consequently, a seam, if any, in the contact plug 20 will not be spread, and the wiring resistance of the bit line 18 will not either be increased, thereby making it possible to improve the performance of the memory device.

In addition, since the draw-out lines 27 are only responsible for connecting the bit line 18 with the associated contact plugs 20, the contact plugs 20 extending through the draw-out lines 27 will never cause the problem of increasing the wiring resistance of the bit line 18.

3.-2.-2. SPECIFIC EXAMPLE

In the following, description will be made on a specific example of a non-volatile semiconductor memory which has the contact structure provided with draw-out lines between contact plugs and a bit line.

First described is a plane pattern of a NAND cell unit.

Figure 98:
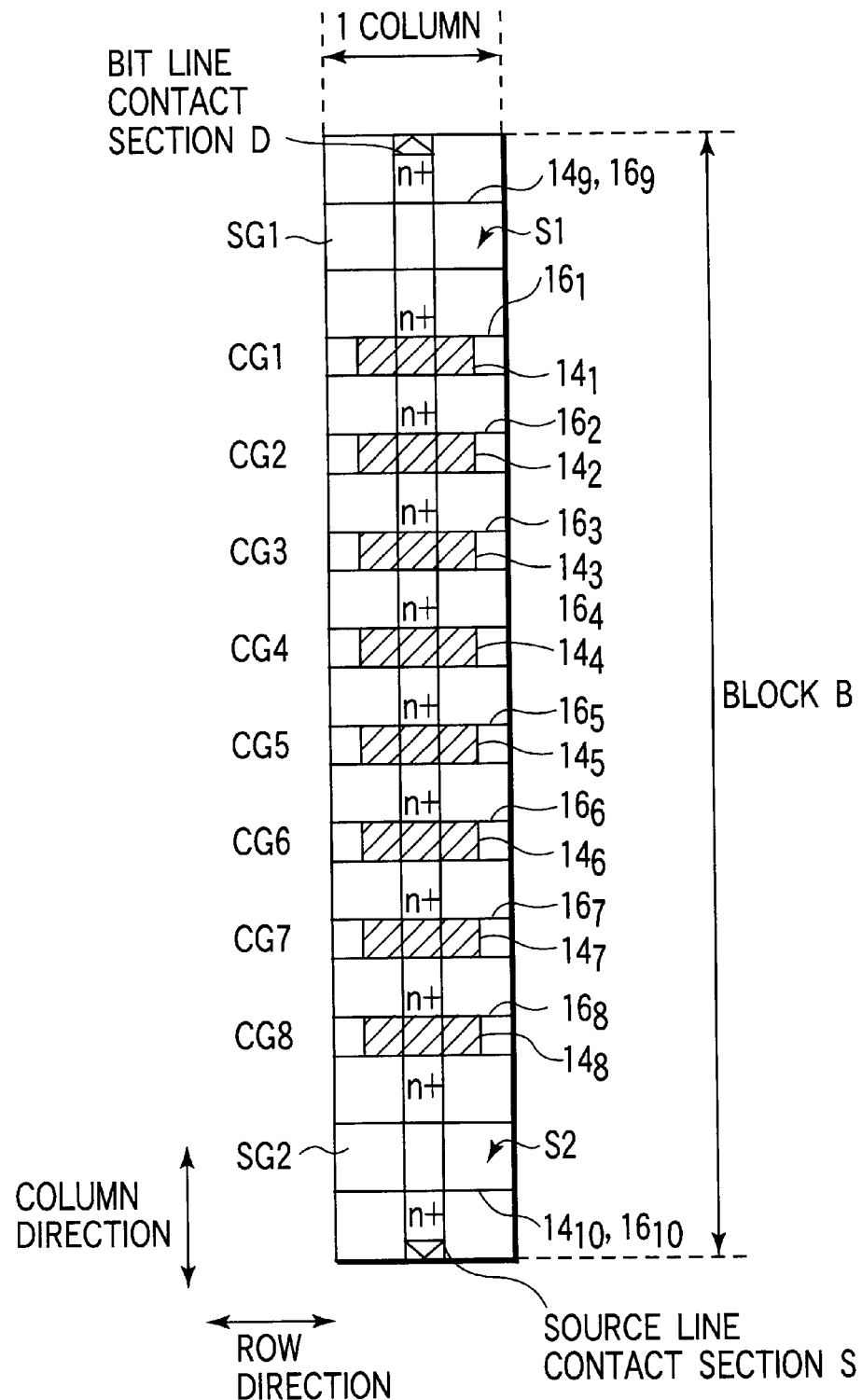
FIG. 98 is a top plan view illustrating a specific example of the contact structure according to the third invention of the present application.

FIG. 98 illustrates a plane pattern of a NAND cell unit. The NAND cell unit is comprised, for example, of a NAND cell column including eight NAND cells connected in series; and two select gate transistors S1, S2 connected to both ends of the NAND cell column. An n$^+$ diffusion layer closest to the drain side (proximal to the select transistor S2) of the NAND cell unit is provided with a bit line contact section D, while an n$^+$ diffusion layer closest to the source side (proximal to the selection transistor S2) is provided with a source line contact section S.

The bit line contact sections D are provided independently between two NAND cell units adjoining in the row direction (isolated by an element isolation oxide film), and commonly between two NAND cell units adjoining in the column direction. Likewise, the source line contact sections S are provided independently between two NAND cell units adjoining in the row direction, and commonly between two NAND cell units adjoining in the column direction.

Figure 99:
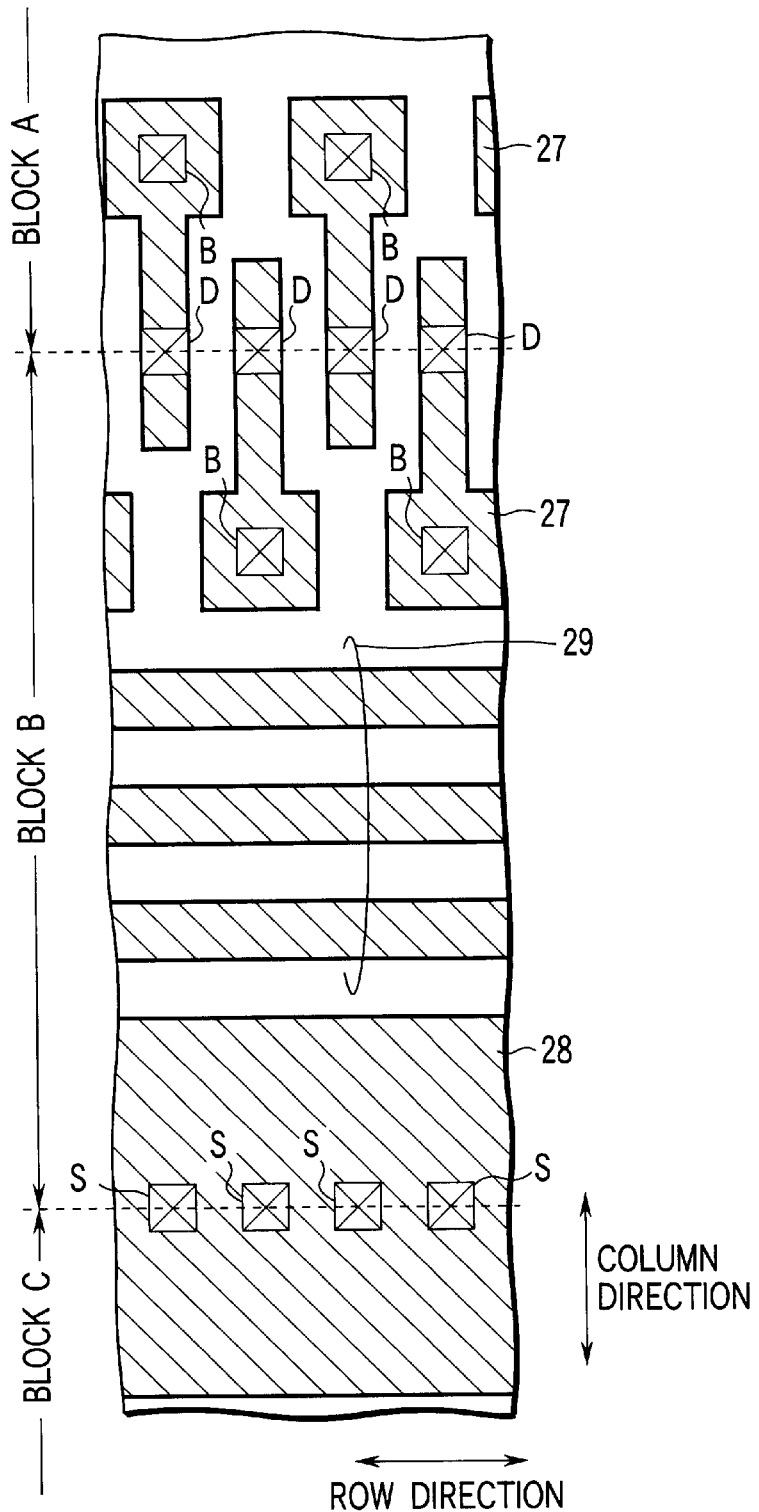
FIG. 99 is a top plan view illustrating a specific example of the contact structure according to the third invention of the present application.
Figure 100:
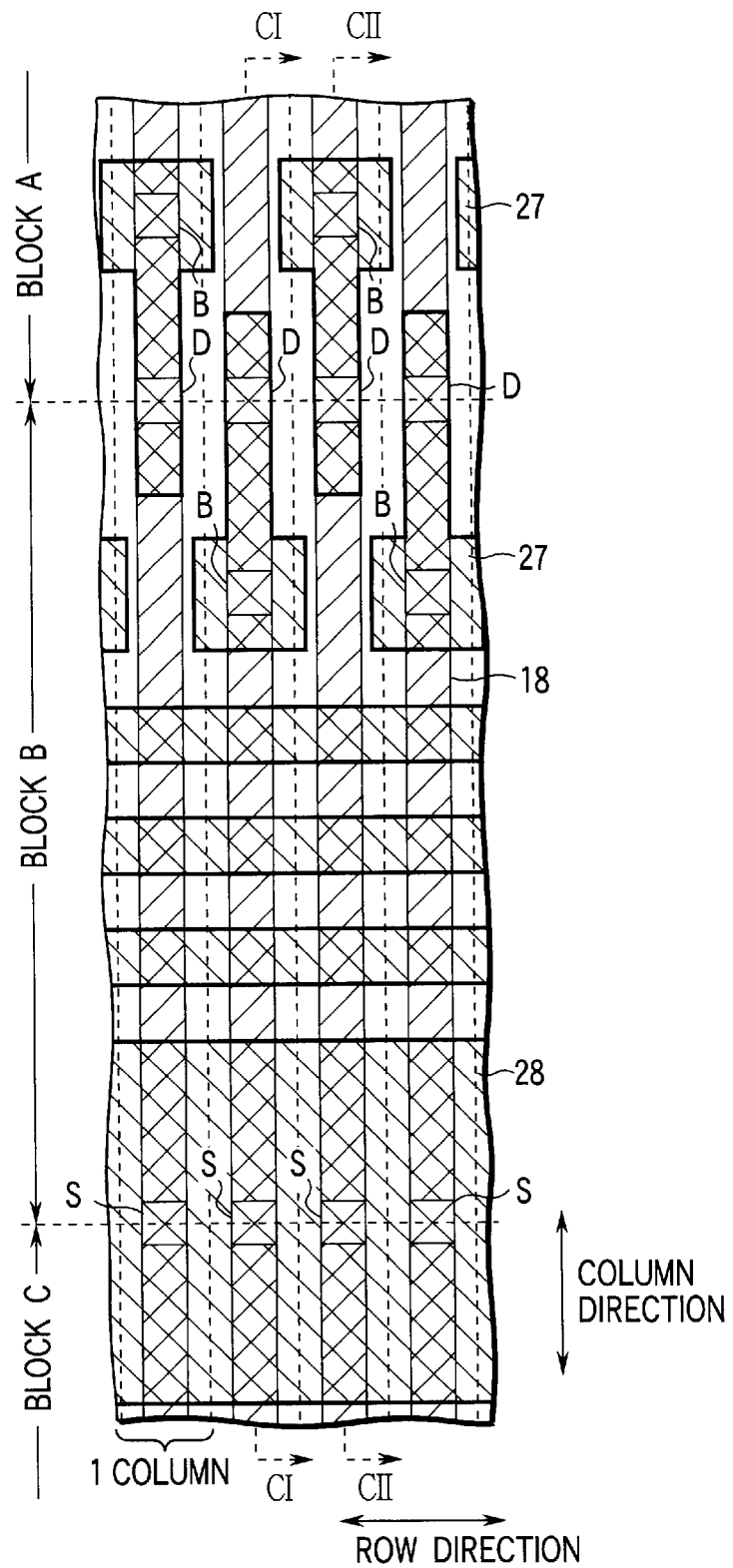
FIG. 100 is a top plan view illustrating a specific example of the contact structure according to the third invention of the present application.

FIG. 99 illustrates a layout of wirings formed in a first wiring layer which is formed on the NAND cell unit. FIG. 100 illustrates a layout of bit lines formed in a second wiring layer which is formed on the first wiring layer in FIG. 99.

Figure 101:
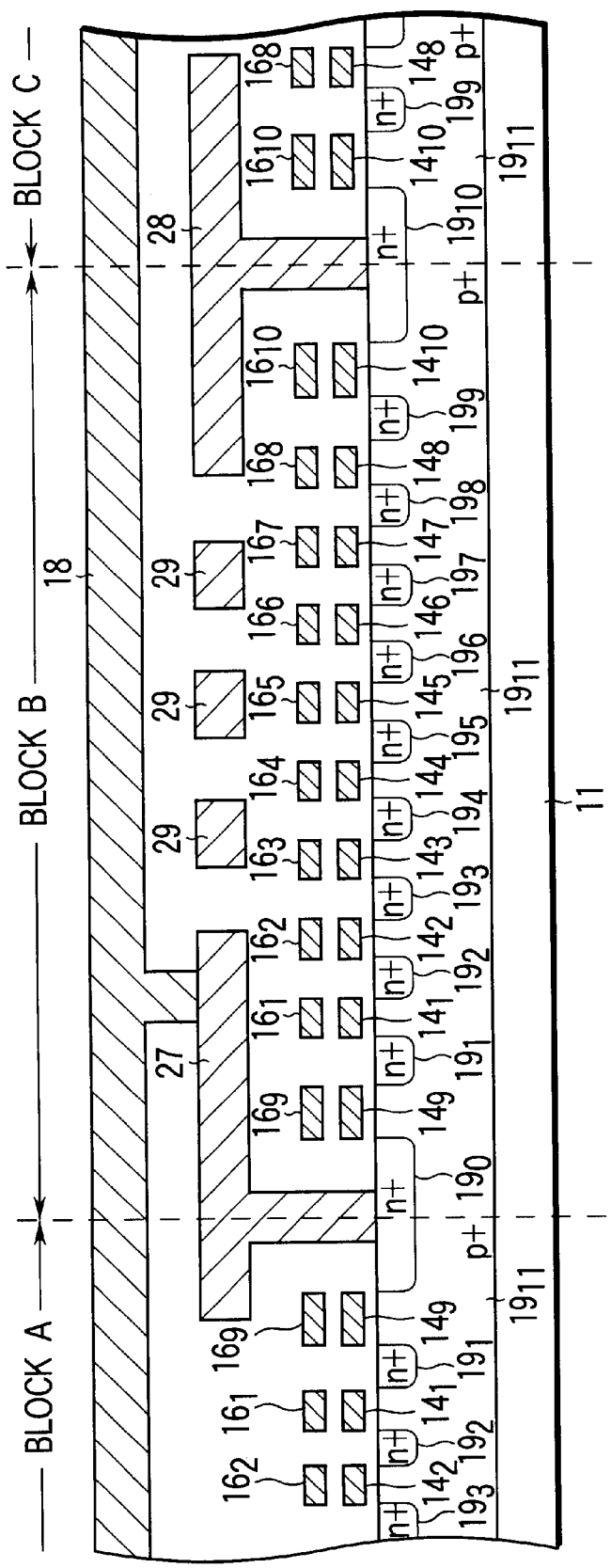
FIG. 101 is a cross-sectional view taken along the line CI—CI in FIG. 100.
Figure 102:
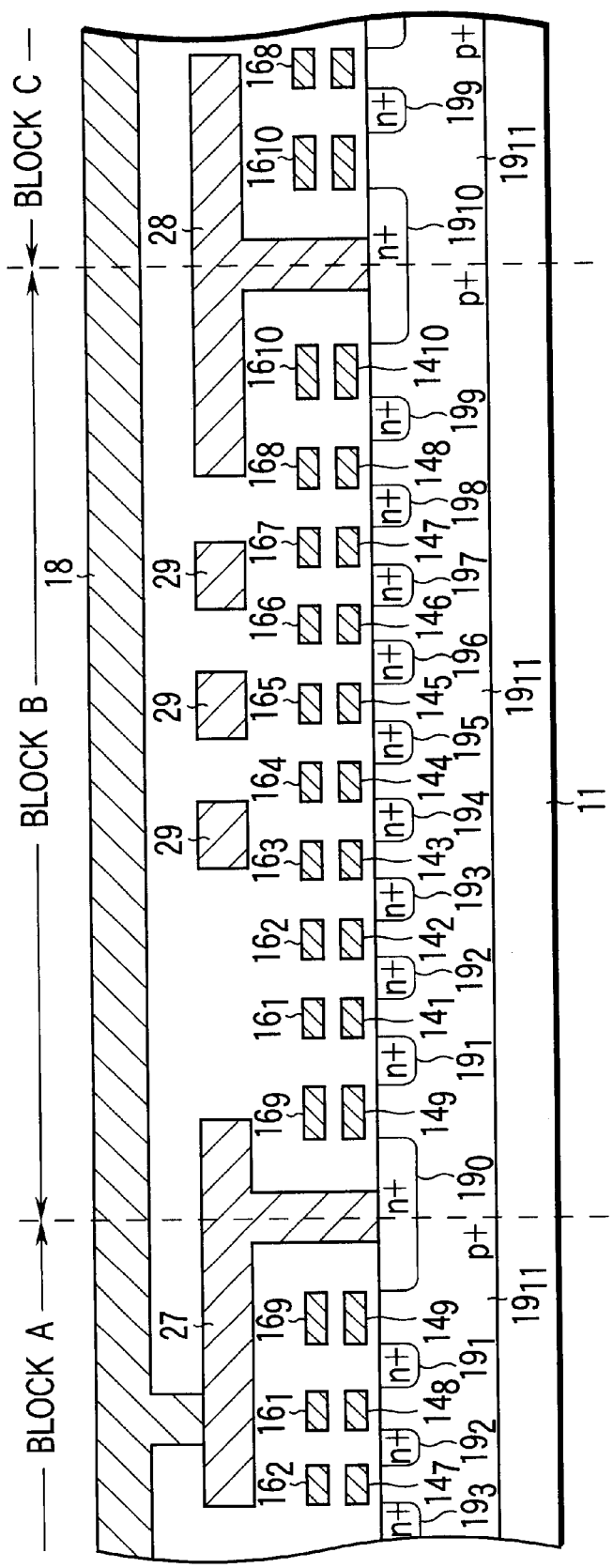
FIG. 102 is a cross-sectional view taken along the line CII—CII in FIG. 100.

Also, FIG. 101 is a cross-sectional view taken along the line CI—CI in FIG. 100, and FIG. 102 is a cross-sectional view taken along the line CII—CII in FIG. 100.

The first wiring layer is formed with draw-out lines 27 for connecting associated bit line to contact plugs; a source line 28 connected to a source diffusion layer; and other signal lines 29. The other signal lines 29 include, for example, a block decode line, a select gate bypass line connected to gates of select transistors, and the like.

For reference, the block decode line is provided for applying a block select signal to row decoders when they are arranged at both ends of a memory cell array in the row direction.

In this example, the source line 28 extending in the row direction is positioned on a plurality of source line contact sections S of the NAND cell units in the row direction. Each of the source line contact sections S has a contact structure which includes a contact plug in a contact hole, as previously described in connection with the first invention, with the contact plug extending through the source line 28.

A connection between a bit line 18 and a NAND cell unit is made through a draw-out line 27 between the bit line 18 and the NAND cell unit.

The provision of the draw-out lines 27 can advantageously limit an increased wiring resistance of the bit line 18, prevent a contact hole coupling the bit line 18 with the NAND cell unit from becoming extremely deep, extends the pitch of contact sections B to prevent failures due to discrepancies of the contact holes and variations in size of the contact holes, and the like.

Specifically, the contact section B is provided with a fringe so that the contact section B has a width larger than the wiring width of the bit line 18 (or the width of an active region). The contact sections B are provided alternately on the block A side and on the block B side with respect to the contact sections D.

Each of the contact section D has a contact structure which includes a contact plug in a contact hole, as previously described in connection with the first invention, with the contact plug extending through the draw-out line 27.

3.-2.-3. Effects

According to the third invention of the present application, it is possible to provide a highly reliable memory device which can prevent a seam from being spread, as is the case of the aforementioned first invention. In addition, simultaneously with this, the performance of the memory will not be degraded since the bit line is prevented from an increase in the wiring resistance. It is further possible to prevent the contact holes coupling the bit lines with the NAND cell units from being extremely deep, and to extend the pitch of bit line contact sections B to prevent failures due to discrepancies of the contact holes and variations in size of the contact holes.

3.-3. Others

While the third invention can provide larger effects in combination with the aforementioned first invention, the third invention may of course be combined with the second invention to create a semiconductor memory having a novel contact structure.

4. Others

In the contact structures according to the first through third inventions described above, the following variations may also be made.

Wirings formed on the contact plugs or the contact holes (the bit line, source line, draw-out lines and the like) may be provided with allowances (fringes) for the contact holes or may not be provided with such allowances (fringeless contacts).

Wirings on the contact plugs and wirings on the contact holes which do not have contact plugs may be formed by the damascene process for burying a conductive film in wiring grooves, or formed by a normal process for processing the wirings by deposition and etching of a conductive film.

The contact holes of the bit line contact sections and the source line contact sections may be formed with a sufficient margin (width) ensured in consideration of misalignment with the select gate lines, or may be formed in self alignment with the diffusion layer between the select gate lines by providing a stopper film on the select gate lines.

Also, the first through third inventions of the present application can be applied to semiconductor memories such as DRAM, SRAM and the like other than non-volatile semiconductor memories including a NAND cell type flash memory as described above, and can further be applied to memory mixed logic LSIs which are equipped with logics and memories, other than general-purpose memories.

It should be understood that the first through third inventions of the present application are not limited to the respective embodiments and may be modified in various manners without departing from the spirit and scope of the respective inventions.

5. Effects

According to the first invention of the present application, the contact plugs extend through the overlying wiring, with the upper surfaces of the contact plugs being substantially coplanar with the upper surface of the wiring. It is therefore possible to prevent a seam from being exposed and spread during the formation of the contact plugs (during etch-back), eliminate variations in the contact resistance, and improve the reliability and throughput.

According to the second invention of the present application, all the contact sections for the substrate (including wells) and MOS transistors (including memory cells and select transistors) have the same structure, for example, a structure in which the same material (metal film) is buried in the contact holes and wiring grooves. With this structure, the manufacturing process is simplified, in addition to the ability of preventing a seam from being spread, as is the case of the first invention, thereby making it possible to realize a reduced cost.

Further, according to the third invention of the present invention, by providing the draw-out lines between the contact plugs and the bit line, the contact plugs will not extend through the bit line but extend through the draw-out lines, thereby eliminating a situation in which the linearly extending bit line is cut in halves by the contact plugs. It is therefore possible to prevent an increase in the wiring resistance of the bit line and accordingly realize higher performance of the memory device.

(2) Present Invention 2

In the following, non-volatile semiconductor memory devices according to the present invention will be described in detail with reference to the accompanying drawings.

[First Embodiment]

Figure 103:
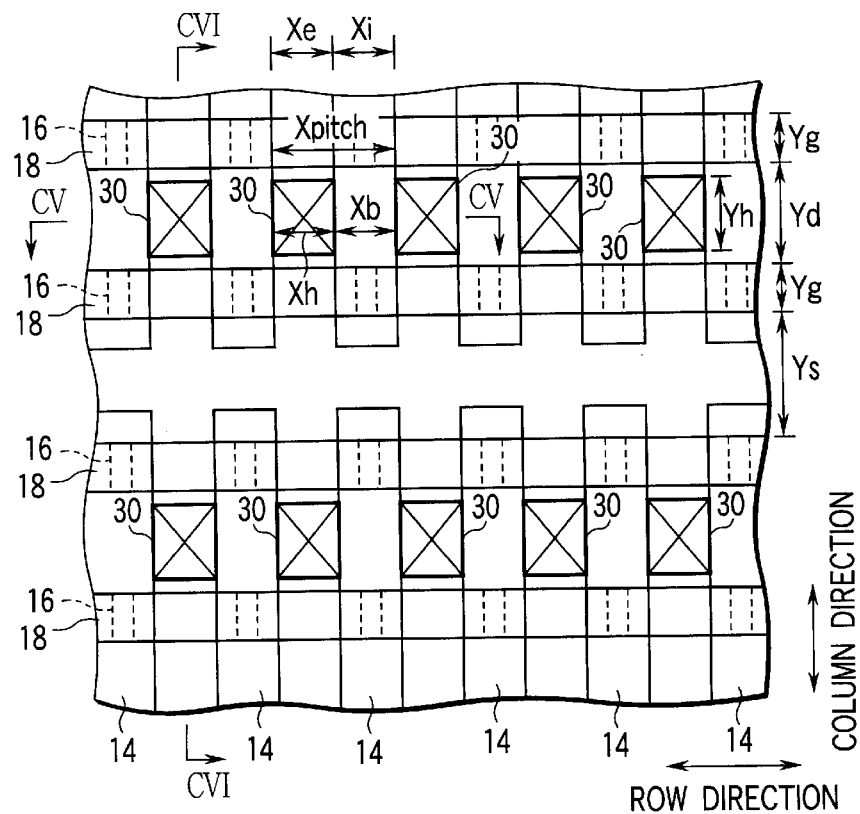
FIG. 103 is a top plan view illustrating a memory cell array of a NOR cell type non-volatile semiconductor memory device according to the present invention.
Figure 104:
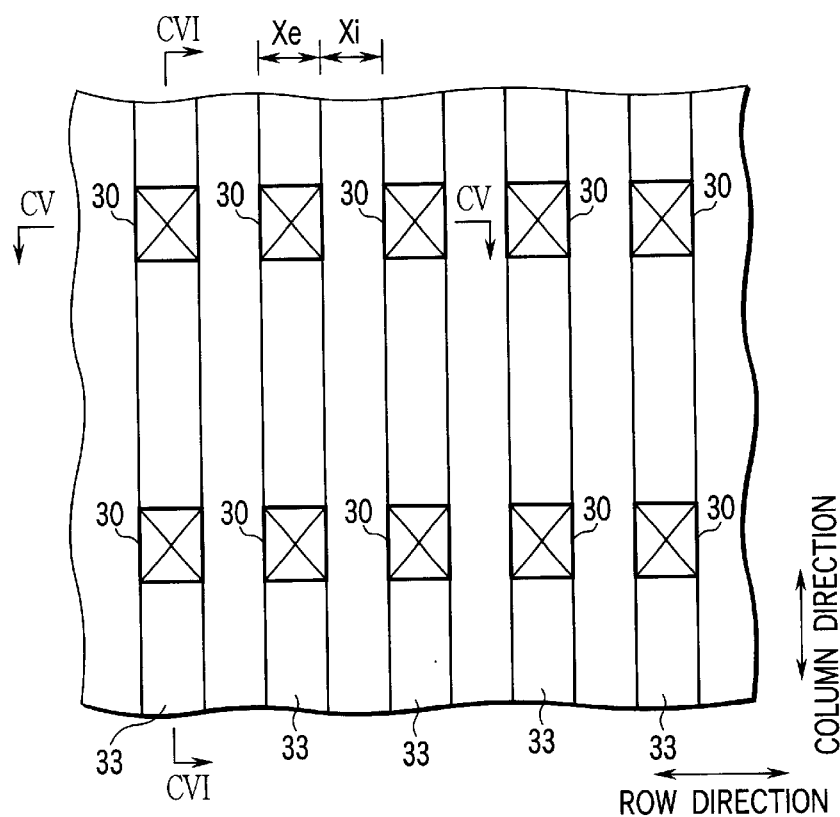
FIG. 104 is a top plan view illustrating bit lines formed on the device in FIG. 103.
Figure 105:
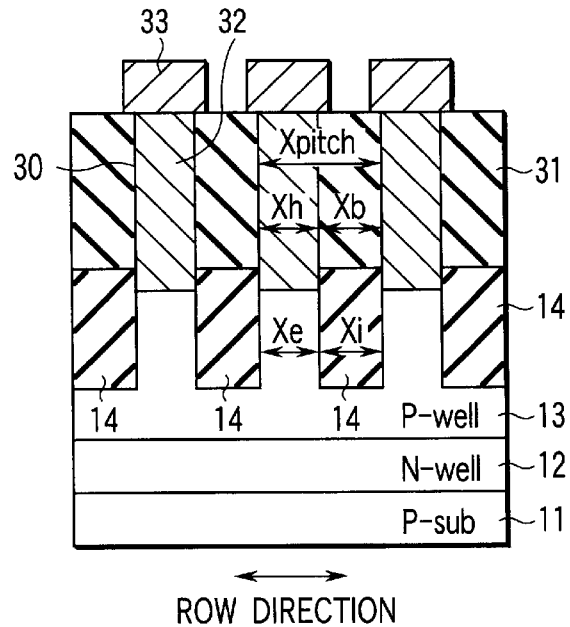
FIG. 105 is a cross-sectional view taken along the line CV—CV in FIGS. 103 and 104.
Figure 106:
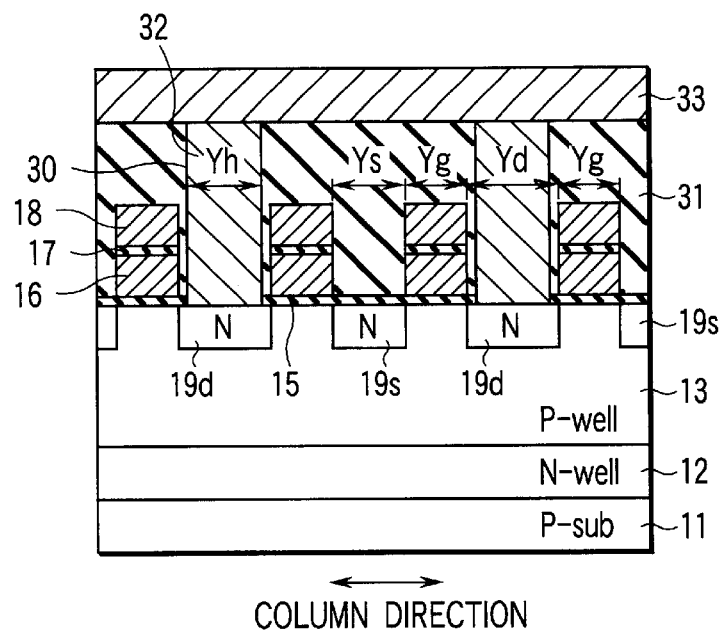
FIG. 106 is a cross-sectional view taken along the line CVI—CVI in FIGS. 103 and 104.

FIGS. 103 through 106 illustrate a memory cell array of a NOR cell type non-volatile semiconductor memory device according to a first embodiment of the present invention. FIGS. 103 and 104 are top plan views of the memory cell array; FIG. 105 is a cross-sectional view taken along the line CV—CV in FIGS. 103 and 104; and FIG. 106 is a cross-sectional view taken along the line CVI—CVI in FIGS. 103 and 104.

It should be noted that for facilitating the understanding of the figures, FIG. 103 omits a wiring layer in which bit lines are formed, and FIG. 104 shows only the wiring layer in which the bit lines are formed. In other words, the bit lines shown in FIG. 104 are formed on the device of FIG. 103.

This embodiment is described in connection with a memory cell array comprised of memory cells in the stacked gate structure. However, it goes without saying that the present invention can of course be applied to memory cells in the single gate structure. Assume also that in this embodiment, memory cells are comprised of N-channel type MOS transistors.

In the following, a specific device structure will be described.

An N-well region 12 and a P-well region 13 are formed in a P-type silicon substrate 11. Memory cells are formed in the P-type well region 13. However, the memory cells may be formed in the silicon substrate 11. The silicon substrate 11 is also formed with trenches for element isolation, and an insulating material (for example, silicon oxide) 14 for element isolation is buried in the trenches.

An area sandwiched by the element isolation insulating materials 14 serves as an element area. A thin tunnel insulating film (for example, made of silicon oxide) 15 is formed on the silicon substrate 11 (P-well region 13) in the element area such that a micro-tunnel current can be applied therethrough during writing/erasing operations.

A charge transfer layer 16 is formed on the tunnel insulating film 15. The charge transfer layer 16 is made of an electrically floating conductive layer (for example, a polysilicon layer including impurities).

A control gate layer 18 is formed on the charge transfer layer 16 through an intergate insulating layer 17. Since the charge transfer layer 16 is capacitively coupled to the control gate layer 18, variations in potential on the control gate layer 18 cause like variations in potential on the charge transfer layer 16.

Since the charge transfer layer 16 and the control gate layer 18 are simultaneously processed in a self-alignment, their side edges are in alignment with each other in a direction (column direction) perpendicular to a direction (row direction) in which the control gate layer (word lines) 18 extends. Also, the side edge of the charge transfer layer 16 in the row direction exists on the element isolation insulating material 14.

In the element area, a surface area of the silicon substrate 11 beneath the charge transfer layer 16 serves as a channel region. A source diffusion layer 19s and a drain diffusion layer 19d are also formed on both sides of the channel region.

A control gate layer (word lines) 18 of memory cells extends in a row direction. An interlayer insulating film (made, for example, of silicon oxide) 31 is formed on the memory cells for overlying the memory cells. The interlayer insulating layer 31 is formed with contact holes (bit line contacts) 30 which reach the drain diffusion layer 19d of the memory cells.

The contact holes 30 are formed in the shape of rectangle instead of square. In this embodiment, a width Yh of the contact hole 30 in a column direction (in a direction in which bit lines 33 extends) is larger than a width Xh of the contact hole 30 in a row direction (in a direction in which the word lines 18 extend).

The contact holes 30 are arranged in a line in the row direction with their pitch Xpitch being equal to the width Xh of the contact holes 30 in the row direction plus a spacing Xb between the adjacent contact holes 30. Also, the pitch Xpitch of the contact holes 30 is equal to a repeating pitch of element areas and element isolation areas (a pitch of the bit lines 33) Xi+Xe, as a matter of course.

A contact plug 32 made of a conductive material is buried in each of the contact holes 30. Then, on an interlayer insulating film 31, the bit lines 33 are formed. The bit lines 33 are electrically connected to the drain diffusion layers 19d of associated memory cells through the contact plugs 32.

The bit lines 33 extends in the column direction. More specifically, the control gate layers 18 and the bit lines 33 are arranged such that they intersect perpendicularly or generally perpendicularly to each other. One memory cell is provided at each of the intersections of the control gate layers 18 with the bit lines 33.

The drain diffusion layers 19d are shared by two memory cells in the column direction, and independent of each other for memory cells in the row direction. A source diffusion layer 19s extends in the row direction, and serves as a common source line. Therefore, the source diffusion layer 19s is shared not only by two memory cells in the column direction but also by a plurality of memory cells in the low direction adjacent to the source diffusion layer 19s.

In a region in which the source diffusion layer 19s is formed, no element isolation insulating material 14 is formed. In other words, the element isolation areas (element isolation insulating materials) 14, which are formed extending in the column direction, are interrupted by source diffusion layer 19s. Also, the drain diffusion layers 19d of memory cells existing in one column are electrically connected to each other through the bit line 33.

FIGS. 107 and 108 show the shape of contact holes (bit line contacts) when the device illustrated in FIGS. 103 through 106 is actually manufactured.

Specifically, as memory cells are miniaturized and contact holes (bit line contacts) are also miniaturized, even if the contact holes are laid out in the shape of rectangle, a resist film serving as a mask is in the shape of rectangle with rounded corners (a shape resembling an ellipse), resulting in contact holes likewise in the shape of rectangle with rounded corners, which are formed by etching with the circular resist film used as a mask.

It should be noted that this embodiment is intended to explain that the contact holes may be formed not only in the shape of rectangle but also in the shape of rectangle with rounded corners.

As illustrated in FIGS. 103 through 108, the present invention features the shape of the contact holes (bit line contacts) 30. Specifically, in the present invention, the contact holes 30 have a width Yn in the column direction (in the direction in which the bit lines 33 extend) larger than a width Xh in the row direction (in the direction in which the word lines 18 extend).

Generally, in regard to the optical exposure technique, the formation of a resist pattern for a hole shape (for example, contact holes) requires a larger amount of light (exposure amount) for exposing the resist as compared with the formation of a resist pattern for a line and space shape, so that exposure conditions for ensuring optimal dimensions are extremely strict in the former case.

For example, when the pitch Xpitch of the contact holes (bit line contacts) 30 is significantly reduced, an increased amount of exposure results in a higher susceptibility to short-circuiting of adjacent contact holes 30, whereas a reduced amount of exposure results in insufficient exposure, causing a problem that holes are not formed.

On the other hand, in the formation of a resist pattern for a line and space shape, a so-called proximity effect is produced, so that the amount of light (exposure amount) required to expose the resist is smaller than the formation of a resist pattern for a hole shape. In other words, the line and space pattern provides further miniaturization than the hole pattern if the conditions are the same.

The present invention, taking advantage of this fact, forms the contact holes 30, which have been conventionally square (or circular), in the shape of rectangle (or rectangle with rounded corners) so as to accomplish the feature of the line and space pattern, i.e., an improved processing margin resulting from the proximity effect.

Specifically, in a non-volatile semiconductor memory device, contact holes (bit line contacts) 30 are arranged in a line in the row direction (in the direction in which word lines 18 extend), the width Xh of the contact holes 30 in the row direction is reduced, while the width Yh of the contact holes 30 in the column direction is made longer than the width Xh in the row direction. This enables the pitch Xpitch of the contact holes 30 to be reduced and simultaneously the width Xe of the element areas and the width Xi of the element isolation areas to be reduced to approximately a minimum processing dimension available for the line and space pattern.

Specifically, in the prior art, the pitch Xe+Xi of the lines and spaces is limited by the diameter of the contact holes 30 and the spacing between the contact holes 30, so that the pitch Xe+Xi of the lines and spaces cannot be reduced to the minimum processing dimension. According to the present invention, on the other hand, since the pitch Xe+Xi of the lines and spaces is released from the limitation due to the diameter of the contact holes 30 and the spacing between the contact holes 30, the pitch Xe+Xi of the lines and spaces can be reduced to the minimum processing dimension.

In addition, even when the width Xh of the contact holes 30 in the row direction is shortened, the width Yh in the column direction may be extended to prevent the contact area from being reduced, as compared with that of the conventional square contact holes, so that the contact resistance can be limited to be lower.

[Second Embodiment]

Figure 109:
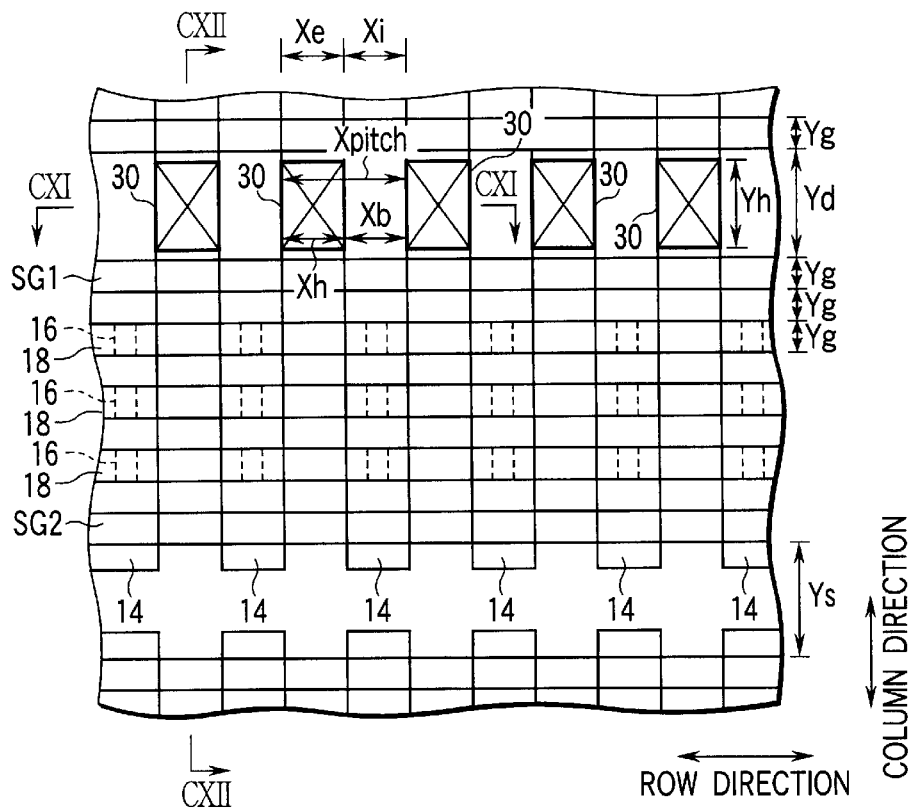
FIG. 109 is a top plan view illustrating a memory cell array of a NAND cell type non-volatile semiconductor memory device according to the present invention.
Figure 110:
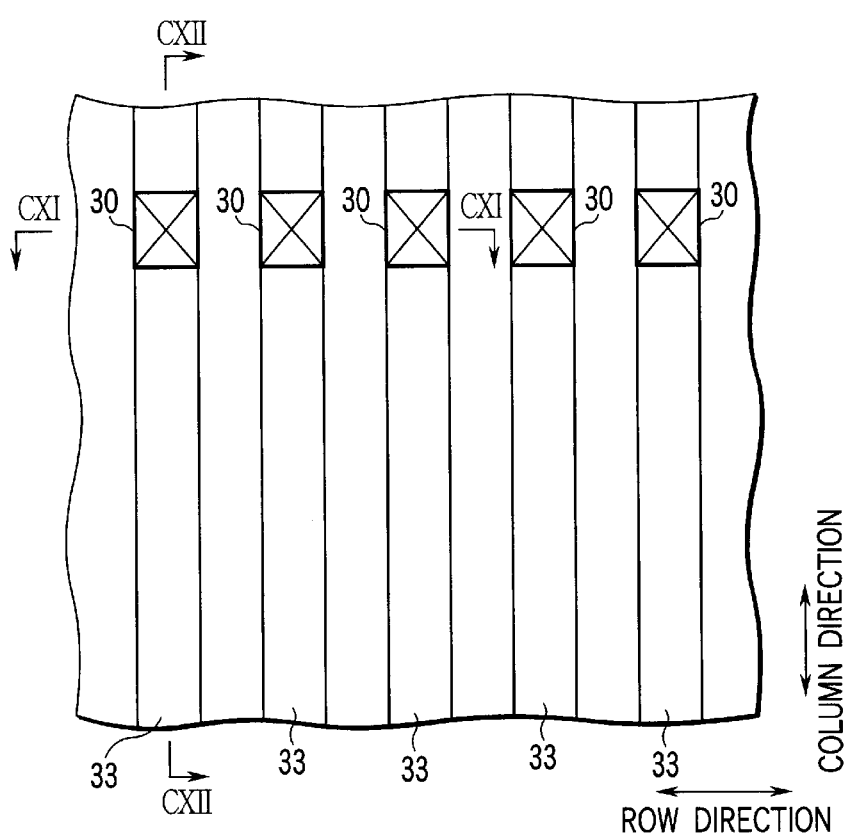
FIG. 110 is a top plan view illustrating bit lines formed on the device in FIG. 109.
Figure 111:
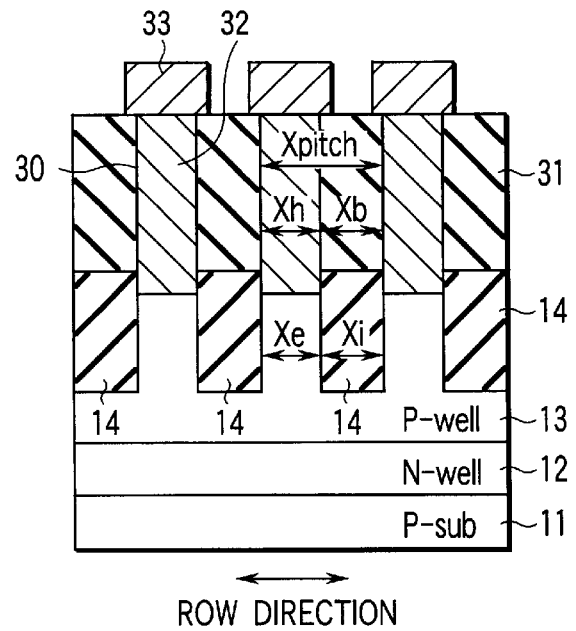
FIG. 111 is a cross-sectional view taken along the line CXI—CXI in FIGS. 109 and 110.
Figure 112:
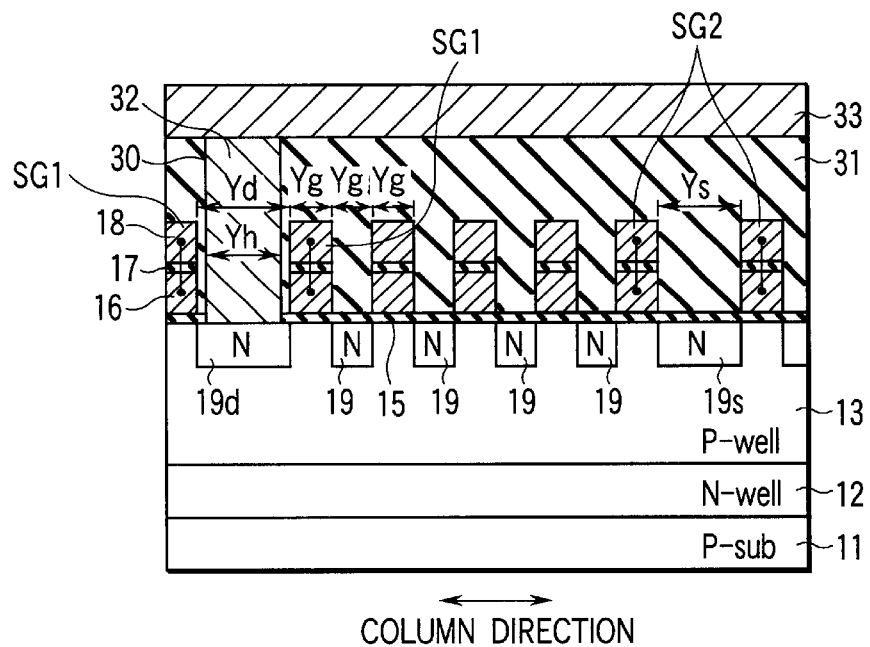
FIG. 112 is a cross-sectional view taken along the line CXII—CXII in FIGS. 109 and 110.

FIGS. 109 through 112 illustrate a memory cell array of a NAND cell type non-volatile semiconductor memory device according to a second embodiment of the present invention. FIGS. 109 and 110 are top plan views of the memory cell array; FIG. 111 is a cross-sectional view taken along the line CXI—CXI in FIGS. 109 and 110; and FIG. 112 is a cross-sectional view taken along the line CXII—CXII in FIGS. 109 and 110.

It should be noted that for facilitating the understanding of the figures, FIG. 109 omits a wiring layer in which bit lines are formed, and FIG. 110 shows only the wiring layer in which the bit lines are formed. In other words, the bit lines shown in FIG. 110 are formed on the device of FIG. 109.

While this embodiment is described in connection with a memory cell array comprised of memory cells in the stacked gate structure, it goes without saying that the present invention can of course be applied to memory cells in the single gate structure.

A memory cell array of a NAND cell type has a structure in which a plurality of NAND strings (or NAND cell units) are connected to bit lines. One NAND string is comprised of a plurality of memory cells connected in series, and a pair of select transistors, each of which is connected to one of both ends of the NAND string.

In the following, a specific device structure will be described.

An N-well region 12 and a P-well region 13 are formed in a P-type silicon substrate 11. Memory cells and select transistors are formed in the P-type well region 13. However, the memory cells and select transistors may be formed in the silicon substrate 11. The silicon substrate 11 is also formed with trenches for element isolation, and an insulating material (for example, silicon oxide) 14 for element isolation is buried in the trenches.

An area sandwiched by the element isolation insulating materials 14 serves as an element area. A thin tunnel insulating film (for example, made of silicon oxide) 15 is formed on the silicon substrate 11 (P-well region 13) in the element area such that a micro-tunnel current can be applied therethrough during writing/erasing operations.

A charge transfer layer 16 is formed on the tunnel insulating film 15. The charge transfer layer 16 is made of an electrically floating conductive layer (for example, a polysilicon layer including impurities).

A control gate layer 18 is formed on the charge transfer layer 16 through an intergate insulating layer 17. Since the charge transfer layer 16 is capacitively coupled to the control gate layer 18, variations in potential on the control gate layer 18 cause like variations in potential on the charge transfer layer 16.

Since the charge transfer layer 16 and the control gate layer 18 are simultaneously processed in a self-alignment, their side edges are in alignment with each other in a direction (column direction) perpendicular to a direction (row direction) in which the control gate layer (word lines) 18 extends. Also, the side edge of the charge transfer layer 16 in the row direction exists on the element isolation insulating material 14.

In the element area, a surface area of the silicon substrate 11 beneath the charge transfer layer 16 serves as a channel region. N-type diffusion layers (a source region or a drain region) 19 are also formed on both sides of the channel region.

The stacked gate structure is employed for the select transistors in a manner similar to the memory cells. However, the select transistors do not have a charge transfer layer, and for example, have an upper gate and a lower gate connected to each other to function as single gate electrode (select gate line) SG1 or SG2.

A control gate layer (word lines) 18 and the select gate lines SG1, SG2 of memory cells extend in a row direction. An interlayer insulating film (made, for example, of silicon oxide) 31 is formed on the memory cells for overlying the memory cells. The interlayer insulating layer 31 is formed with a contact holes (bit line contacts) 30 which reach a drain diffusion layer 19d of the NAND strings.

The contact holes 30 are formed in the shape of rectangle instead of square. In this embodiment, a width Yh of the contact holes 30 in a column direction (in a direction in which bit lines 33 extend) is larger than a width Xh of the contact holes 30 in a row direction (in a direction in which the word lines 18 extend).

The contact holes 30 are arranged in a line in the row direction with their pitch Xpitch being equal to the width Xh of the contact holes 30 in the row direction plus a spacing Xb between the adjacent contact holes 30. Also, the pitch Xpitch of the contact holes 30 is equal to a repeating pitch of element areas and element isolation areas (a pitch of bit lines 33) Xi+Xe, as a matter of course.

A contact plug 32 made of a conductive material is buried in each of the contact holes 30. Then, on an interlayer insulating film 31, bit lines 33 are formed. The bit lines 33 are electrically connected to the drain diffusion layers 19d of associated memory cells through the contact plugs 32.

The bit lines 33 extend in the column direction. More specifically, the control gate layers 18 and the bit lines 33 are arranged such that they intersect perpendicularly or generally perpendicularly to each other. One memory cell is provided at each of the intersections of the control gate layers 18 with the bit lines 33.

In the NAND string, two adjacent transistors (memory cells, select transistors) share a single diffusion layer 19. Also, the drain diffusion layer 19d positioned closest to the bit line 33 in the NAND string is shared by two NAND strings in the column direction, however, the drain diffusion layers 19d are independent of each other for NAND strings in the row direction. The source diffusion layer 19s extends in the row direction, and serves as a common source line. Therefore, the source diffusion layer 19s is shared not only by two NAND string in the column direction but also by a plurality of NAND strings in the row direction adjacent to the source diffusion layer 19s.

Also, in a region in which the source diffusion layer 19s is formed, no element isolation insulating material 14 is formed. In other words, the element isolation areas (element isolation insulating materials) 14, which are formed extending in the column direction, are interrupted by the source diffusion layer 19s. Also, the drain diffusion layers 19d of NAND strings existing in one column are electrically connected to each other through the bit line 33.

FIGS. 113 and 114 show the shape of contact holes (bit line contacts) 30 when the device illustrated in FIGS. 109 through 112 is actually manufactured.

Specifically, as memory cells are miniaturized and contact holes (bit line contacts) are also miniaturized, even if the contact holes are laid out in the shape of rectangle, a resist film serving as a mask is in the shape of rectangle with rounded corners (a shape resembling an ellipse), resulting in contact holes likewise in the shape of rectangle with rounded corners, which are formed by etching with the circular resist film used as a mask.

It should be noted that this embodiment is intended to explain that the contact holes may be formed not only in the shape of rectangle but also in the shape of rectangle with rounded corners.

In the device of this embodiment, the contact holes (bit line contacts) 30 likewise have a width Yn in the column direction (in the direction in which the bit lines 33 extend) larger than a width Xh in the row direction (in the direction in which the word lines 18 extend). Therefore, in this embodiment, the contact holes 30 are also formed in the shape of rectangle (or rectangle with rounded corners) so as to accomplish the feature of the line and space pattern, i.e., an improved processing margin resulting from the proximity effect, as described above in connection with the first embodiment.

Specifically, since the contact holes (bit line contacts) 30 are arranged in a line in the row direction (in the direction in which word lines 18 extend), the width Xh of the contact holes 30 in the row direction is reduced, while the width Yh of the contact holes 30 in the column direction is made longer than the width Xh in the row direction. As a result, this enables the pitch Xpitch of the contact holes 30 to be reduced and simultaneously the width Xe of the element areas and the width Xi of the element isolation areas to be reduced to approximately the minimum processing dimension available for the line and space pattern.

In addition, even when the width Xh of the contact holes 30 in the row direction is shortened, the width Yh in the column direction may be extended to prevent the contact area from being reduced, as compared with that of the conventional square contact holes, so that the contact resistance can be limited to be lower.

Further, in this embodiment, the memory cell array has the NAND cell structure. In the NAND cell structure, one contact hole (bit line contact) 30 is provided for one NAND string, and one NAND string is comprised of a plurality of memory cells connected in series in the column direction. Thus, the memory cell array in the NAND cell structure can reduce the number of contact holes arranged in the column direction, as compared with a memory cell array in the NOR cell structure.

In the present invention, the width Xh of the contact holes 30 in the row direction is reduced, while the width Yh of the contact holes 30 in the column direction is extended to reduce the number of contact holes arranged in the column direction. This means a smaller increase in the area of the memory cell array, resulting from the extension of the width Yh of the contact holes 30 in the column direction. In other words, a prominent effect is produced in the reduction in the area of the memory cell array by reducing the width Xh of the contact holes 30 in the row direction.

As described above, the effect of the present invention appears prominently when the present invention is applied to a NAND cell type non-volatile semiconductor memory device. While the effect of the reduction in area can be provided even in the NOR cell type shown in the first embodiment, the effect can be enhanced by applying expedients on the arrangement of the memory cells and the process (self-alignment contacts), later described.

[Third Embodiment]

Figure 115:
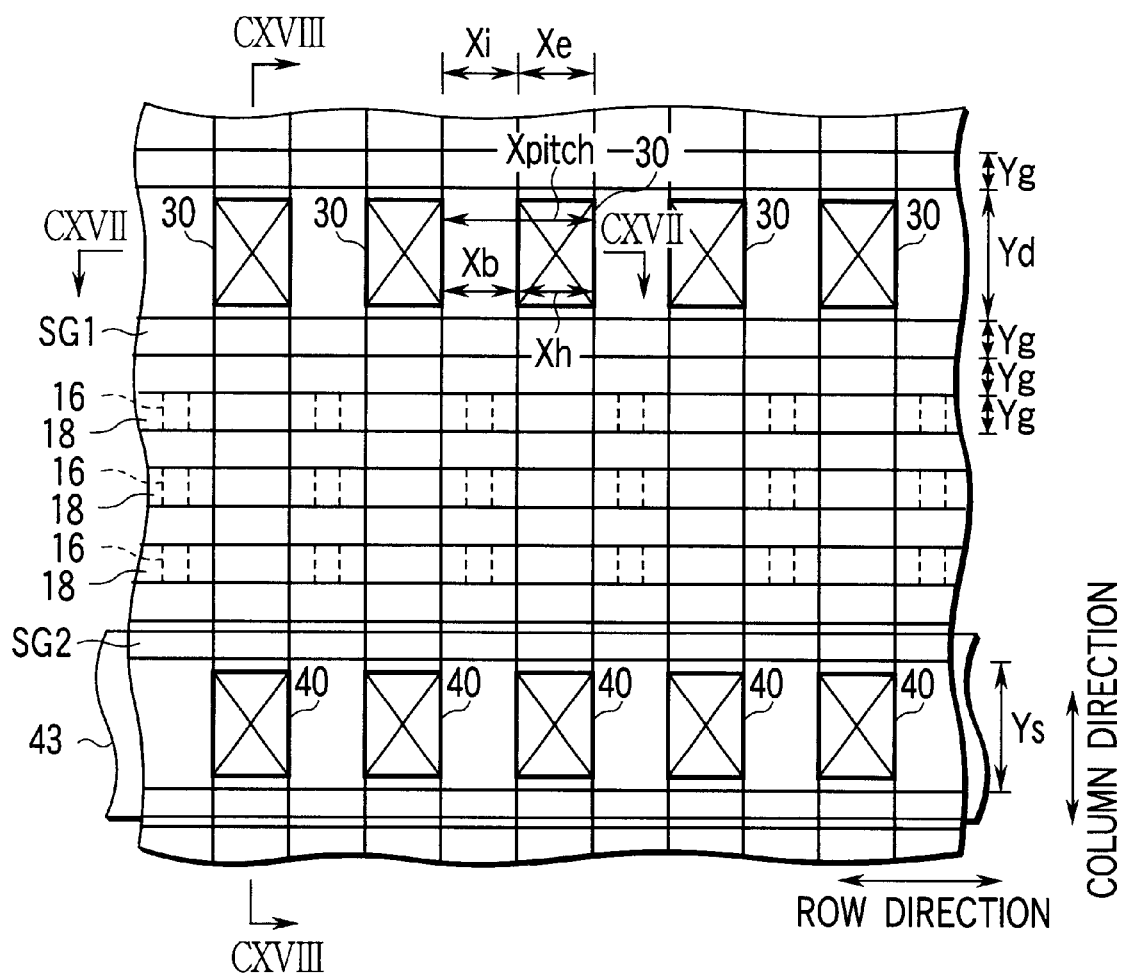
FIG. 115 is a top plan view illustrating a memory cell array of a NAND cell type non-volatile semiconductor memory device according to the present invention.

FIGS. 115 through 118 illustrates a memory cell array of a NAND cell type non-volatile semiconductor memory device according to a third embodiment of the present invention. FIGS. 115, 116A and 116B are top plan views of the memory cell array; FIG. 117 is a cross-sectional view taken along the line CXVII—CXVII in FIGS. 115 and 116B; and FIG. 118 is a cross-sectional view taken along the line CXVIII—CXVIII in FIGS. 115 and 116A.

Figure 116A:
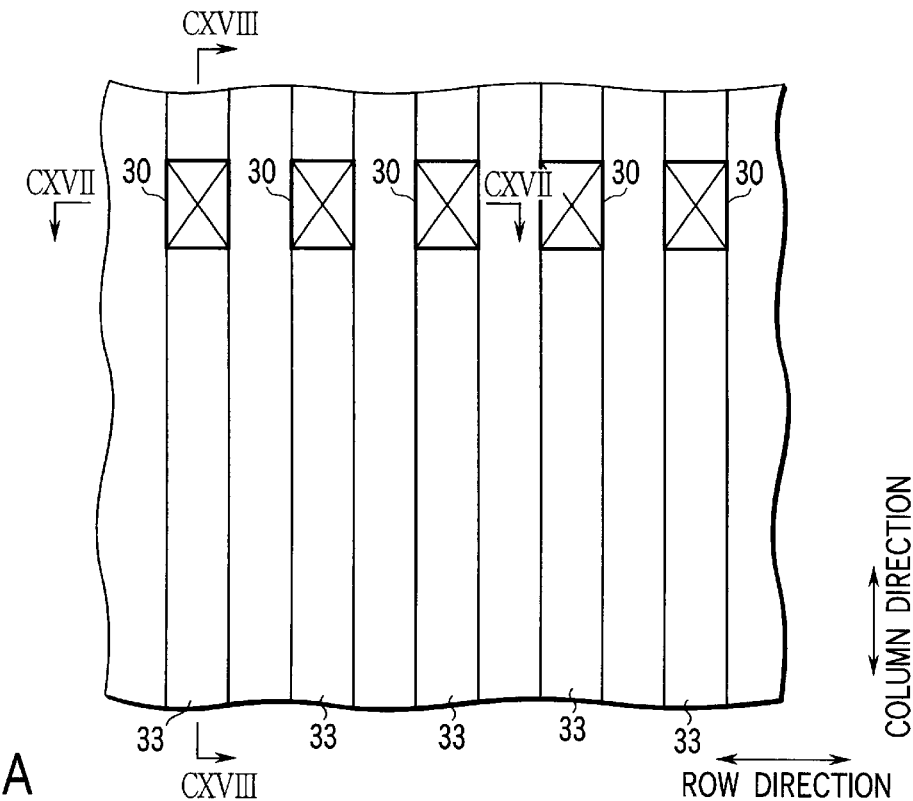
FIGS. 116A and 116B are top plans view illustrating bit lines and element isolation areas in the device in FIG. 115.
Figure 116B:
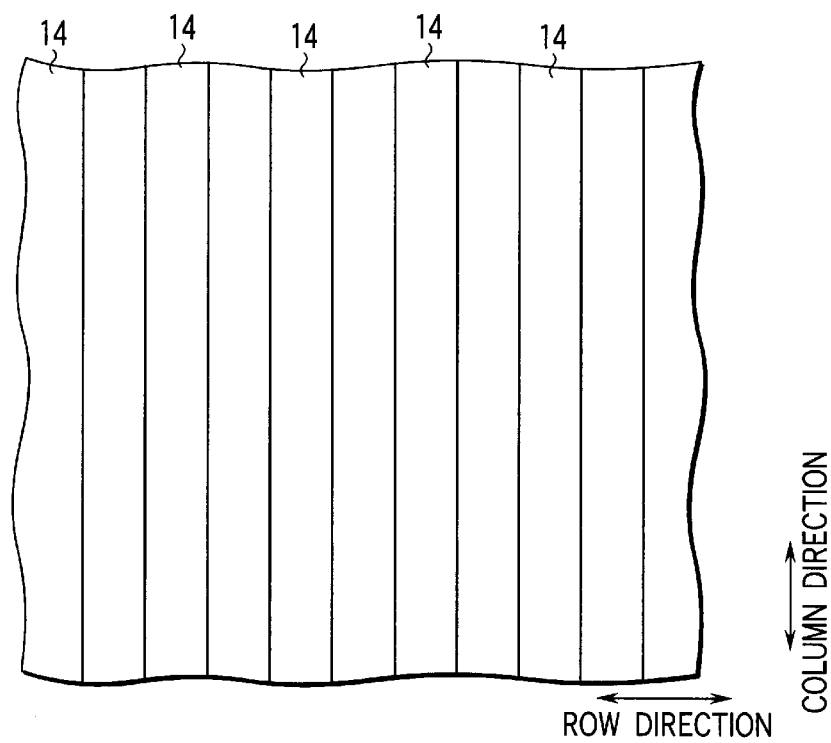

It should be noted that for facilitating the understanding of the figures, FIG. 115 omits a wiring layer in which bit lines are formed; FIG. 116A shows only the wiring layer in which the bit lines are formed; and FIG. 116B shows only element isolation insulating materials (element isolation areas) 14 and element areas sandwiched therebetween.

While this embodiment is described in connection with a memory cell array comprised of memory cells in the stacked gate structure, it goes without saying that the present invention can of course be applied to memory cells in the single gate structure.

A memory cell array of a NAND cell type has a structure in which a plurality of NAND strings (or NAND cell units) are connected to bit lines. One NAND string is comprised of a plurality of memory cells connected in series, and a pair of select transistors, each of which is connected to one of both ends of the NAND string.

In the following, a specific device structure will be described.

An N-well region 12 and a P-well region 13 are formed in a P-type silicon substrate 11. Memory cells and select transistors are formed in the P-type well region 13. However, the memory cells and select transistors may be formed in the silicon substrate 11. The silicon substrate 11 is also formed with trenches for element isolation, and an insulating material (for example, silicon oxide) 14 for element isolation is buried in the trenches.

In this embodiment, the trenches for providing an STI structure are linearly formed in the column direction without interruptions (see FIG. 116B). In other words, the element isolation areas (element isolation insulating materials) 14 are patterned completely in the shape of lines and spaces in a memory cell array area, thereby making it possible to improve the accuracy of processing control and dimension control in the element isolation areas and the element areas.

This is the result of providing a common source line 43 on the silicon substrate 11, as described later. Consequently, a source diffusion layer 19s in the silicon substrate 11 is not shared by NAND strings in the row direction (but is shared by two NAND strings adjoining in the column direction).

In the aforementioned second embodiment (FIGS. 109 through 114), the common source line extending in the row direction is formed in the silicon substrate 11 as the N-type diffusion layer 19s and shared by a plurality of NAND strings in the row direction, so that the element isolation areas extending in the column direction are interrupted by the common source line. Therefore, as a whole, a plurality of rectangular element isolation areas are regularly arranged in the memory cell array area.

An area sandwiched by the element isolation insulating materials 14 serves as an element area. A thin tunnel insulating film (for example, made of silicon oxide) 15 is formed on the silicon substrate 11 (P-well region 13) in the element area such that a micro-tunnel current can be applied therethrough during writing/erasing operations.

A charge transfer layer 16 is formed on the tunnel insulating film 15. The charge transfer layer 16 is made of an electrically floating conductive layer (for example, a polysilicon layer including impurities).

A control gate layer 18 is formed on the charge transfer layer 16 through an intergate insulating layer 17. Since the charge transfer layer 16 is capacitively coupled to the control gate layer 18, variations in potential on the control gate layer 18 cause like variations in potential on the charge transfer layer 16.

Since the charge transfer layer 16 and the control gate layer 18 are simultaneously processed in a self-alignment, their side edges are in alignment with each other in a direction (column direction) perpendicular to a direction (row direction) in which the control gate layer (word lines) 18 extends. Also, the side edge of the charge transfer layer 16 in the row direction exists on the element isolation insulating material 14.

In the element area, a surface area of the silicon substrate 11 beneath the charge transfer layer 16 serves as a channel region. N-type diffusion layers (a source region or a drain region) 19 are also formed on both sides of the channel region.

The stacked gate structure is employed for the select transistors in a manner similar to the memory cells. However, the select transistors do not have a charge transfer layer, and for example, have an upper gate and a lower gate connected to each other to function as single gate electrode (select gate line) SG1 or SG2.

A control gate layer (word lines) 18 and the select gate lines SG1, SG2 of memory cells extends in a row direction. An interlayer insulating film (made, for example, of silicon oxide) 31 is formed on the memory cells for overlying the memory cells. The interlayer insulating layer 31 is formed with contact holes (bit line contacts) 30 which reach a drain diffusion layer 19d of the NAND strings.

The interlayer insulating film 31 is also formed with contact holes (source line contacts) 40 which reach the source diffusion layer 19s of the NAND strings.

The contact holes 30, 40 are formed in the shape of rectangle instead of square. In this embodiment, a width Yh of the contact holes 30, 40 in a column direction (in a direction in which bit lines 33 extend) is larger than a width Xh of the contact holes 30, 40 in a row direction (in a direction in which the word lines 18 extend).

The contact holes 30 are arranged in a line in the row direction with their pitch Xpitch being equal to the width Xh of the contact holes 30 in the row direction plus a spacing Xb between the adjacent contact holes 30. Similarly, the contact holes 40 are arranged in a line in the row direction, with its pitch Xpitch being equal to the width Xh of the contact holes 40 in the row direction plus a spacing Xb between the adjacent contact holes 40.

Also, the pitch Xpitch of the contact holes 30, 40 is equal to a repeating pitch of element areas and element isolation areas (a pitch of bit lines 33) Xi+Xe, as a matter of course. This is because the positions of the contact holes 30, 40 are corresponded to the positions of the source/drain diffusion layers 19s, 19d.

The size of the contact holes 30 and the size of the contact holes 40 are preferably set equal to each other in consideration of the processing controllability and reliability. However, since the effect of the present invention can be provided as long as the contact holes are rectangular in shape, it goes without saying that both the contact holes may be different in size from each other.

A contact plug 32 made of a conductive material is buried in each of the contact holes 30. Similarly, a contact plug 42 made of a conductive material is buried in each of the contact holes 40. Then, the interlayer insulating film 31 is formed thereon with a common source line 43 which is electrically connected to the source diffusion layer 19s of the NAND strings.

The common source line 43 is made, for example, of a refractory metal (tungsten or the like), polysilicon including impurities, a stacked structure comprised of these materials.

An interlayer insulating film (for example, silicon oxide) 41 overlying the common source line 43 is also formed on the interlayer insulating film 31. The interlayer insulating film 41 is formed with contact holes 44 which reach the contact plugs 32.

Similarly to the contact holes 30, the contact holes 44 are formed in the shape of rectangle. In other words, the contact holes 44 have a width in the column direction (in the direction in which the bit lines 33 extend) larger than a width in the row direction (in the direction in which the word lines 18 extend).

Since the contact holes 44 are formed on the memory cells, they are not particularly limited with respect to the width in the column direction. Therefore, the major side (the width in the column direction) of the contact holes 44 may be made longer than the width Yh of the contact holes 30 in the column direction to form further elongated contact holes. Alternatively, the size of the contact holes 44 may be of course set equal to the size of the contact holes 30.

Since the contact holes 44 are also arranged in a line in the row direction in a manner similar to the contact holes 30, their pitch is equal to the pitch Xpitch of the contact holes 30. In other words, the width of the contact holes 44 in the row direction and a spacing between the adjacent contact holes 44 are equal to the width Xh of the contact holes 30 in the row direction and the spacing Xb between the adjacent contact holes 30, respectively.

A contact plug 45 made of a conductive material is buried in each of the contact holes 44. Bit lines 33 are formed on the interlayer insulating layer 41. The bit lines 33 are electrically connected to the drain diffusion layers 19d of associated memory cells through the contact plugs 32, 45.

In this embodiment, the contact holes 30 and the contact holes 44 on the drain diffusion layer 19d are formed separately through different steps, respectively. Alternatively, both the contact holes may be formed as a single type of contact holes simultaneously through the same steps. In this case, of course, both the contact holes 30, 44 have the same size, and the contact plugs 32, 45 are also formed simultaneously, and integrated as single contact plugs.

Figure 119:
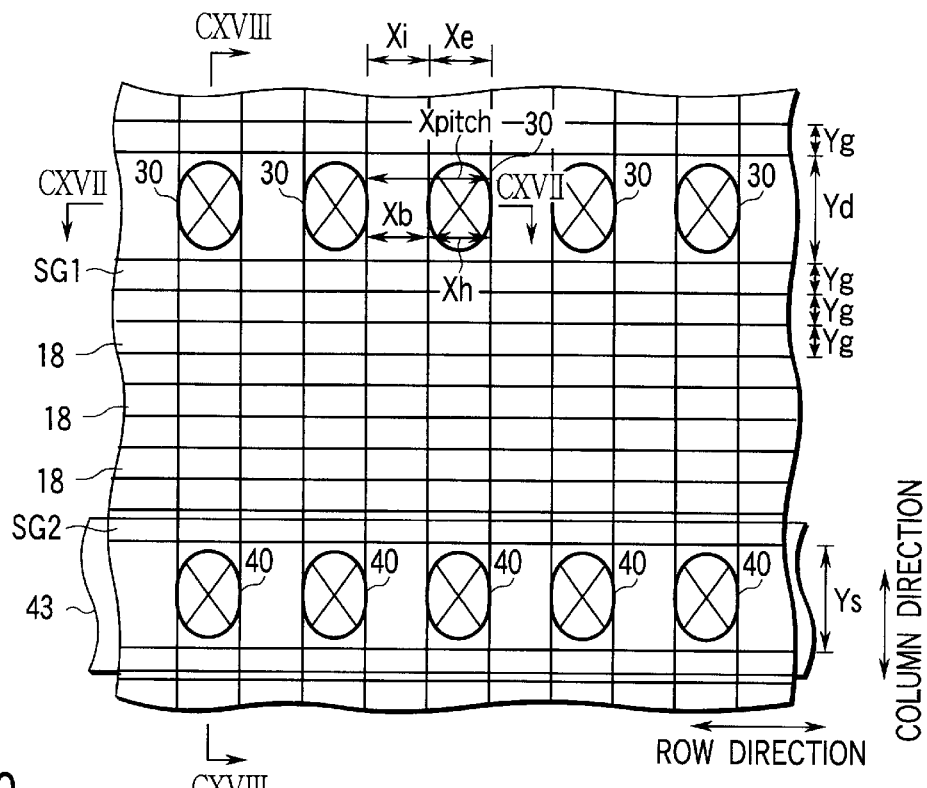
Figure 120:
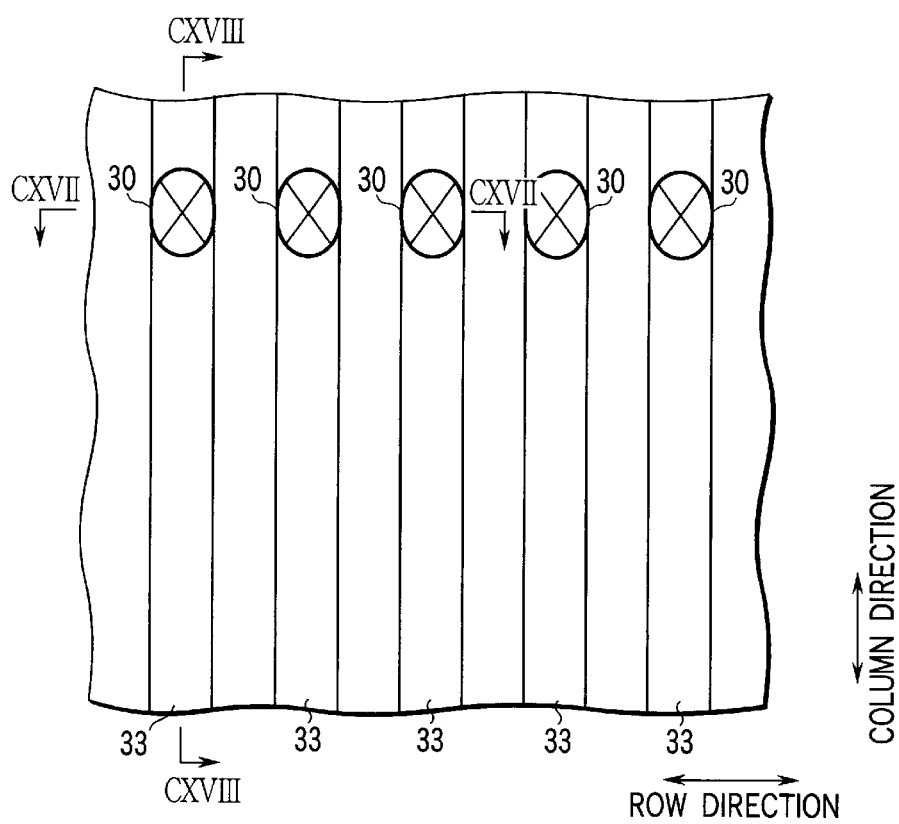

FIGS. 119 and 120 show the shape of contact holes (bit line contacts) 30, 40 when the device illustrated in FIGS. 115 through 118 is actually manufactured.

Specifically, as the memory cells are miniaturized and the contact holes (bit line contacts) 30 and the contact holes (source line contacts) 40 are also miniaturized, even if the contact holes 30, 40 are laid out in the shape of rectangle, a resist film serving as a mask is in the shape of rectangle with rounded corners (a shape resembling an ellipse), resulting in contact holes 30, 40 likewise in the shape of rectangle with rounded corners, which are formed by etching with the circular resist film used as a mask.

It should be noted that this embodiment is intended to explain that the contact holes 30, 40 may be formed not only in the shape of rectangle but also in the shape of rectangle with rounded corners.

In the device of this embodiment, the contact holes 30, 40 likewise have a width Yn in the column direction (in the direction in which the bit lines 33 extend) larger than a width Xh in the row direction (in the direction in which the word lines 18 extend). Therefore, in this embodiment, the contact holes 30, 40 are also formed in the shape of rectangle (or rectangle with rounded corners) so as to accomplish the feature of the line and space pattern, i.e., an improved processing margin resulting from the proximity effect, as described above in connection with the first and second embodiments.

Specifically, since the contact holes 30, 40 are arranged in a line in the row direction (in the direction in which word lines 18 extend), the width Xh of the contact holes 30, 40 in the row direction is reduced, while the width Yh of the contact holes 30, 40 in the column direction is made longer than the width Xh in the row direction. As a result, this enables the pitch Xpitch of the contact holes 30, 40 to be reduced and simultaneously the width Xe of the element areas and the width Xi of the element isolation areas to be reduced to approximately the minimum processing dimension available for the line and space pattern.

In addition, even when the width Xh of the contact holes 30, 40 in the row direction is shortened, the width Yh in the column direction may be extended to prevent the contact area from being reduced, as compared with that of the conventional square contact holes, so that the contact resistance can be limited to be lower.

Further, in this embodiment, the memory cell array has the NAND cell structure. In the NAND cell structure, one contact hole (bit line contact) 30 and one contact hole (source line contact) 40 are provided for one NAND string. Thus, the memory cell array in the NAND cell structure can reduce the number of contact holes arranged in the column direction, as compared with a memory cell array in the NOR cell structure.

In the present invention, the width Xh of the contact holes 30, 40 in the row direction is reduced, while the width Yh of the contact holes 30, 40 in the column direction is extended to reduce the number of contact holes arranged in the column direction. This means a smaller increase in the area of the memory cell array, resulting from the extension of the width Yh of the contact holes 30, 40 in the column direction. In other words, a prominent effect is produced in the reduction in the area of the memory cell array by reducing the width Xh of the contact holes 30, 40 in the row direction.

Further, in the present invention, the common source line 43 made of a metal (including a refractory metal) or polysilicon is provided on the silicon substrate 11 without providing the common source line in the silicon substrate 11. Therefore, the element isolation areas (element isolation insulating materials) 14 can be patterned completely in the shape of lines and spaces in a memory cell array area within the silicon substrate 11, thereby making it possible to improve the accuracy of dimension control and processing control. It is further possible to reduce the resistance of the common source line.

[Fourth Embodiment]

Figure 121:
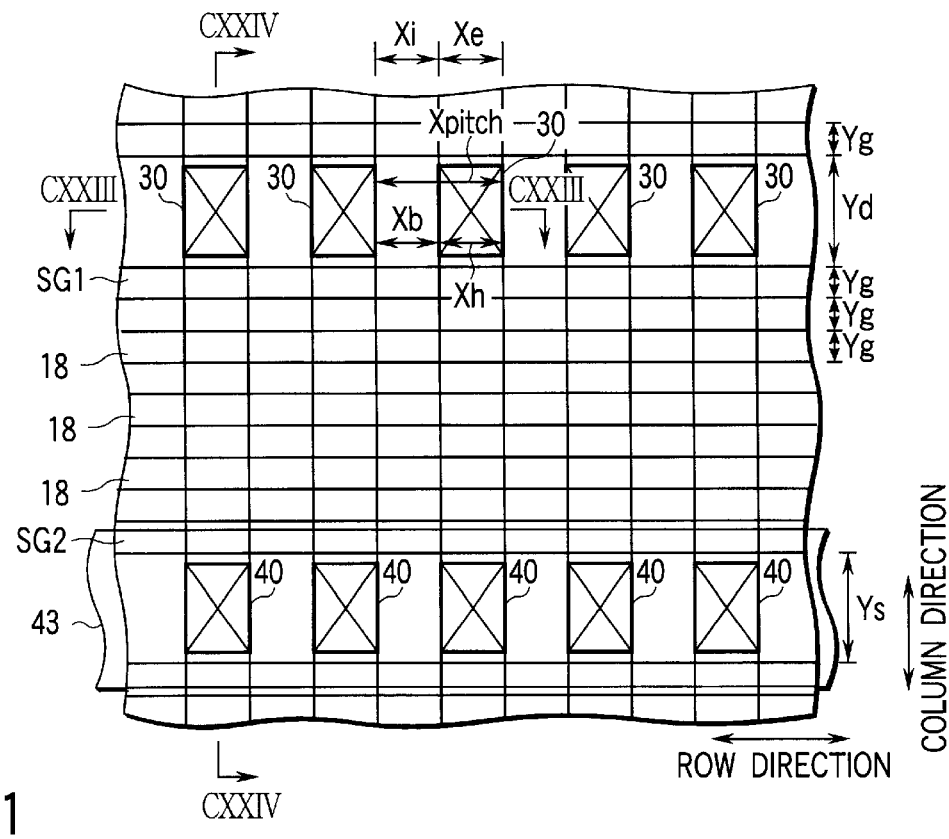
Figure 122:
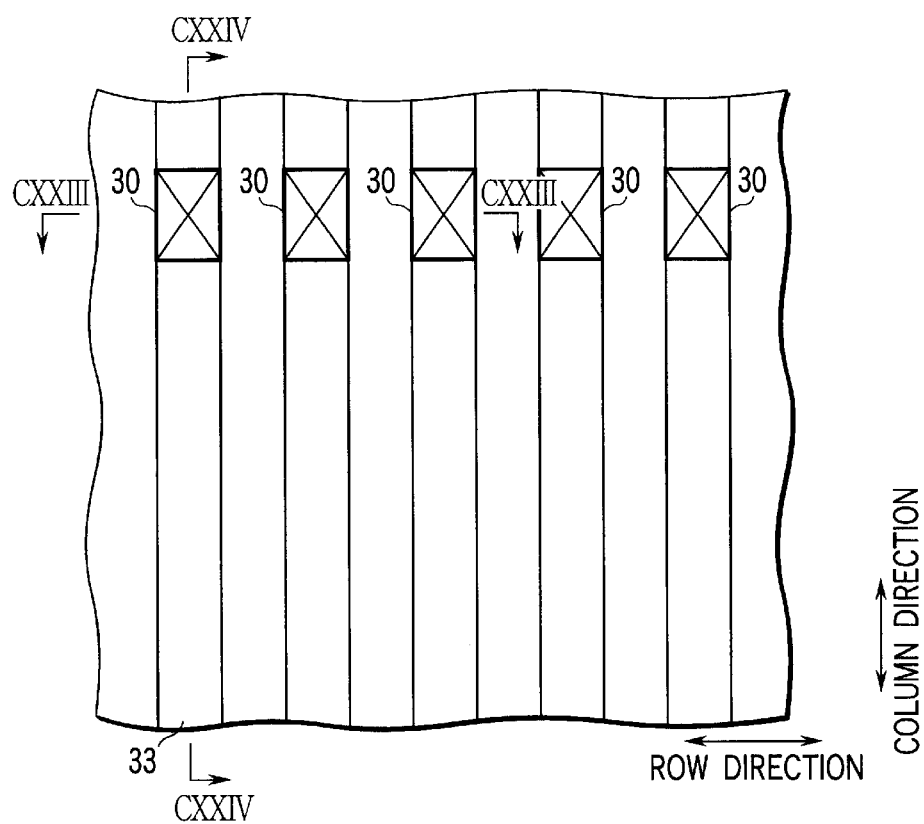

FIGS. 121 through 126 illustrate a memory cell array of a NAND cell type non-volatile semiconductor memory device according to a fourth embodiment of the present invention. FIGS. 121 and 122 are top plan views of the memory cell array; FIG. 123 is a cross-sectional view taken along the line CXXIII—CXXIII in FIGS. 121 and 122; and FIG. 124 is a cross-sectional view taken along the line CXXIV—CXXIV in FIGS. 121 and 122.

It should be noted that for facilitating the understanding of the figures, FIG. 121 omits a wiring layer in which bit lines are formed, and FIG. 122 shows only the wiring layer in which the bit lines are formed. In other words, the bit lines shown in FIG. 122 are formed on the device of FIG. 121.

The device of this embodiment differs from the device of the aforementioned third embodiment (FIGS. 115 through 120) in the structure of the memory cells and the select transistors. The rest of aspects are completely the same. Specifically, in this embodiment, the memory cells and the select transistors are comprised of single gate type MOS transistors.

In the following, a specific device structure will be described.

An N-well region 12 and a P-well region 13 are formed in a P-type silicon substrate 11. Memory cells and select transistors are formed in the P-type well region 13. The silicon substrate 11 is also formed with trenches for element isolation, and an insulating material (for example, silicon oxide) 14 for element isolation is buried in the trench.

The trenches for providing an STI structure are linearly formed in the column direction without interruptions (see FIG. 116B). In other words, the element isolation areas (element isolation insulating materials) 14 are patterned completely in the shape of lines and spaces in a memory cell array area, thereby making it possible to improve the accuracy of processing control and dimension control in the element isolation areas and the element areas.

An area sandwiched by the element isolation insulating materials 14 serves as an element area. A thin tunnel insulating film (for example, made of silicon oxide) 15 is formed on the silicon substrate 11 (P-well region 13) in the element area such that a micro-tunnel current can be applied therethrough during writing/erasing operations. The thickness of the tunnel insulating film 15 is set, for example, to approximately several nm.

A charge holding insulating film 51 is formed on the tunnel insulating layer 51. The charge holding insulating layer 51 is made, for example, of silicon nitride of several tens of nm in thickness. A charge trap level is formed on the interface between the tunnel insulating film 15 and the charge holding insulating film 51, such that the state of a memory cell is determined by the amount of charges trapped at this charge trap level.

A control gate layer (word lines) 52 and select gate lines SG1, SG2 are formed on the charge holding insulating film 51. In the element area, a surface area of the silicon substrate 11 beneath the control gate layer 52 is a channel region. N-type diffusion layers (a source region or a drain region) 19 are formed on both sides of the channel region. Surface areas of the silicon substrate 11 beneath the select gate lines SG1, SG2 are also channel regions. N-type diffusion layers 19, 19s, 19d are formed on both sides of the channel regions.

A control gate layer (word lines) 18 and the select gate lines SG1, SG2 of memory cells extend in a row direction. An interlayer insulating film (made, for example, of silicon oxide) 31 is formed on the memory cells for overlying the memory cells. The interlayer insulating layer 31 is formed with contact holes (bit line contacts) 30 which reach a drain diffusion layer 19d of the NAND strings.

The interlayer insulating film 31 is also formed with contact holes (source line contacts) 40 which reach the source diffusion layer 19s of the NAND strings.

The contact holes 30, 40 are formed in the shape of rectangle instead of square. In this embodiment, a width Yh of the contact holes 30, 40 in a column direction (in a direction in which bit lines 33 extend) is larger than a width Xh of the contact holes 30, 40 in a row direction (in a direction in which the word lines 18 extend).

The contact holes 30 are arranged in a line in the row direction with their pitch Xpitch being equal to the width Xh of the contact holes 30 in the row direction plus a spacing Xb between the adjacent contact holes 30. Similarly, the contact holes 40 are arranged in a line in the row direction, with its pitch Xpitch being equal to the width Xh of the contact holes 40 in the row direction plus a spacing Xb between the adjacent contact holes 40.

Also, the pitch Xpitch of the contact holes 30, 40 is equal to a repeating pitch of element areas and element isolation areas (a pitch of the bit lines 33) Xi+Xe, as a matter of course. This is because the positions of the contact holes 30, 40 are corresponded to the positions of the source/drain diffusion layers 19s, 19d.

The size of the contact holes 30 and the size of the contact holes 40 are preferably set equal to each other in consideration of the processing controllability and reliability. However, since the effect of the present invention can be provided as long as the contact holes are rectangular in shape, it goes without saying that both the contact holes may be different in size from each other.

A contact plug 32 made of a conductive material is buried in each of the contact holes 30. Similarly, a contact plug 42 made of a conductive material is buried in each of the contact holes 40. Then, the interlayer insulating film 31 is formed thereon with a common source line 43 which is electrically connected to the source diffusion layer 19s of the NAND strings.

An interlayer insulating film (for example, silicon oxide) 41 overlying the common source line 43 is also formed on the interlayer insulating film 31. The interlayer insulating film 41 is formed with contact holes 44 which reach the contact plugs 32.

Similarly to the contact holes 30, the contact holes 44 are formed in the shape of rectangle. In other words, the contact holes 44 have a width in the column direction (in the direction in which the bit lines 33 extend) larger than a width in the row direction (in the direction in which the word lines 18 extend).

Since the contact holes 44 are formed on the memory cells, they are not particularly limited with respect to the width in the column direction. Therefore, the major side (the width in the column direction) of the contact holes 44 may be made longer than the width Yh of the contact holes 30 in the column direction to form further elongated contact holes. Alternatively, the size of the contact holes 44 may be of course set equal to the size of the contact holes 30.

Since the contact holes 44 are also arranged in a line in the row direction in a manner similar to the contact holes 30, their pitch is equal to the pitch Xpitch of the contact holes 30. In other words, the width of the contact holes 44 in the row direction and a spacing between the adjacent contact holes 44 are equal to the width Xh of the contact holes 30 in the row direction and the spacing Xb of the adjacent contact holes 30, respectively.

A contact plug 45 made of a conductive material is buried in each of the contact holes 44. Bit lines 33 are formed on the interlayer insulating layer 41. The bit lines 33 are electrically connected to the drain diffusion layers 19d of associated memory cells through the contact plugs 32, 45.

Also in this embodiment, while the contact holes 30 and the contact holes 44 on the drain diffusion layer 19d are formed separately through different steps, respectively, both the contact holes may be formed as a single type of contact holes simultaneously through the same steps. In this case, both the contact holes 30, 44 of course have the same size, and the contact plugs 32, 45 are also formed simultaneously, and integrated as single contact plugs.

FIGS. 125 and 126 show the shape of contact holes (bit line contacts) 30, 40 when the device illustrated in FIGS. 121 through 124 is actually manufactured.

Specifically, as the memory cells are miniaturized and the contact holes (bit line contacts) 30 and the contact holes (source line contacts) 40 are also miniaturized, even if the contact holes 30, 40 are laid out in the shape of rectangle, a resist film serving as a mask is in the shape of rectangle with rounded corners (a shape resembling an ellipse), resulting in contact holes 30, 40 likewise in the shape of rectangle with rounded corners, which are formed by etching with the circular resist film used as a mask.

It should be noted that this embodiment is intended to explain that the contact holes 30, 40 may be formed not only in the shape of rectangle but also in the shape of rectangle with rounded corners.

As described above, the device of this embodiment differs from the third embodiment only in the structure of the memory cells and the select transistors, so that the device of this embodiment can provide similar effects to those of the third embodiment, as a matter of course.

[Fifth Embodiment]

FIGS. 127 through 132 illustrates a memory cell array of a NAND cell type non-volatile semiconductor memory device according to a fifth embodiment of the present invention. FIGS. 127 and 128 are top plan views of the memory cell array; FIG. 129 is a cross-sectional view taken along the line CXXIX—CXXIX in FIGS. 127 and 128; and FIG. 130 is a cross-sectional view taken along the line CXXX—CXXX in FIGS. 127 and 128.

It should be noted that for facilitating the understanding of the figures, FIG. 127 omits a wiring layer in which bit lines are formed, and FIG. 128 shows only the wiring layer in which the bit lines are formed. In other words, the bit lines shown in FIG. 128 are formed on the device of FIG. 127.

As compared with the device of the aforementioned third embodiment (FIGS. 115 through 120), the device of this embodiment features that a so-called self-aligned contact technology is applied to a step of manufacturing contact holes 30, 40 by relying on the self alignment to determine the positions of the contact holes 30, 40 in the column direction.

In the following, a specific device structure will be described.

An N-well region 12 and a P-well region 13 are formed in a P-type silicon substrate 11. Memory cells and select transistors are formed in the P-type well region 13. The silicon substrate 11 is also formed with trenches for element isolation, and an insulating material (for example, silicon oxide) 14 for element isolation is buried in the trench.

In this embodiment, the trenches for providing an STI structure are linearly formed in the column direction without interruptions (see FIG. 116B). In other words, the element isolation areas (element isolation insulating materials) 14 are patterned completely in the shape of lines and spaces in a memory cell array area, thereby making it possible to improve the accuracy of processing control and dimension control in the element isolation areas and the element areas.

An area sandwiched by the element isolation insulating materials 14 serves as an element area. A thin tunnel insulating film (for example, made of silicon oxide) 15 is formed on the silicon substrate 11 (P-well region 13) in the element area such that a micro-tunnel current can be applied therethrough during writing/erasing operations.

A charge transfer layer 16 is formed on the tunnel insulating film 15. The charge transfer layer 16 is made of an electrically floating conductive layer (for example, a polysilicon layer including impurities).

A control gate layer 18 is formed on the charge transfer layer 16 through an intergate insulating layer 17. Since the charge transfer layer 16 is capacitively coupled to the control gate layer 18, variations in potential on the control gate layer 18 cause like variations in potential on the charge transfer layer 16.

Since the charge transfer layer 16 and the control gate layer 18 are simultaneously processed in a self-alignment, their side edges are in alignment with each other in a direction (column direction) perpendicular to a direction (row direction) in which the control gate layer (word lines) 18 extends. Also, the side edge of the charge transfer layer 16 in the row direction exists on the element isolation insulating material 14.

In the element area, a surface area of the silicon substrate 11 beneath the charge transfer layer 16 serves as a channel region. N-type diffusion layers (a source region or a drain region) 19 are also formed on both sides of the channel region.

The stacked gate structure is employed for the select transistors in a manner similar to the memory cells. However, the select transistors do not have a charge transfer layer, and for example, have an upper gate and a lower gate connected to each other to function as single gate electrode (select gate line) SG1 or SG2.

The charge transfer layer 16, the control gate layer (word line) 18 and the select gate lines SG1, SG2 of the memory cells are overlain by an insulating film (for example, silicon nitride) 60 made of a material having an etching selectivity for an interlayer insulating film (for example, silicon oxide) 31.

The interlayer insulating film (for example, silicon oxide) 31 completely overlying the memory cells is formed on the insulating film 60. Then, the interlayer insulating layer 31 is formed with contact holes (bit line contacts) 30 which reach a drain diffusion layer 19d of the NAND strings. The interlayer insulating film 31 is also formed with contact holes (source line contacts) 40 which reach the source diffusion layer 19s of the NAND strings.

The contact holes 30, 40 are formed in the shape of rectangle instead of square. In this embodiment, a width Yh of the contact holes 30, 40 in a column direction (in a direction in which bit lines 33 extends) is larger than a width Xh of the contact holes 30, 40 in a row direction (in a direction in which the word line 18 extends).

The contact holes 30 are arranged in a line in the row direction with their pitch Xpitch being equal to the width Xh of the contact holes 30 in the row direction plus a spacing Xb between the adjacent contact holes 30. Similarly, the contact holes 40 are arranged in a line in the row direction, with its pitch Xpitch being equal to the width Xh of the contact holes 40 in the row direction plus a spacing Xb between the adjacent contact holes 40.

Also, the pitch Xpitch of the contact holes 30, 40 is equal to a repeating pitch of element areas and element isolation areas (a pitch of the bit lines 33) Xi+Xe, as a matter of course. This is because the positions of the contact holes 30, 40 are corresponded to the positions of the source/drain diffusion layers 19s, 19d.

The size of the contact holes 30 and the size of the contact holes 40 are preferably set equal to each other in consideration of the processing controllability and reliability. However, since the effect of the present invention can be provided as long as the contact holes are rectangular in shape, it goes without saying that both the contact holes may be different in size from each other.

An important aspect in this embodiment lies in that while the width of the contact holes 30, 40 in the column direction is set to Yh1, the employment of the self-aligned contact technology allows the width Yh2 of the bottoms of the contact holes 30, 40 in the column direction to be narrower than Yh1 (although Yh1 must be larger than Xh, Yh2 may be larger than, smaller than or equal to Xh).

Specifically, according to this embodiment, Yh1 is chosen to be sufficiently larger than Xh to improve the accuracy of dimension control and processing control for the contact holes 30, 40 by virtue of the proximity effect during exposure. In addition, the pitch Xpitch of the contact holes 30, 40 in the row direction can be reduced to contribute to a reduction in the size of the memory cell array in the row direction.

Further, since this embodiment employs the self-aligned contact technology, the width Yh2 of the bottoms of the contact holes 30, 40 in the column direction is narrower than Yh1. It is therefore possible to reduce the spacing between the adjacent select gate lines SG1 on the source side and contribute to a reduction in the size of the memory cell array in the column direction as well.

It goes without saying that the self-aligned contact technology as described above can be applied to the devices of the aforementioned first, second and fourth embodiments.

A contact plug 32 made of a conductive material is buried in each of the contact holes 30. Similarly, a contact plug 42 made of a conductive material is buried in each of the contact holes 40. Then, the interlayer insulating film 31 is formed thereon with a common source line 43 which is electrically connected to the source diffusion layer 19s of the NAND strings.

The common source line 43 is made, for example, of a refractory metal (tungsten or the like), polysilicon including impurities, a stacked structure comprised of these materials.

An interlayer insulating film (for example, silicon oxide) 41 overlying the common source line 43 is also formed on the interlayer insulating film 31. The interlayer insulating film 41 is formed with contact holes which reach the contact plugs 32.

Similarly to the contact holes 30, the contact holes 44 are also formed in the shape of rectangle. In other words, the contact holes 44 have a width in the column direction (in the direction in which the bit lines 33 extend) larger than a width in the row direction (in the direction in which the word lines 18 extend).

Since the contact holes 44 are formed on the memory cells, they are not particularly limited with respect to the width in the column direction, as is the case of the aforementioned third and fourth embodiments.

A contact plug 45 made of a conductive material is buried in each of the contact holes 44. Bit lines 33 are formed on the interlayer insulating layer 41. The bit lines 33 are electrically connected to the drain diffusion layers 19d of associated memory cells through the contact plugs 32, 45.

In this embodiment, the contact holes 30 and the contact holes 44 on the drain diffusion layer 19d are formed separately through different steps, respectively. Alternatively, both the contact holes may be formed as a single type of contact holes simultaneously through the same steps. In this case, of course, both the contact holes 30, 44 have the same size, and the contact plugs 32, 45 are also formed simultaneously, and integrated as single contact plugs.

FIGS. 131 and 132 show the shape of contact holes (bit line contacts) 30, 40 when the device illustrated in FIGS. 127 through 130 is actually manufactured.

Specifically, as the memory cells are miniaturized and the contact holes (bit line contacts) 30 and the contact holes (source line contacts) 40 are also miniaturized, even if the contact holes 30, 40 are laid out in the shape of rectangle, a resist film serving as a mask is in the shape of rectangle with rounded corners (a shape resembling an ellipse), resulting in the contact holes 30, 40 likewise in the shape of rectangle with rounded corners, which are formed by etching with the circular resist film used as a mask.

It should be noted that this embodiment is intended to explain that the contact holes 30, 40 may be formed not only in the shape of rectangle but also in the shape of rectangle with rounded corners.

The device of this embodiment can also provide similar effects to the devices the aforementioned firth through fourth embodiments.

In addition, since this embodiment employs the self-aligned contact technology, the width Yh2 of the bottoms of the contact holes 30, 40 in the column direction is narrower than the width Yh1 of the tops of the contact holes 30, 40 in the column direction.

Specifically, according to this embodiment, Yh1 is chosen to be sufficiently larger than Xh to improve the accuracy of dimension control and processing control for the contact holes 30, 40 by virtue of the proximity effect during exposure. In addition, the pitch Xpitch of the contact holes 30, 40 in the row direction can be reduced to contribute to a reduction in the size of the memory cell array in the row direction.

Further, in this embodiment, the width Yh2 of the bottoms of the contact holes 30, 40 in the column direction is narrower than the width Yh1 of the tops of the contact holes 30, 40 in the column direction. It is therefore possible to reduce the spacing between the adjacent select gate lines SG1 on the source side and contribute to a reduction in the size of the memory cell array in the column direction as well.

[Relationship between Xh and Yh]

The present invention has been described in connection with the first through fifth embodiments. According to the present invention, the contact holes are formed in the shape of rectangle (including the shape of rectangle with rounded corners. The same is also applied to the following description) (Xh<Yh), the minor side Xh can be made shorter than the dimension of one side of a contact hole when it is square.

Experimentally, assuming, for example, that the same exposure technique is used, when a minimum exposure dimension in a line and space pattern (simple repeating pattern) is 0.2 $\mu$m, a minimum exposure dimension for a square contact hole is 0.3 $\mu$m.

Therefore, even if the minimum available dimension of one side of a square contact hole is limited to 0.3 $\mu$m, a rectangular contact hole (ultimately, a line pattern), if employed, can reduce the dimension of an available minor side to 0.2 $\mu$m at maximum (approximately 66% of the dimension of one side of the square contact hole).

Similarly, assuming that the same exposure technique is used, experimentally, when a minimum exposure dimension of a line and space pattern (simple repeating pattern) is 0.13 $\mu$m, a minimum exposure dimension of a square contact hole is 0.2 $\mu$m.

Therefore, even with the minimum available dimension of one side of a square contact hole limited to 0.2 $\mu$m, when a rectangular contact hole (ultimately, a line pattern) is employed, the dimension of an available minor side can be reduced to 0.13 m (approximately 66% of the dimension of one side of the square contact hole) at maximum.

In this way, according to the present invention, the employment of a rectangular contact hole can reduce the minor side Xh thereof to approximately 66% (approximately ⅔ times) of one side of an available minimum square contact hole at maximum. Since the reduction in the hole dimension can lead to a reduction in the pitch of the contact holes, i.e., the pitch (period) of the element areas and the element isolation areas in a repeating pattern, a significant reduction in the area of the memory cell array area can be accomplished.

Specifically, taking the row direction (in which the word lines extend) into consideration, the effect of reducing the area of the memory cell array area is maximized when the length of one side of the square contact holes is reduced to approximately 66% (approximately ⅔ times) to make the contact holes in the shape of a rectangle which is longer in the column direction (in the direction in which the bit lines extend), i.e., Yh is approximately 1.5 times (approximately ³⁄₂ times) as long as Xh (assume that the side of the contact hole in the column direction remains unchanged).

However, supposing that the minor side Xh of the rectangular contact hole is reduced to approximately 66% (approximately ⅔ times) of the dimension of one side of the available square contact hole, if the major side Yh is maintained equal to the dimension of one side of the available square contact hole (fixed amount), the contact area of the rectangular contact hole is reduced by approximately 66% as compared with the square contact hole, resulting in an increase in the contact resistance of the rectangular contact hole to approximately 1.5 times (approximately ³⁄₂ times) the contact resistance of the square contact hole.

Therefore, after the minor side Xh ends up to a minimum value (the minimum exposure dimension for the line and space pattern), the major side Yh may be increased beyond the minimum dimension of the available square contact hole to limit the increase in the contact resistance.

For example, if only the dimension of the square contact hole in the row direction (X-direction) is reduced to approximately 66% (approximately ⅔ times), the contact area is also reduced to approximately 66% (approximately ⅔ times), so that the contact resistance is increased to approximately ³⁄₂ times.

Therefore, to maintain the same contact resistance as that of the square contact hole, it is necessary to increase the dimension of the rectangular contact hole in the column direction (Y-direction) approximately ³⁄₂ times. In this case, Yh is approximately 2.25 times ({³⁄₂}/{⅔}={⁹⁄₄} times) as long as Xh.

Also, variations in processing during manufacturing make it difficult to accomplish complete matching of Yh with Xh multiplied by 2.25. Thus, in consideration of such variations in processing during manufacturing, the effect of reducing the area can be maximally demonstrated without increasing the contact resistance when Yh is equal to or larger than 2Xh and equal to or smaller than 2.5Xh.

As appreciated, the dimension Yh of the contact hole in the column direction cannot be infinitely extended (when Yh is infinite, a perfect line and space pattern is provided). In reality (in consideration also of the self-aligned contact), it is contemplated that the maximum value for Yh is approximately three times the minimum processing dimension of the line and space pattern (for example, equal to the width of a word line).

Assuming herein that Xh is set to the minimum processing dimension of the line and space pattern (for example, the width of the element areas and the width of the element isolation areas are also set to this minimum processing dimension), the maximum value for Yh is three times as much as Xh.

In summarizing the foregoing description, a realistic range for Yh is equal to or larger than 1.5Xh and equal to or smaller than 3Xh, and the effect of reducing the area can be maximally demonstrated without increasing the contact resistance when Yh is equal to or larger than 2Xh and equal to or smaller than 2.5Xh.

However, Yh exceeding 3Xh does not matter at all, if possible in view of the chip layout, ignoring the chip size in the column direction.

[Others]

The present invention can be applied, with significant effects, particularly to a non-volatile semiconductor device having a pitch (period) of bit lines or a repeating pitch (period) of element areas and element isolation areas equal to or smaller than 0.5 μm as well as to the NOR cell type and NAND cell type non-volatile semiconductor memory devices as described above.

The present invention can also be applied generally to non-volatile semiconductor memory devices in which contact holes (bit line contact holes or source line contact holes) are arranged in a line at the same pitch as a pitch of bit lines (or a repeating pitch of element areas and element isolation areas).

The present invention can also be applied not only to the non-volatile semiconductor memory devices, as illustrated in the aforementioned embodiments, in which the dimension Xh of the contact hole in the row direction is equal to the dimension Xe of the element area in the row direction and the spacing Xb between the adjacent contact holes is equal to the dimension Xi of the element isolation area in the row direction, but also to the non-volatile semiconductor memory device, as illustrated in FIGS. 133 and 134, in which the dimension Xh of the contact hole in the row direction is larger than the dimension Xe of the element area in the row direction and the spacing Xb between the adjacent contact holes is smaller than the dimension Xi of the element isolation area in the row direction.

The present invention can further be applied to a non-volatile semiconductor memory device in which the dimension Xh of the contact hole in the row direction is smaller than the dimension Xe of the element area in the row direction and the spacing Xb between the adjacent contact holes is larger than the dimension Xi of the element isolation area in the row direction.

The present invention may be modified in various manners without departing from the spirit and scope of the invention.

[Effects]

As described above, according to the present invention, in a non-volatile semiconductor memory device which must be provided with contact holes arranged at a regular pitch (period), in one direction and in a line, the contact holes are formed in the shape of rectangle or rectangle with rounded corners, and the width of the contact holes in one direction (row direction) is made narrower than the width in the direction (column direction) orthogonal to the one direction.

In this structure, the width (minor side) of the contact holes in the one direction can be made narrower than the minimum processing dimension for a square contact hole, and can be reduced to the minimum processing dimension for a line and space pattern at maximum. In this way, it is possible to reduce the pitch of the contact holes in the one direction, while maintaining the accuracy of dimension control and processing control for the contact holes, to contribute a reduction in the element areas and eventually a reduction in the chip area.

Also, as to the width of the contact holes in the direction orthogonal to the one direction, the employment of the self-aligned contact technology in particular enables a reduction in the element areas in the direction orthogonal to the one direction and a reduction in the chip area while maintaining the accuracy of dimension control and processing control for the contact holes, even if the width of the contact holes in the direction orthogonal to the one direction is increased.

Further, an increase in the contact resistance associated with the effect of reducing the area can be accommodated by a countermeasure which involves choosing the width of the contact holes in the direction orthogonal to the one direction to be 1.5 times or more the width of the contact holes in the one direction to increase the contact area and hence reduce the contact resistance while maintaining the effect of reducing the area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a contact plug arranged in a contact hole and having an upper portion protruding from said contact hole; and
   a wiring in contact with said contact plug, said wiring being made of a material different from a material of which said contact plug is made,
   wherein said contact plug extends through said wiring, and said contact plug has an upper surface substantially coplanar with an upper surface of said wiring.

2. A semiconductor device according to claim 1, wherein said wiring is arranged in a wiring groove on said contact hole.

3. A semiconductor device according to claim 1, wherein said contact plug is made of a polysilicon film doped with impurities.

4. A semiconductor device according to claim 1, wherein said contact plug is in contact with said wiring only on side surfaces thereof.

5. A semiconductor device according to claim 1, wherein said wiring is made of a metal film.

6. A semiconductor device according to claim 1, wherein said wiring is a bit line.

7. A semiconductor device according to claim 1, wherein said wiring is a draw-out line, said draw-out line being electrically connected to a bit line arranged on said draw-out line.

8. A semiconductor device according to claim 1, wherein the upper surface of said contact plug is in contact with a no wiring.

9. A semiconductor device according to claim 1, wherein the upper surface of said contact plug is in contact with an insulating film.

10. A semiconductor device comprising:
    an element isolation area;
    an element area surrounded by said element isolation area; and
    a metal film arranged on said element area, said metal film having end portions arranged in a contact hole overlapping said element isolation area and in a wiring groove on said contact hole.

11. A semiconductor device according to claim 10, wherein said element area comprises a MOS transistor forming part of a memory cell, and said contact hole is positioned on a diffusion layer of said MOS transistor.

12. A semiconductor device according to claim 10, wherein said metal film in said wiring groove serves as a bit line.

13. A semiconductor device according to claim 10, wherein said metal film in said wiring groove serves as a draw-out line, said draw-out line being electrically connected to a bit line arranged on said draw-out line.

14. A semiconductor device comprising;
a bit line contact plug for connecting a diffusion layer of a memory cell to a bit line;
a word line contact plug connected to a word line;
a gate contact plug connected to a gate electrode of a MOS transistor in a peripheral circuit section;
a diffusion layer contact plug connected to a diffusion layer of said MOS transistor; and
a well contact plug connected to a well region,
wherein said bit line contact plug is made of the same material as at least one of said word line contact plug, said gate contact plug, said diffusion layer contact plug and said well contact plug.

15. A semiconductor device according to claim 14, further comprising:
element areas and an element isolation area provided between the element areas,
wherein said bit line contact plug is connected to said element area, and said bit line contact plug has an end portion overlapping said element isolation area.

16. A semiconductor device according to claim 14, further comprising:
element areas and an element isolation area provided between the element areas,
wherein said bit line contact plug is connected to said element area, said bit line contact plug has an end portion overlapping said element isolation area, and said semiconductor device further comprises a wiring connected to a said bit line contact plug.

17. A semiconductor device according to claim 16, wherein said bit line contact plug is made of a polycrystalline or amorphous silicon doped with impurities, and said wiring is made of a metal.

18. A semiconductor device according to claim 16, wherein said, bit line contact plug and said wiring are both made of a metal.

19. A semiconductor device comprising;
a bit line contact plug for connecting a NAND cell unit to a bit line;
a source line contact plug for connecting said NAND cell unit to a source line;
a word line contact plug connected to a word line;
a first gate contact plug connected to a gate electrode of a MOS transistor in a peripheral circuit section;
a second gate contact plug connected to a gate electrode of a select transistor in said NAND cell unit;
a diffusion layer contact plug connected to a diffusion layer of said MOS transistor; and
a well contact plug connected to a well region,
wherein said bit line contact plug, said source line contact plug, said word line contact plug, said first gate contact plug, said second gate contact plug, said diffusion layer contact plug and said well contact plug are formed of the same material.

20. A semiconductor device according to claim 19,further comprising:
element areas and an element isolation area provided between the element areas,
wherein said bit line contact plug is connected to said element area, and said bit line contact plug has an end portion overlapping said element isolation area.

21. A semiconductor device according to claim 19, further comprising:
element areas and an element isolation area provided between the element areas,
wherein said bit line contact plug is connected to said element area, said bit line contact plug has an end portion overlapping said element isolation area, and said semiconductor device further comprises a wiring connected to a said bit line contact plug.

22. A semiconductor device according to claim 21, wherein said bit line contact plug is made of a polycrystalline or amorphous silicon doped with impurities, and said wiring is made of a metal.

23. A semiconductor device according to claim 21, wherein said bit line contact plug and said wiring are both made of a metal.

24. A semiconductor device comprising:
element isolation areas;
first and second element areas sandwiched by said element isolation areas;
a first contact plug connected to said first element area, said first contact plug having an end portion overlapping said element isolation areas; and
a second contact plug connected to said second element area, said second contact plug having an end portion not overlapping said element isolation areas,
wherein said first and second contact plugs are formed of the same material.

25. A semiconductor device according to claim 24, wherein said element isolation areas have surfaces present at positions higher than surfaces of said first and second element areas.

26. A non-volatile semiconductor memory device comprising:
element areas and element isolation areas repeatedly arranged in a first direction at a regular period;
memory cells arranged in said element areas;
contact holes arranged in said first direction at the same period as said regular period; and
a wiring arranged in said contact holes for communicating data with said memory cells,
wherein said contact holes have a width in a second direction orthogonal to said first direction larger than a width of said contact hole in said first direction.

27. A non-volatile semiconductor memory device according to claim 26, wherein the width of said contact holes in said second direction is 1.5 times or more as large as the width of said contact holes in said first direction.

28. A non-volatile semiconductor memory device according to claim 27, wherein the width of said contact holes in said second direction is three times or less as large as the width of said contact holes in said first direction, and the width of said contact holes in said first direction is substantially equal to the width of said element areas in said first direction.

29. A non-volatile semiconductor memory device according to claim 26, wherein the width of said contact holes in said second direction is twice or more and 2.5 times or less as large as the width of said contact holes in said first direction.

30. A non-volatile semiconductor memory device according to claim 26, wherein said wiring is a bit line, said bit line being connected to one end of a current path of each said memory cell.

31. A non-volatile semiconductor memory device according to claim 30, wherein said current path of each said memory cell has the other end connected to a source line; and a control gate line of each said memory cell extending in said first direction is arranged between said contact hole and said source line.

32. A non-volatile semiconductor memory device according to claim 26, wherein said wiring is a bit line, said bit line being connected to one end of a current path of each said memory cell through at least one transistor.

33. A non-volatile semiconductor memory device according to claim 32, wherein said current path of each said memory cell has the other end connected to a source line through at least one transistor; and
at least one control gate line extending in said first direction is arranged between said contact hole and said source line.

34. A non-volatile semiconductor memory device according to claim 26, wherein each said memory cell includes a gate insulating film arranged on said element area associated therewith, and a charge transfer layer arranged on said gate insulating film.

35. A non-volatile semiconductor memory device according to claim 26, wherein said wiring is a source line, said source line being connected to one end of a current path of each said memory cell.

36. A non-volatile semiconductor memory device according to claim 26, wherein said wiring is a source line, said source line being connected to one end of a current path of each said memory cell through at least one transistor.

37. A non-volatile semiconductor memory device according to claim 26, wherein each said contact hole has a width in said second direction equal to a width of said contact hole in said second direction in a top portion thereof;
Y1>Y2 is satisfied where Y1 represents the width of said contact hole in said second direction in the top portion, and Y2 represents a width of said contact hole in said second direction in a bottom portion thereof; and
the width of said contact hole in said second direction in the top portion and the width of said contact hole in said second direction in a bottom portion thereof vary discontinuously.

38. A non-volatile semiconductor memory device according to claim 26, wherein said element areas and said element isolation areas extend in said second direction, and said element areas and said element isolation areas have a width in said first direction substantially equal to the width of said contact holes in said first direction.

39. A non-volatile semiconductor memory device according to claim 38, wherein the width of said element areas and said element isolation areas in said first direction is substantially equal to a width of a control gate line of said memory cells.

40. A non-volatile semiconductor memory device comprising:
element areas and element isolation areas repeatedly arranged in a first direction at a regular period;
memory cells arranged in said element areas;
first contact holes arranged in said first direction substantially at the same period as said regular period;
a bit line arranged in said first contact holes, said bit line connected to one end of a current path of each said memory cell through at least one transistor;
second contact holes arranged in said first direction substantially at the same period as said regular period; and
a source line arranged in said second contact holes, said source line connected to the other end of the current path of each said memory cell through at least one transistor,
wherein both said first and second contact holes have a width in a second direction orthogonal to said first direction larger than a width in said first direction.

41. A non-volatile semiconductor memory device according to claim 40, wherein said first contact hole has a size substantially equal to a size of said second contact hole.

42. A nonvolatile semiconductor memory device comprising:
element areas and element isolation areas, which are arranged at regular intervals in a first direction;
memory cells arranged in the element areas, respectively;
contact plugs arranged at the same intervals as the regular intervals in the first direction, and connected to the element areas, respectively; and
wirings connected to the contact plugs, and formed of material different from material of the contact plugs,
wherein upper surfaces of the contact plugs are located at a higher level than lower surfaces of the wirings.

43. A nonvolatile semiconductor memory device according to claim 42, wherein the upper surface of the contact plugs are located at substantially the same level as upper surfaces of the wirings.

44. A nonvolatile semiconductor memory device according to claim 42, wherein the contact plugs are made of a polycrystalline or amorphous silicon doped with impurities.

45. A nonvolatile semiconductor memory device according to claim 42, wherein the wirings are bit lines, and the contact plugs are bit line contact plugs.

46. A nonvolatile semiconductor memory device according to claim 42, wherein the wirings are leads, and the contact plugs are connected to the bit lines by the leads, respectively.

47. A nonvolatile semiconductor memory device according to claim 42, further comprising:
selection-transistors arranged in the element areas, respectively, and wherein the contact plugs are bit line contacts connected to one end of current paths of the memory cells through the selection-transistors.

48. A nonvolatile semiconductor memory device according to claim 43, wherein only side surfaces of the contact plugs contact the wirings, respectively.

49. A nonvolatile semiconductor memory device according to claim 43, further comprising:
an insulating film formed on the wirings, the contact plugs having upper surfaces contacting the insulating film.

50. A nonvolatile semiconductor memory device comprising:
element isolation areas;
an element area provided between the element isolation areas; and
a contact plug connected to the element area,
wherein an end portion of the contact plug overlaps the element isolation areas, and
the contact plug is made of metal material.

51. A nonvolatile semiconductor memory device according to claim 50, further comprising:
a wiring layer made of the same material as the contact plug and connected to the contact plug.

52. A nonvolatile semiconductor memory device comprising:
element areas and element isolation areas, which are arranged at regular intervals in a first direction;

memory cells and selection-transistors, which are arranged in the element areas, respectively; and contact plugs arranged in the first direction at intervals which are substantially equal to the regular intervals, and contacting the element areas, respectively, wherein:
the contact plugs are bit line contacts connected to one end of current paths of the memory cells through the selection-transistors;
portions of the contact plugs overlap the element isolation areas; respectively, and
the contact plugs are made of metal material.

53. A nonvolatile semiconductor memory device according to claim 52, further comprising:

wiring layers made of the same material as the contact plugs and connected to the contact plugs, respectively.

54. A nonvolatile semiconductor memory device according to claim 53, wherein the wiring layers are bit lines.

55. A nonvolatile semiconductor memory device according to claim 53, wherein the wiring layerss are leads, and the contact plugs are connected to the bit lines by the leads, respectively.

* * * * *